United States Patent [19]

Sugaya et al.

[11] Patent Number: 5,754,299
[45] Date of Patent: May 19, 1998

[54] INSPECTION APPARATUS AND METHOD FOR OPTICAL SYSTEM, EXPOSURE APPARATUS PROVIDED WITH THE INSPECTION APPARATUS, AND ALIGNMENT APPARATUS AND OPTICAL SYSTEM THEREOF APPLICABLE TO THE EXPOSURE APPARATUS

[75] Inventors: Ayako Sugaya, Kawasaki; Masahiro Nakagawa, Yokohama; Tadashi Nagayama, Tokyo, all of Japan

[73] Assignee: Nikon Corporation, Japan

[21] Appl. No.: 584,863

[22] Filed: Jan. 11, 1996

[30] Foreign Application Priority Data

| Jan. 13, 1995 | [JP] | Japan | 7-003856 |
| Aug. 8, 1995 | [JP] | Japan | 7-222677 |
| Oct. 27, 1995 | [JP] | Japan | 7-303932 |

[51] Int. Cl.$^6$ ............................................. G01B 11/00
[52] U.S. Cl. ................................... 356/401; 356/399
[58] Field of Search ........................... 356/399–401; 250/548, 557, 234, 235, 236; 355/43, 53, 77

[56] References Cited

U.S. PATENT DOCUMENTS

| 4,655,598 | 4/1987 | Murakami | 356/400 |
| 4,888,614 | 12/1989 | Suzuki et al. | |
| 5,323,207 | 6/1994 | Ina | 355/53 |
| 5,448,332 | 9/1995 | Sakakibara | 355/53 |
| 5,461,237 | 10/1995 | Wakamoto | 250/548 |
| 5,473,424 | 12/1995 | Okumura | 356/139.03 |

FOREIGN PATENT DOCUMENTS

| 4-65603 | 3/1992 | Japan. |
| 4-273246 | 9/1992 | Japan. |
| 5-118957 | 5/1993 | Japan. |
| 6-69097 | 3/1994 | Japan. |

*Primary Examiner*—Frank Gonzalez
*Assistant Examiner*—Michael P. Stafira
*Attorney, Agent, or Firm*—Pennie & Edmonds

[57] ABSTRACT

The present invention relates to inspection apparatus and method in which, based on images under a plurality of focus conditions formed by way of an optical system to be inspected, namely, using images under a plurality of defocal conditions, tendency in positional change or change of asymmetry between the images is calculated so as to specify at least one of aberration condition and optical adjustment condition of the optical system to be inspected as well as to exposure apparatuses and overlay accuracy measurement apparatuses provided with the inspection apparatus. In addition, the present invention relates to an image-forming optical system suitable to an alignment apparatus which is applicable to the exposure apparatuses. This image-forming optical system comprises a correction optical system for intentionally generating asymmetric aberration or symmetric aberration in the image-forming optical system and a decentering mechanism for decentering the correction optical system to cancel asymmetric aberration or symmetric aberration in the image-forming optical system.

56 Claims, 29 Drawing Sheets

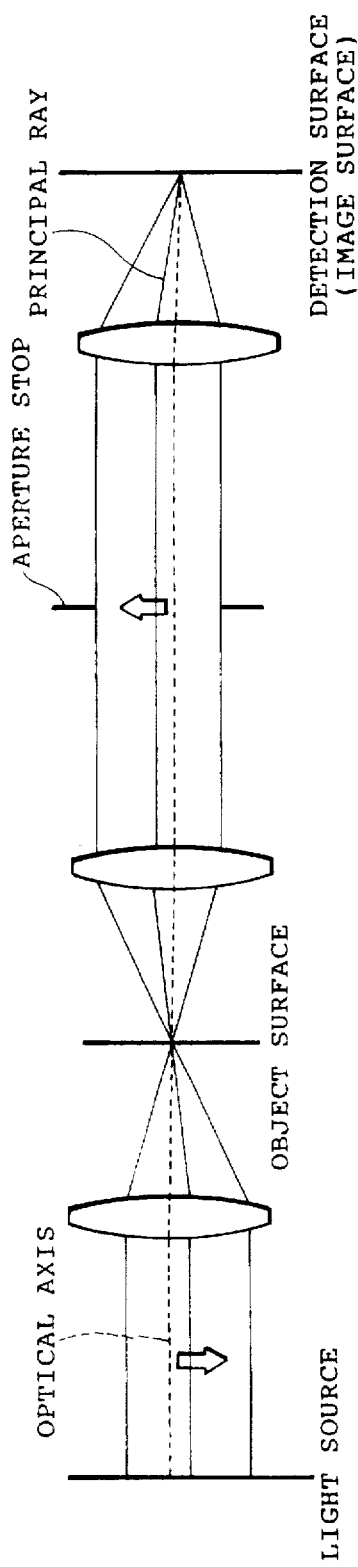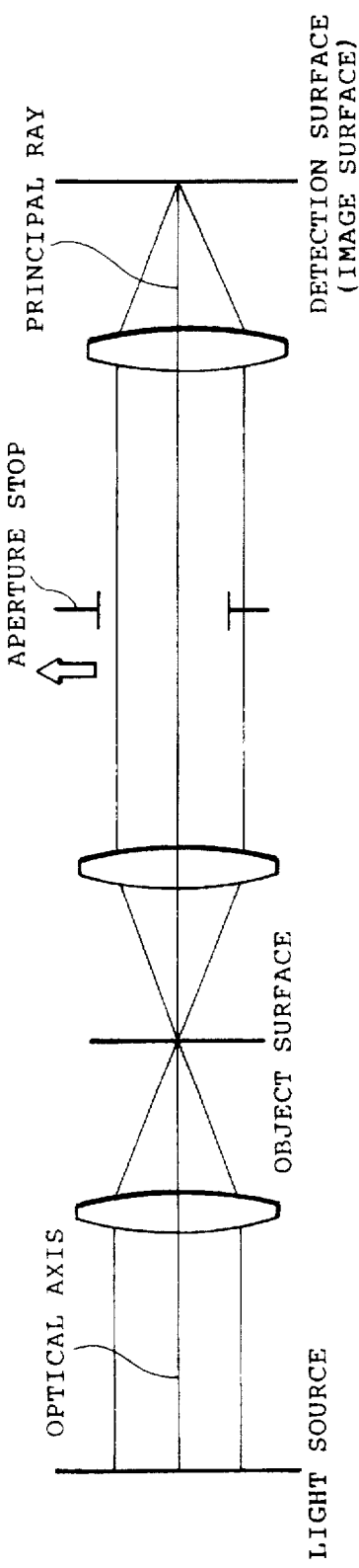

1

INSPECTION APPARATUS AND METHOD FOR OPTICAL SYSTEM, EXPOSURE APPARATUS PROVIDED WITH THE INSPECTION APPARATUS, AND ALIGNMENT APPARATUS AND OPTICAL SYSTEM THEREOF APPLICABLE TO THE EXPOSURE APPARATUS

BACKGROUND OF THE INVENTION

1. Field of the Invention The present invention relates to inspection apparatus and method for optical systems as well as a projection exposure apparatus provided with the inspecting apparatus, and the like. In particular, it relates to inspection and adjustment of aberration conditions and optical adjustment conditions of projection optical systems applicable to projection exposure apparatuses used in lithography process for making semiconductor devices and liquid crystal display devices, for example, as well as optical systems (i.e., optical systems to be inspected) such as those of alignment apparatuses and overlay accuracy measurement apparatuses. Also, it relates to image-forming optical systems (including the above-mentioned optical systems to be inspected) which are suitable to alignment apparatuses by which a photosensitive substrate is positioned on the basis of an alignment mark (wafer mark) on the photosensitive substrate and the like in the projection exposure apparatuses, such as an optical system having a function to correct asymmetric aberration of the whole system, and alignment apparatuses provided therewith.

2. Related Background Art

Conventionally, in the projection exposure apparatus used in the lithography process for making semiconductor devices, liquid crystal display devices, and the like, a pattern formed in a mask is transferred to a wafer, which is a photosensitive substrate (e.g., silicon wafer or glass plate coated with a photosensitive material such as photoresist), by way of a projection optical system. Namely, with respect to a pattern which has already been transferred to the wafer, a projected image of the mask pattern formed by way of the projection optical system is positioned by an alignment apparatus (or alignment optical system disposed inside the projection exposure apparatus) so as to effect superposed exposure. Further, an overlay accuracy measurement apparatus disposed inside or outside the projection exposure apparatus judges whether the above-mentioned positioning is correctly effected or not.

When the optical adjustment of the projection optical system is insufficient or an aberration remains in the projection optical system, the projected image of the mask pattern cannot correctly formed on the surface of the photosensitive substrate, thereby forming a warped transfer pattern on the wafer. Also, when the optical adjustment of the alignment apparatus is insufficient or an aberration remains in the alignment apparatus, the mask and the wafer cannot be correctly positioned with respect to each other, thereby making it impossible to perform superposed exposure with a high accuracy. Further, in the overlay accuracy measurement apparatus, when the optical adjustment is insufficient or there remains an aberration, overlay accuracy measurement cannot be performed with a high accuracy.

Accordingly, there has been conventionally used a method for inspecting aberration of a projection optical system comprising the steps of transferring a plurality of light-shielding patterns formed at a light-permeable portion of a mask to a wafer by way of the projection optical system and then observing the amount of asymmetry of the resist image formed on the wafer through an electron microscope.

Also, Japanese Unexamined Patent Publication Hei No. 5-118957 discloses a method of inspecting asymmetrical aberration of a projection optical system (i.e., optical system to be inspected) comprising the step of detecting a spatial image of the mask light-shielding pattern formed by way of the projection optical system.

Further, with respect to the optical adjustment and the like of the optical system to be inspected, Japanese Unexamined Patent Publication Hei Nos. 6-69097 and 6-132197, for example, disclose a method in which deviation or inclination of an optical axis is corrected.

In addition, as the above-mentioned alignment apparatus, Japanese Unexamined Patent Publication Hei Nos. 4-65603 and 4-273246, for example, disclose an alignment apparatus which is of both off-axis type and image-pickup type. In this conventional alignment apparatus, light having a wide wavelength band emitted from a light source such as a halogen lamp illuminates an alignment mark (i.e., wafer mark). Then, an enlarged image of the wafer mark is formed on a image detection surface of an image pickup device. Thus obtained image pickup signal (i.e., electric signal) is subjected to an image processing so as to detect the position of the wafer mark on the wafer. The detection system of the image-pickup type alignment apparatus is also known as FIA (Field Image Alignment) system.

In the image-pickup type alignment apparatus, due to the wide band illumination, the influence of the thin-film interference on the photoresist layer on the wafer is decreased. Also, when the wafer mark to be inspected is an asymmetrical mark, a specific edge may be selected within the obtained enlarged image of the wafer mark, for example, so as to reduce the influence of the asymmetry.

Further, as the conventional alignment apparatus, there is an alignment apparatus which is of both TTL (Through The Lens) type and image-pickup type. In the TTL type alignment apparatus, the wavelength of exposure light and that of alignment detection light differ from each other, thereby generating an aberration with respect to the alignment detection light in the projection optical system used for exposure. Accordingly, in the TTL type alignment apparatus disclosed in Japanese Patent Publication Hei No. 2-35446, for example, asymmetric aberration generated in the projection optical system with respect to the alignment detection light is corrected by a sheet of a plane parallel plate disposed obliquely with respect to an optical axis, while an astigmatism generated by this plane parallel plate is corrected by additional two sheets of plane parallel plates.

SUMMARY OF THE INVENTION

The inventors have studied the foregoing prior art and found the following problems.

In the method in which a resist image is observed through an electron microscope, the resist image has to be actually formed on the wafer. Accordingly, prior to inspection, a complicated process takes a long time. Also, while a scanning type electron microscope (SEM) is usually used for inspecting the resist image, the resolution of SEM may vary depending on personal equation of operators and condition of the apparatus, thereby yielding a low reproducibility in inspection.

Also, in the method using the spatial image disclosed in Japanese Unexamined Patent Publication Hei No. 5-118957, sufficient effects cannot be obtained unless illumination a (ratio of illumination numerical aperture to image-forming numerical aperture) is made low. However, when the illumination σ changes, the contribution of a luminous flux to wave aberration of the optical system changes. Accordingly, the aberration determined on the basis of the spatial image obtained under the condition where the illumination σ is narrowed down may differ from the aberration under the practical condition.

Further, in the optical adjustment methods disclosed in Japanese Unexamined Patent Publication Hei Nos. 6-69097 and 6-132197, for example, only one of the condition where the optical axis and the principal ray are deviated from each other (referred to as "telecentricity" in the following) and the condition where a luminous flux is eclipsed (referred to as "eclipse" in the following) is adjusted. Accordingly, both of the telecentricity and the eclipse cannot be adjusted at the same time.

The object of the present invention is to provide inspection apparatus and method by which the aberration condition and optical adjustment condition of the optical system to be inspected can be inspected with a favorable reproducibility under a practical condition or a condition similar thereto.

Another object of the present invention is to provide a projection exposure apparatus, an alignment apparatus, and an overlay accuracy measurement apparatus which are provided with means for effecting correction of aberration or optical adjustment based on the aberration condition and optical adjustment condition of the optical system inspected by the above-mentioned inspection apparatus and method.

Still another object of the present invention is to provide an optical system which is suitably used in the above-mentioned alignment apparatus.

The first embodiment of the inspection apparatus in accordance with the present invention comprises, as shown in FIG. 13, a defocus mechanism for defocusing an image 15A of a pattern 15 on a first surface (i.e., surface of a reticle 13), which is to be formed on a second surface (i.e., surface PTa of a reference member PT), from a best focus condition by a predetermined defocus amount; a detector 19 for detecting the image 15A which is formed on the second surface PTa by the defocus mechanism under a predetermined focus condition; and an inspection unit 151 for calculating, based on the information concerning respective positions of a plurality of images which are formed on the second surface PTa under focus conditions different from each other and which are detected by the detector 19, a change in image position on the second surface within a predetermined defocus range. In particular, the inspection unit 151 comprises a signal processor 152 for capturing, from the detector 19, the information (i.e., electric signals) concerning the respective positions of the image 15A on the second surface PTa under at least three kinds of focus conditions different from each other and a calculator 153 for calculating, with reference to information in a table 154 prepared beforehand, a measurement line which indicates a relationship between the amount of defocus and the corresponding image position. Also, the above-mentioned defocus mechanism includes a control system for moving at least one of the pattern on the first surface (i.e., surface of the reticle 13), optical system to be inspected (e.g., projection optical system 16), and detector 19 along the optical axis of the optical system to be inspected. Accordingly, in the configuration shown in FIG. 13, this control system includes a controller 150 within a main control system 100 and at least one of a wafer stage control system 200, a projection optical system adjustment mechanism 300, and a reticle stage control system 400. Here, a configuration in which this defocus mechanism adjusts an illumination optical system, as shown in FIG. 19, is also preferable.

Also, the sensitivity in inspection of this inspection apparatus can be controlled when a sensitivity control mechanism which can change at least one of the illumination condition for the pattern, the form of the pattern, and the range of defocus. For example, in the configuration shown in FIG. 13, in order to adjust the illumination condition for the pattern, the sensitivity control mechanism includes a variable aperture stop 11 and an adjustor 20 therefor. Also, the above-mentioned defocus mechanism functions as the sensitivity control mechanism.

On the other hand, the light source for forming the image on the inspection surface as mentioned above may be a lamp light source or a laser source. A laser source is applicable to the second embodiment of the inspection apparatus in accordance with the present invention. Accordingly, in this embodiment, as shown in FIG. 18, with respect to a predetermined detection surface 25A, the defocus mechanism defocuses a point of convergence of a luminous flux, which is emitted from such a light source 22, formed by way of the optical system to be inspected, thereby enabling a detector 25 to detect the positions of the converged luminous flux under a plurality of focus conditions.

Further, in the third embodiment of the inspection apparatus in accordance with the present invention, a phase pattern is utilized for inspecting the aberration condition and optical adjustment condition of the optical system to be inspected. As shown in FIG. 19, the inspection apparatus in the third embodiment comprises a detector 19 for detecting an image of a phase pattern (i.e., wafer mark WM) on a predetermined surface (i.e., surface of a photosensitive substrate W); a defocus mechanism for defocusing the image to be formed on a detection surface of the detector 19 from a best focus condition by a predetermined defocus amount; and an inspection unit 151 for calculating, based on information concerning asymmetry of each of a plurality of images formed on the detection surface under a plurality of focus conditions different from each other, a change in asymmetry of the image on the detection surface within a predetermined defocus range. Here, the configuration of the defocus mechanism is similar to that of the first embodiment.

In particular, the inspection unit 151 in the third embodiment comprises a signal processor 152 for detecting, for each of measurement points arranged in a predetermined measurement direction S on the detection surface, a signal ΣV which is an integrated signal of individual signals V corresponding to the light intensity of the image of the phase pattern WM which are measured at respective measurement points arranged in a direction Sa, which is perpendicular to the measurement direction S, and a calculator 153 for calculating, based on a relationship between the measurement direction S and the integrated signal, asymmetry index β of the image formed on the detection surface according to the following expression (cf. FIG. 8):

$$\beta = (1/n) \sum_{i=1}^{n} \{(V_{iL} - V_{iR})/(V_{max} - V_{min})\}$$

wherein:
- n: number of periodicity of the integrated signal with respect to the measurement direction S;
- $V_{iL}$: first obtained minimum signal value with respect to the measurement direction S, which is a minimum signal at the i-th period B·P of the integrated signal;

$V_{iR}$: last obtained minimum signal value with respect to the measurement direction S, which is a minimum signal at the i-th period B·P of the integrated signal;

$V_{max}$: maximum value of the integrated signal, with respect to the measurement direction S, in the whole measurement area excluding the both end portions of the image of the phase pattern WM; and $V_{min}$: minimum value of the integrated signal, with respect to the measurement direction S, in the whole measurement area excluding the both end portions of the image of the phase pattern WM.

Further, the calculator 153 calculates a measurement line which indicates relationship between the amount of defocus and the asymmetry index of the corresponding image and, with reference to a table 154 prepared beforehand, the aberration condition and optical adjustment condition of the optical system to be inspected.

In addition, the first to third embodiments of the inspection apparatus in accordance with the present invention are applicable to an exposure apparatus, an alignment apparatus, and a superposing apparatus as well as an exposure apparatus provided with these alignment and overlay accuracy measurement apparatuses. As such an exposure apparatus, a one-shot exposure type exposure apparatus and a scanning type exposure apparatus have been known. The inspection apparatus in accordance with the present invention can be applied to any of these types of exposure apparatuses. Accordingly, this inspection apparatus can inspect the aberration conditions and optical adjustment conditions of the projection optical system, alignment optical system, and the like in each of these apparatuses.

Then, the inventors have studied the alignment apparatus to which the above-mentioned inspection apparatus is applicable and found the following problems.

In the image-forming optical system in the alignment apparatus of the conventional image pickup type, there remains a little aberration in manufacturing steps such as processing, assembling, and adjustment. When an aberration remains within the optical system, contrast of the wafer mark image on the image pickup surface may decrease or the wafer mark image may be warped, thereby generating an error in detection of the mark position. Recently, as the line width of circuit patterns becomes finer, alignment with a higher accuracy has become necessary. Accordingly, it has become difficult for the decrease in alignment accuracy caused by the little remaining aberration to be neglected.

In particular, among the aberrations remaining within the optical system, asymmetric aberration greatly influences the detection of the wafer mark image. Namely, when asymmetric aberration is generated within the optical system, the wafer mark image projected on the image-pickup surface is measured as being positionally deviated from the ideally formed image. Also, when there exists asymmetric aberration in the wafer mark image in cases where the form of the wafer mark, for example, its pitch, duty cycle, or difference in level, is changed or where the wafer is projected on the image-pickup surface under a defocused condition, the degree of the asymmetry of the wafer mark image may vary and the amount of deviation of the measurement position for the wafer mark may vary.

In the specification, the symmetric aberration means as an aberration that is symmetrically generated with respect to a principle ray or an optical axis of an optical system, and the asymmetric aberration means as an aberration that is asymmetrically generated with respect to a principle ray or an optical axis of an optical system. For example, at least spherical aberration is included in the above symmetric aberration, and at least coma is included in the above asymmetric aberration.

The wafer mark has different forms in respective steps for making a semiconductor. Accordingly, when the alignment (or positioning) of the wafer is effected by way of an optical system in which asymmetric aberration remains, accuracy in alignment may decrease due to process offset or deterioration of the reproducibility in superposing accuracy. Also, though the amount of asymmetric aberration tolerable in the optical system may somewhat vary depending on the optical characteristics (e.g., numeric aperture on the object side and magnification) of the image-forming optical system and the type of image processing, it is necessary for the amount of the remaining asymmetric aberration to be nearly nullified in order to realize highly accurate alignment.

In this regard, in the conventional alignment apparatus, the accuracy in manufacture of the optical system is made as high as possible so as to prevent various aberrations such as asymmetric aberration from generating. However, when the accuracy in manufacture of the optical system is improved alone, it is difficult for asymmetric aberration to be sufficiently eliminated so as to fulfill the demand for the above-mentioned accuracy in alignment. When the accuracy in manufacture of the optical system is to be increased so as to fulfill such a demand, the manufacturing cost may increase.

Also, as mentioned above, in the TTL type alignment apparatus disclosed in Japanese Patent Publication Hei No. 2-35446, a plane parallel plate is obliquely disposed in order to reduce asymmetric aberration. However, due to thus obliquely disposed plane parallel plate, aberrations such as astigmatism and dispersion may occur. Accordingly, in order to correct the aberration generated by the plane parallel plate, additional optical members may be necessary. Namely, when a plane parallel plate is asymmetrically (obliquely) disposed with respect to an optical axis to correct asymmetric aberration, various aberrations such as image-surface inclination, astigmatism, and dispersion may occur. As a result, the image quality of the mark image may deteriorate, thereby rather decreasing the accuracy in detection of the mark position. Also, since additional members for correcting these aberrations may be necessary, the optical system may have a larger size with a higher manufacturing cost.

With a simple configuration, the image-forming optical system in accordance with the present invention easily corrects asymmetric aberration in the whole system without influencing other aberrations. Also, the alignment apparatus to which this image-forming optical system is applied detects the position of the alignment mark with a high accuracy.

Specifically, the first embodiment of the image-forming optical system for the alignment optical system or the like in accordance with the present invention comprises, for example as shown in FIG. 24, an objective optical system 502 for converging light from a first surface (e.g., a photo-sensitive substrate W in which an alignment wafer mark WM is formed on a surface thereof); a condenser optical system 500B (504) which converges the light passing through the objective optical system 500A (502) so as to form, on a second surface (i.e., a detection surface 505a of an image pickup device 505), an image of the first surface and in which a predetermined amount of asymmetric aberration is generated; a correction optical system 550 which is disposed between the objective optical system 500A and the second surface and is movable in a vertical direction with respect to an optical axis of the condenser optical system 500B, the correction optical system 550 generating asymmetric aberration which offsets that generated by the condenser optical system 500B; and a decentering mechanism for making the correction optical system 550 a decentration condition with respect to the optical axis of the condenser optical system 500B. According to this configuration, in the first embodiment of the image-forming optical system, the correction optical system 550 decentered by the decentering mechanism so as to reduce asymmetric aberration in the whole image-forming optical system in accordance with the present invention, generates an eccentric asymmetrical aberration which offsets the asymmetric aberration generated by the condenser optical system 500B. In particular, the above-mentioned correction optical system 550 is substantially a same-magnification erect afocal optical system, while the space between this afocal optical system and the condenser optical system 500B is telecentric. Also, the focal length of the condenser optical system 500B is set longer than that of the objective optical system 500A, so that the image-forming optical system, as a whole, has an enlarging magnification.

In the specification, the eccentric asymmetrical aberration means as asymmetric aberration caused in the optical system by decentering the correction optical system with respect to an optical axis of the condenser optical system. The eccentric asymmetrical aberration functions so as to cancel asymmetric aberration generated by the objective optical system, and thereby asymmetric aberration of the whole optical system is effectively reduced.

Further, as shown in FIG. 24, in the first configuration of the above-mentioned decentering mechanism, as instructed by a main control system 100A, a driving system 250 makes the whole correction optical system 550 (i.e., a holder 553 holding the whole correction optical system 550) eccentric with respect to the whole optical system according to the present invention. Also, as mentioned above, when aberration occurs due to error in manufacture of the optical system, there is preferably used a configuration (i.e., second configuration) in which the optical positions of the condenser optical system 500B and the correction optical system 550 with respect to each other are fixed as shown in FIG. 25. In this second configuration, since the optical positions of the condenser optical system 500B and the correction optical system 550 with respect to each other are fixed beforehand, the aberration of the whole optical system is reduced, while decreasing the possibility of the aberration being newly generated in the optical system when in use.

Also, as shown in FIG. 31, the second embodiment of the image-forming optical system in accordance with the present invention has a configuration in which, when a predetermined amount of symmetric aberration occurs in a condenser optical system 500B, a decentering mechanism makes a correction optical system 550 eccentric with respect to an optical axis of the condenser optical system 500B as mentioned above. The correction optical system 550 generates symmetric aberration which offsets that generated by the condenser optical system 500B. Accordingly, the correction optical system 550, which has been made eccentric by the decentering mechanism so as to reduce asymmetric aberration in the whole image-forming system, generates symmetric aberration which offsets that generated by the condenser optical system 500B.

Here, the ratio of the amount of eccentricity of the above-mentioned correction optical system 550 to asymmetric aberration is proportional to the amount of symmetric aberration which is offset by the correction optical system 550 and the condenser optical system 500B to each other (cf. FIG. 34). In other words, when the amount of symmetric aberration which is offset by the correction optical system 550 and the condenser optical system 500B to each other is set appropriately and the correction optical system 550, which is adapted to have an eccentricity, is made eccentric by an appropriate amount, a desired amount of asymmetric aberration can be generated. Therefore, the asymmetric aberration occurring in the whole optical system including the correction optical system 550 can be reduced also when the correction optical system 550 is made eccentric so as to generate symmetric aberration.

Here, it is preferable that the correction optical system 550 in this embodiment is substantially a same-magnification erect afocal system while the space between the condenser optical system 504 and the correction optical system 550 is non-telecentric. Also, the focal length of the condenser optical system 500B is set longer than that of an objective optical system 500A, so that the image-forming optical system, as a whole, has an enlarging magnification.

Further, the third embodiment of the optical system in accordance with the present invention is an embodiment in which the above-mentioned first and second embodiments of the optical system are specifically applied to an alignment optical system (e.g., illumination optical system and image-forming optical system) utilizing a laser source (cf. FIGS. 35 and 36).

The above-mentioned first and second embodiments of the optical system are mainly applied to an alignment apparatus. In this case, the objective optical system 500A (502) in this image-forming optical system converges light from the alignment wafer mark WM on the photosensitive substrate W, while the condenser optical system 500B (504) converges the light passing through the objective optical system 500A so as to form an image of the wafer mark WM on a predetermined detection surface 505a. Also, this alignment apparatus includes at least an image-pickup device 505 for detecting the image of the wafer mark WM formed on the detection surface 505a by way of the image-forming optical system and an image processing system 350 for calculating, based on a signal output from the image-pickup device 505, the position of the image on the detection surface 505a. The third embodiment is configured in a similar manner.

As shown in FIG. 44, the fourth embodiment of the image-forming optical system in accordance with the present invention comprises a first image-forming optical system 700A (702) for converging light from a first surface so as to form an image of the first surface on a second surface; a second image-forming optical system 700B (704, 705) which converges light from the image of the first surface formed on the second surface so as to form an image of the first surface on a third surface and in which a predetermined amount of asymmetric aberration is generated; a correction optical system 750 which is formed in an optical path of the second image-forming optical system 700B and is movable in a vertical direction with respect to an optical axis of the second image-forming optical system 700B, the correction optical system 750 generating asymmetric aberration which offsets that generated by the second image-forming optical system 700B; and a decentering mechanism for decentering the correction optical system 750 with respect to the optical axis of the second image-forming optical system 700B. According to this configuration, the correction optical system which has been made eccentric by the decentering mechanism so as to reduce asymmetric aberration in the whole image-forming optical system generates asymmetric aberration which offsets that generated in the first image-forming optical system 700B. The above-mentioned decentering mechanism may have a configuration (i.e., first configuration) in which eccentricity is automatically made as shown in FIG. 44 as well as a configuration (i.e., second configuration) in which eccentricity has been fixed before use as shown in FIG. 25.

Also, the above-mentioned first image-forming optical system 700A has an enlarging magnification. The correction optical system 750 is substantially a same-magnification erect afocal optical system. The correction optical system 750 is disposed within a substantially telecentric space in the optical path within the second image-forming optical system 700A.

Further, as shown in FIG. 47, the fifth embodiment of the image-forming optical system in accordance with the present invention has a configuration in which, as mentioned above, when a predetermined amount of symmetric aberration occurs in a second image-forming optical system 700B, a decentering mechanism makes a correction optical system 750 eccentric with respect to an optical axis of the second image-forming optical system 700B. The correction optical system 750 generates symmetric aberration which offsets that generated by the second image-forming optical system 700B. Accordingly, the correction optical system 750 which has been made eccentric by the decentering mechanism so as to reduce asymmetric aberration in the whole image-forming optical system generates symmetric aberration which offsets that generated in the first image-forming optical system 700B.

Here, it is preferable that the correction optical system 750 in this embodiment is substantially a same-magnification erect afocal optical system, while the space between the second image-forming optical system 700B and the correction optical system 750 is non-telecentric. Also, the first image-forming optical system 700A has an enlarging magnification.

The above-mentioned fourth and fifth embodiments of the image-forming optical system are mainly applied to an alignment apparatus. In this case, the first image-forming optical system 700A (702) in this image-forming optical system converges light from the alignment wafer mark WM on the photosensitive substrate W, while the second image-forming optical system 700B (704, 705) converges the light passing through the first image-forming optical system 700A so as to form an image of the wafer mark WM on a predetermined detection surface 706a. Also, this alignment apparatus includes at least an image-pickup device 706 for detecting the image of the wafer mark WM formed on the detection surface 706a by way of the image-forming optical system and an image processing system 350 for calculating, based on a signal output from the image-pickup device 706, the position of the image on the detection surface 706a.

Also, in the fourth and fifth embodiments of the image-forming optical system in accordance with the present invention, not only the lamp light source but a laser source can be utilized.

The sixth embodiment of the image-forming optical system in accordance with the present invention comprises a first condenser optical system for converging a laser luminous flux from a first surface and a second condenser optical system for re-converging, on a second surface, the laser luminous flux from the first condenser optical system. In this embodiment, the correction optical system for generating asymmetric aberration which offsets that generated in the second condenser optical system is substantially a same-magnification erect afocal system and disposed within a substantially telecentric space in an optical path within the second condenser optical system. The first condenser optical system within the image-forming optical system has a reducing magnification. Further, this embodiment is also applicable to an alignment apparatus utilizing a laser source (cf. FIG. 52).

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

BRIEF DESCRIPTION OF THE DRAWINGS

FIG. 1 is a view showing a first optical adjustment condition (telecentricity) of an optical system to be inspected, where a principal ray is deviated from an optical axis of the whole system;

FIG. 2 is a view showing a second optical adjustment condition (eclipse) of an optical system to be inspected, where an eclipse remains in the whole system;

DETAILED DESCRIPTION OF THE PREFERRED EMBODIMENTS

In the following, the embodiments of the present invention will be explained with reference to FIGS. 1 to 55. In the first place, the optical adjustment conditions of an optical system to be inspected by the inspection apparatus and method in accordance with the present invention will be explained with reference to FIGS. 1 and 2.

FIG. 1 shows a condition (i.e., telecentricity as a first optical adjustment condition) in which a principal ray is deviated from an optical axis of the optical system to be inspected. FIG. 2 shows a condition (i.e., eclipse as a second optical adjustment condition) in which an eclipse remains in the optical system to be inspected.

Depending on the adjustment condition of the optical system, when defocusing is effected at an object surface, an optical system, or a detector, positional deviation may occur at the detection surface of the detector.

FIG. 1 shows a typical example thereof. In this example, a light source and an aperture stop are symmetrically made eccentric with respect to the optical axis of the optical system. As a result, when the detection surface is defocused in the direction of the optical axis, positional deviation of the image occurs on the detection surface. Here, the quantitative magnitude (i.e., magnitude of deviation between the optical axis and the principal ray) of such an optical adjustment condition is defined as telecentric index.

Also, depending on the adjustment condition of the optical system, there is a case where the distribution of diffracted light components are asymmetrically eclipsed (i.e., shielded) with respect to an aperture stop (i.e., image-forming aperture stop) within an image-forming optical system. FIG. 2 shows a typical example thereof. In this case, only the image-forming aperture stop is made eccentric with respect to the optical axis of the optical system. As a result, the image on the detection surface usually collapses asymmetrically. Here, the optical adjustment condition where such a phenomenon occurs is referred to as a condition in which "eclipse" remains. Also, the quantitative magnitude of such an optical adjustment condition is defined as amount of eclipse.

In practice, the optical adjustment condition of the optical system is a mixed state of the conditions shown in FIGS. 1 and 2 (i.e., first and second optical adjustment conditions).

Next, the embodiments of the method of inspecting an optical system in accordance with the present invention will be explained.

Figure 3:
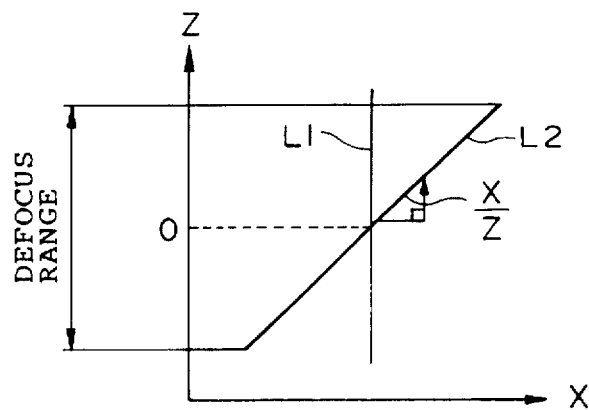
FIGS. 3 to 5 are charts showing, in the first and second embodiments of the method of inspecting an optical system in accordance with the present invention, for individual optical adjustment conditions of the optical system to be inspected and aberrations generated, relationships between the amount of defocus in the optical system and the positional change of the pattern image.
Figure 4:
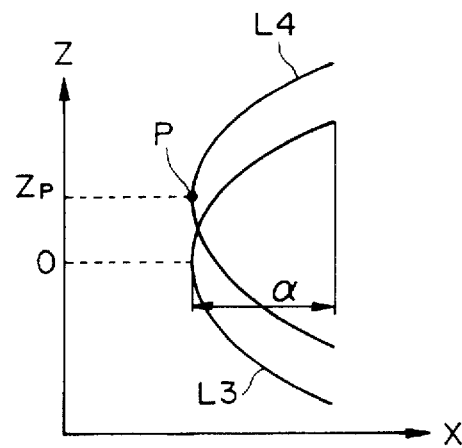

FIGS. 3 and 4 are charts showing, within a predetermined defocus range, for individual defocus condition, relationships between the positional change of a pattern image and various aberrations in the first embodiment.

In the first embodiment of the inspection method, for example, a position x of a spatial image of a pattern formed by way of an optical system to be inspected is measured under a plurality of defocus conditions (with an amount of defocus Z) holding the best focus condition (Z=0) therebetween. Here, the best focus position (Z=0) of the optical system to be inspected can be determined, for example, as a position where the light intensity of a bright and dark pattern image formed by way of the optical system to be inspected is maximized.

When there is no remaining aberration in the optical system to be inspected and the optical adjustment of the optical system to be inspected is ideal, the image position x is constant, as indicated by straight line L1 in FIG. 3, regardless of the amount of defocus Z.

On the other hand, when the optical adjustment condition of the optical system to be inspected includes a condition such as that shown in FIG. 1, the image position x depends on the amount of defocus Z such that the relationship between the image position x and the amount of defocus Z is substantially linear as indicated by straight line L2 in FIG. 3. The gradient of line L2 (x/Z) is substantially proportional to the telecentric index.

Also, when only symmetric aberration remains in the optical system to be inspected, a measurement line which indicates the relationship between the image position and the amount of defocus becomes line L1 shown in FIG. 3. Namely, the image position x is constant regardless of the amount of defocus Z.

However, when only asymmetric aberration remains in the optical system to be inspected, the measurement line becomes curve L3 shown in FIG. 4. Namely, the image position x changes like a high-order curve depending on the amount of defocus Z. Amount of deviation $\alpha$ of curve L3 in the x direction within a predetermined defocus range is substantially proportional to the amount of asymmetric aberration.

In the specification, the measurement line includes a straight line, curve, or the like as shown in FIGS. 3–5 and 9–11.

Here, the amount of deviation a is determined as follows. Namely, a peak point P of a protruded portion of the measurement line is specified. This point P is a point where the curvature of the measurement line is maximized (i.e., point where the radius of curvature is minimized). The amount of deviation $\alpha$ is defined as the maximum clearance between the tangential line passing through the peak point P and the measurement line within the predetermined defocus range.

When symmetric aberration remains in addition to asymmetric aberration in the optical system to be inspected, the resulting measurement line is curve L4 which is formed when curve L3 is moved in parallel to the direction of the vertical axis (i.e., Z-direction) as shown in FIG. 4. Amount of defocus Zp corresponding to the peak point P in curve L4 is substantially proportional to the amount of symmetric aberration in the optical system to be inspected.

Here, the best focus position (Z=0) of the optical system to be inspected can be determined, for example, as a position where the light intensity of a bright and dark pattern image formed by way of the optical system to be inspected is maximized.

Figure 6:
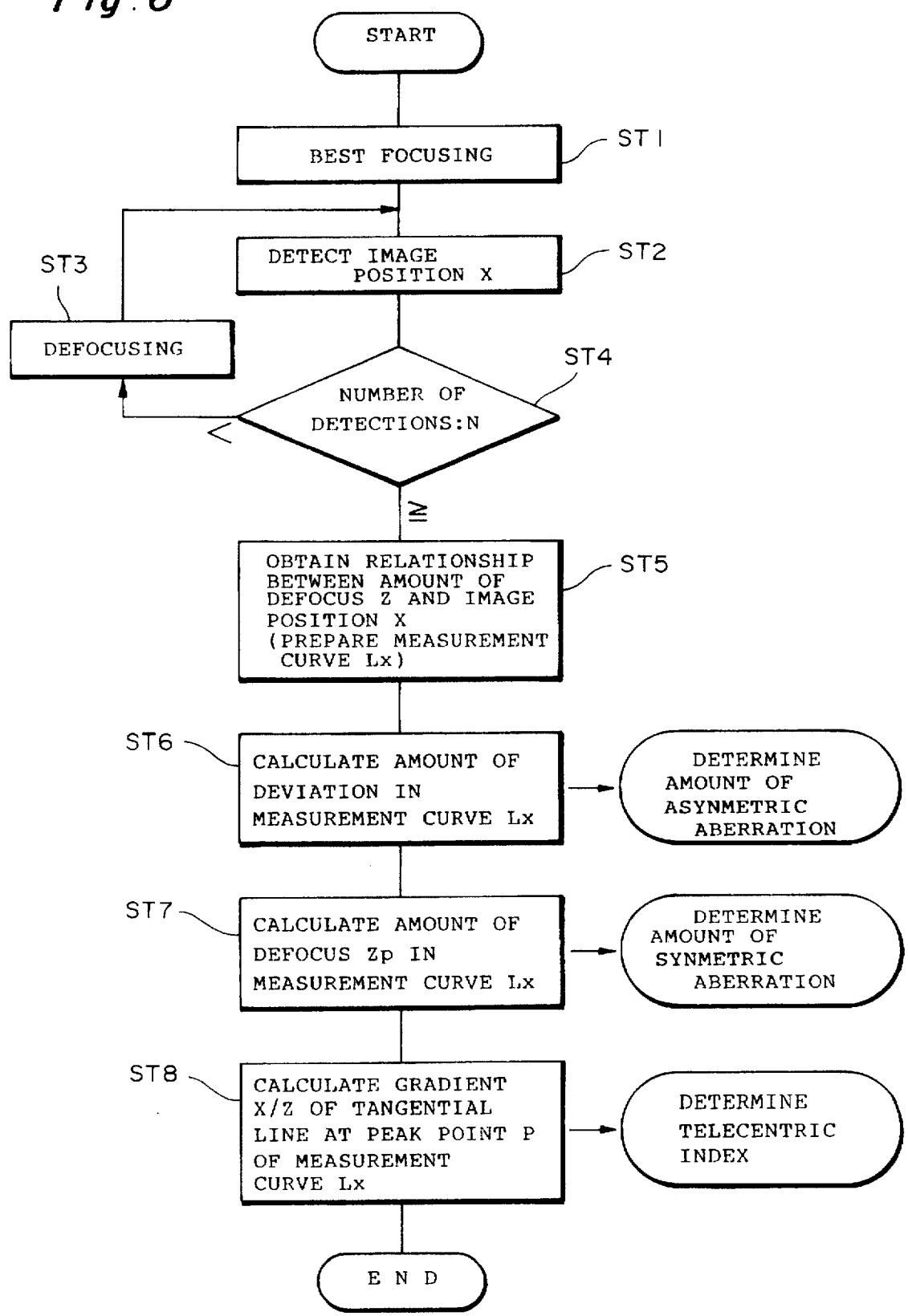
FIG. 6 is a flow chart explaining the first and second embodiments of the method of inspecting an optical system in accordance with the present invention.

In the following, the first embodiment of the inspection method in accordance with the present invention will be explained with reference to the flow chart of FIG. 6. Here, in order to facilitate the explanation, reference will also be made to FIG. 13 which shows a configuration of an inspection apparatus realizing this embodiment. Also, the following explanation of operations will be made on the assumption that adjustment conditions and aberration conditions of a projection optical system in a projection exposure apparatus are inspected.

First, as an initial condition, by using autofocus systems 21A and 21B, a main control system 100 controls control systems 200, 300, and 400 for a reticle stage 14, wafer stages 12 and 17, and the like, such that an image is formed on a detection surface PTa (i.e., reference surface) for the image position under the best focus condition for the image (step ST1). Though the image position under the best focus condition is used as a reference in this embodiment, other image positions under a defocus condition may be used therefor.

This image position under the best focus condition is captured into a signal processor 152 in the main control system 100 by way of a detector 19 (step ST2). This step is repeated at least three times (including the detection of the image under the best focus condition) while, according to an instruction from the main control system 100 (i.e., controller 150), defocusing the image on the detection surface PTa by a predetermined amount of defocus (steps ST3 and ST4). When the image position x is detected at least three times, it can be judged whether the measurement line becomes linear as shown in FIG. 3 or forms a curve as shown in FIG. 4.

After the foregoing detection of the image position x is performed a predetermined number n ($\geq 3$) of times, a calculator 153 in the main control system 100 calculates, with reference to data (i.e., data of reference measurement lines which have already been obtained) within a table 154 prepared beforehand, a measurement line Lx (measurement curve) which is adaptive to the resulting relationship between the amount of defocus Z and the image position x (step ST5). Here, as the number of detections of the image position increases, the measurement line more favorably reflecting the actual optical adjustment conditions and aberration conditions of the optical system to be inspected can be obtained.

Figure 5:
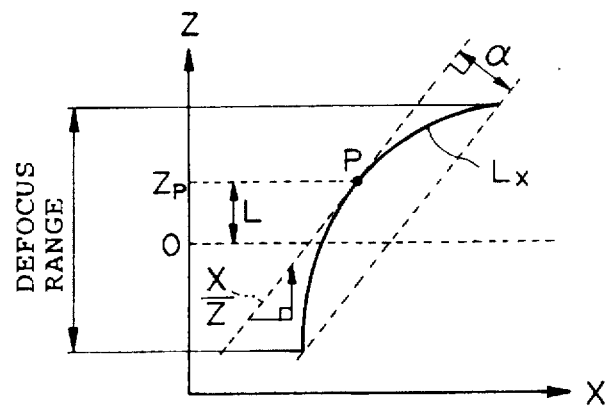

In the actual optical system to be inspected, the above-mentioned various aberrations and the optical adjustment condition shown in FIG. 1 exist in a mixed state. Accordingly, the resulting measurement line Lx is tilted by a predetermined angle as shown in FIG. 5. This is because the measurement line Lx includes the component of the measurement line L2 concerning the optical adjustment condition shown in FIG. 1 and the component of the measurement line L4 concerning the amounts of asymmetric and symmetric aberrations (or measurement line L3 concerning the amount of asymmetric aberration).

The calculator 153 initially specifies a peak point P of thus obtained measurement line Lx. As mentioned above, this peak point P is a peak of a protruded portion of the measurement line Lx within a predetermined defocus range, namely, a point in which the curvature of the measurement line Lx is maximized (i.e., radius of curvature is minimized). Then, the calculator 153 calculates a tangential line of the measurement line Lx passing through thus obtained peak point P, thereby calculating, within the defocus range, the maximum clearance between the resulting tangential line and the measurement line Lx as an amount of deviation a (step ST6). Since thus obtained amount of deviation $\alpha$ is substantially proportional to the amount of asymmetric aberration of the optical system to be inspected, the calculator 153 calculates the amount of asymmetric aberration with reference to the prepared table 154 or on the basis of a constant of proportionality (i.e., known constant) specific to the optical system to be inspected.

Also, the amount of symmetric aberration can be easily obtained when the above-mentioned peak point P is specified on the resulting measurement line Lx. This is because the amount of movement L (i.e., amount of defocus Zp) of the peak point P with respect to the best focus condition is substantially proportional to the amount of symmetric aberration of the optical system to be inspected (step ST7). Accordingly, the calculator 153 calculates the amount of symmetric aberration with reference to the prepared table 154 or on the basis of a constant of proportionality (i.e., known constant) specific to the optical system to be inspected.

Further, the magnitude (i.e., telecentric index) of the optical adjustment condition such as that shown in FIG. 1 can be obtained from the gradient (x/Z) of the tangential line of the measurement line Lx passing through the above-mentioned peak point P (step ST8). Then, the calculator 153 calculates the telecentric index with reference to the prepared table 154 or on the basis of a constant of proportionality (i.e., known constant) specific to the optical system to be inspected. Here, an inspection unit 151 includes the signal processor 152 and the calculator 153.

As explained in the foregoing, in cases where asymmetric aberration, symmetric aberration, and the optical adjustment conditions shown in FIG. 1 exist in a mixed state in the optical system to be inspected, the amount of asymmetric aberration and the amount of symmetric aberration can be detected respectively on the basis of the amount of deviation $\alpha$ of thus obtained curve Lx and the amount of defocus Zp corresponding to the peak point P in the curve Lx. Also, based on the tangential line at the peak point P of the curve Lx, the telecentric index can be obtained. Here, in place of the tangential line, a line approximating the curve Lx, as a whole, may be utilized as well.

The approximation line is easily calculated with method of least square, or the like. The telecentric index can be calculated on the basis of the gradient of the approximation line, and the amount of asymmetric aberration can be calculated on the basis of the distance between the peak point P and the approximation line.

In this manner, based on thus obtained curve Lx, the amount of asymmetric aberration, amount of symmetric aberration, and telecentric index can be detected simultaneously with a favorable reproducibility.

In the first embodiment of the inspection method in accordance with the present invention, the image position of a pattern formed by way of an optical system to be inspected (e.g., projection optical system in FIG. 13) is measured. By contrast, in the second embodiment of the inspection method in accordance with the present invention, the image position of a converged luminous flux formed by way of an optical system to be inspected is measured. In the second embodiment, based on a principle similar to that of the first embodiment, the amount of asymmetric aberration, amount of symmetric aberration, and telecentric index can be detected simultaneously with a favorable reproducibility. The operations of the second embodiment are similar to those of the flow chart shown in FIG. 6.

Figure 7:
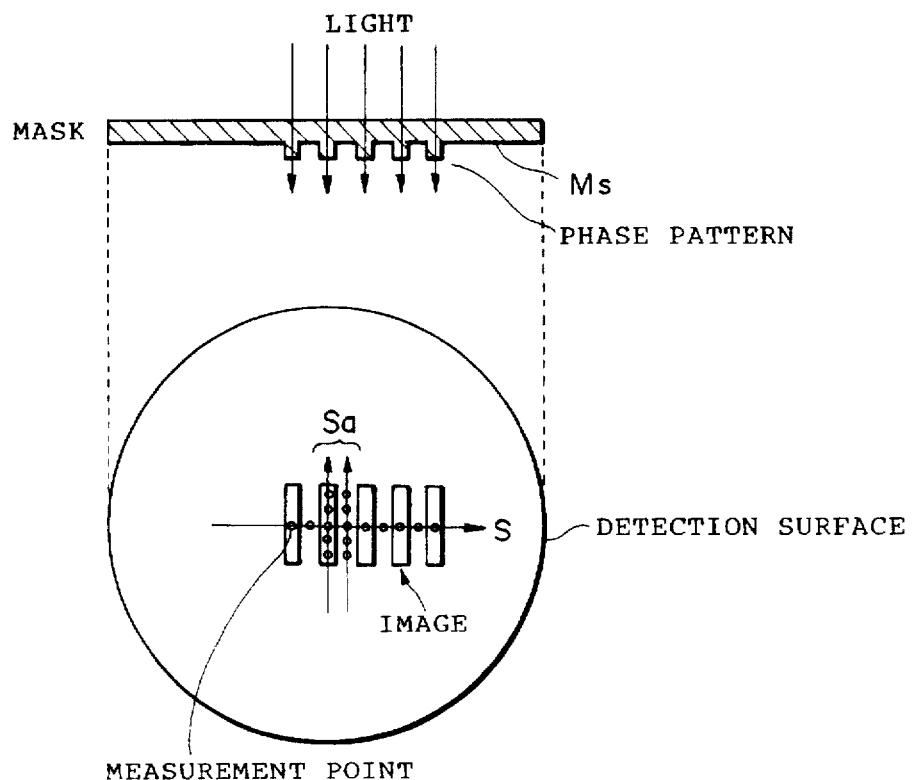
FIG. 7 is a view explaining a method of determining a cross-sectional configuration of a phase pattern and asymmetry of an image of the phase pattern.

On the other hand, in the third embodiment of the inspection method in accordance with the present invention, based on a change in asymmetry of a phase pattern image under individual defocus conditions, the amount of asymmetric aberration, amount of symmetric aberration, and amount of eclipse of an optical system to be inspected can be simultaneously detected. The phase pattern image can be formed on the detection surface, for example as shown in FIG. 7, when protrusions (i.e., phase pattern) is disposed with a predetermined pitch on a surface Ms of a mask which is permeable to light.

Figure 8:
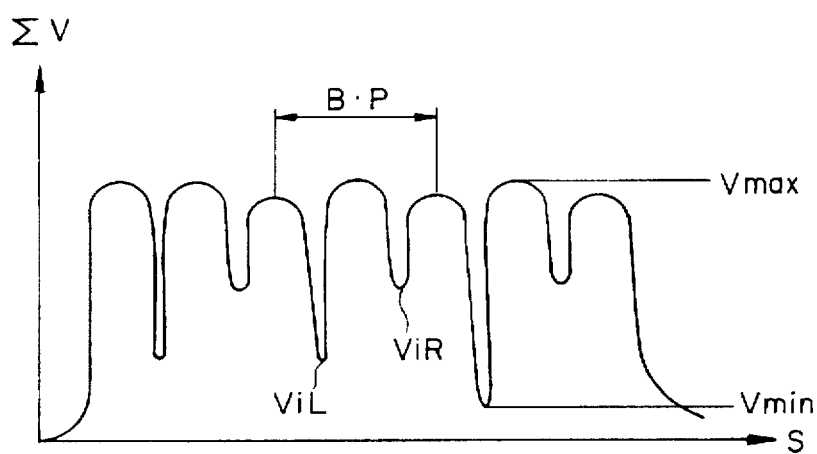
FIG. 8 is a chart explaining asymmetry index $\beta$ of the phase pattern image, where horizontal axis indicates the measurement direction while vertical axis indicates an integrated value of a signal V corresponding to the light intensity at each measurement position.

FIG. 8 is a chart in which integrated signal $\Sigma V$, which is obtained as signals V corresponding to the light intensity of the phase pattern image are integrated in a non-measurement direction Sa, is plotted with respect to a measurement direction S in order to explain asymmetry index β of the phase pattern image.

As shown in FIG. 8, the integrated signal ΣV changes with each period BP (B: magnification from the pattern to the image-pickup surface; P: pitch of the pattern) along the measurement direction S. In order to quantify the asymmetry of the phase pattern image, the minimal signal values at the left and right in the drawing at the i-th period in the distribution of the integrated signal ΣV are defined as $V_{iL}$ and $V_{iR}$, respectively. Also, in the whole area of the integrated signal ΣV excluding the both ends thereof extending over all the periods, the maximum value and minimum value are defined as $V_{max}$ and $V_{min}$, respectively.

Then, the asymmetry index β of the phase pattern image is determined by the following expression:

$$\beta = (1/n) \sum_{i=1}^{n} \{(V_{iL} - V_{iR})/(V_{max} - V_{min})\}$$

wherein:

n: number of periodicity and
Σ: sum mark of i=1 to n.

Figure 9:
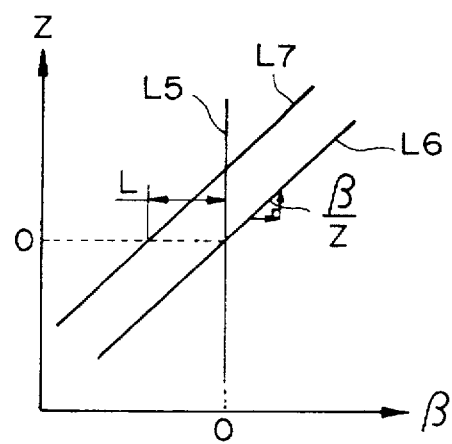
FIGS. 9 to 11 are charts showing, in the third embodiment of the method of inspecting an optical system in accordance with the present invention, for individual optical adjustment conditions of the optical system to be inspected and aberrations generated, relationships between the amount of defocus in the optical system and the asymmetry index $\beta$ of the phase pattern image.
Figure 10:
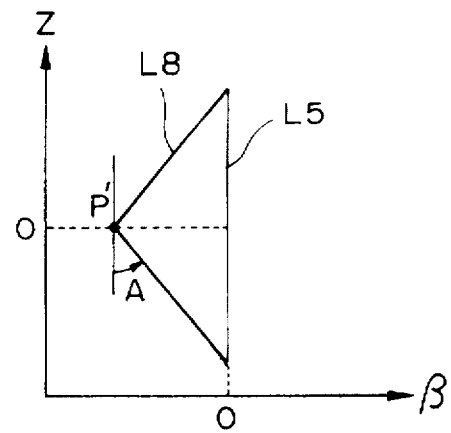

FIGS. 9 and 10 are charts showing, in this third embodiment, under individual defocus conditions, relationships between the change in the asymmetry index β of the phase pattern image and various aberrations.

Under the ideal optical adjustment condition where there is neither remaining aberration nor eclipse in the optical system to be inspected, as indicated by line L5 in FIG. 9, the index β is zero regardless of the amount of defocus Z. Also, when there is only symmetric aberration in the optical system to be inspected, as indicated by line L5 in FIG. 9, the index β is constant regardless of the amount of defocus Z.

However, when only asymmetric aberration exists in the optical system to be inspected, as indicated by line L6 in FIG. 9, the index β depends on the amount of defocus Z such that the relationship between the index β and the amount of defocus Z becomes linear. Then, the gradient (β/Z) of this line L6 is substantially proportional to the amount of asymmetric aberration.

When symmetric aberration remains in addition to asymmetric aberration in the optical system to be inspected, the resulting measurement line is curve L7 which is formed when curve L6 is moved in parallel to the direction of the horizontal axis (i.e., β-direction) as shown in FIG. 9. Amount of parallel movement L at the best focus position (Z=0) is substantially proportional to the amount of symmetric aberration. Here, the best focus position (Z=0) of the optical system to be inspected can be determined, for example, as a position where the light intensity of a bright and dark pattern image formed by way of the optical system to be inspected is maximized.

Also, when eclipse exists in the optical system to be inspected, as indicated by polygonal line L8 in FIG. 10, the index β becomes substantially linear depending on the defocus direction and the amount of defocus Z. Bending amount A (β/Z) of polygonal line L8 with respect to line L5 (or tangential line at an apex P' of the measurement line) is substantially proportional to the amount of eclipse.

In this manner, also in the third embodiment, based on the change in asymmetry of the phase pattern image under individual defocus conditions, the amount of symmetric aberration, amount of asymmetric aberration, and amount of eclipse can be detected simultaneously with a favorable reproducibility.

In the following, the third embodiment of the inspection method in accordance with the present invention will be explained with reference to the flow chart of FIG. 12. Here, in order to facilitate the explanation, reference will also be made to FIG. 19 which shows a configuration of an inspection apparatus realizing this embodiment. Also, the following explanation of operations will be made on the assumption that optical adjustment conditions and aberration conditions of an alignment optical system in an alignment apparatus disposed inside of a projection exposure apparatus are inspected.

First, as an initial condition, a controller 150 in a main control system 100 forms an image of a phase pattern, under the best focus condition, on a detector 19 for detecting the phase pattern image (step ST9). Instead of using the best focus condition as a reference in particular, the phase pattern may be detected within a predetermined defocus range in this embodiment as well.

Next, information of the detected phase pattern image is captured from the detector 19 by a signal processor 152 (step ST10) and then a calculator 153 calculates the index β (step ST11). By repeating the image detection and defocusing steps for a predetermined number of times (steps ST12 and ST13), the calculator 153 calculates a measurement line Ly (measurement curve) (step ST14). At this moment, the calculator 153 calculates, with reference to a table 154 (i.e., data of reference measurement lines obtained beforehand) which has been prepared beforehand, a measurement line Ly which is adaptive to thus obtained relationship between the amount of defocus Z and the index β (step ST15).

Figure 11:
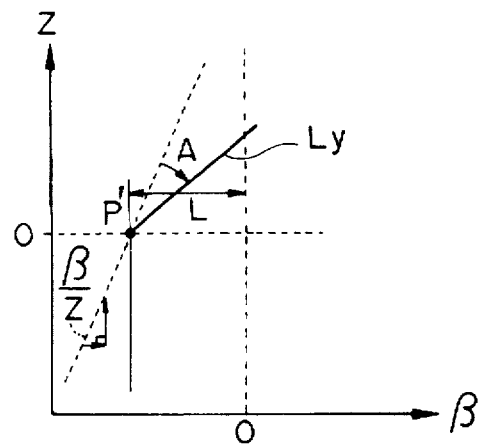

In the actual optical system to be inspected, the above-mentioned aberrations and eclipse exist in a mixed state. Accordingly, the resulting measurement line Ly is tilted by a predetermined angle as shown in FIG. 11. This is because the measurement line Ly includes the components of the measurement lines L6 or L7 concerning the amount of asymmetric aberration and/or amount of symmetric aberration shown in FIG. 9 as well as the component of the measurement line L8 concerning the eclipse condition shown in FIG. 10.

From thus obtained measurement line Ly, the calculator 153 initially specifies a peak point P' thereof. As mentioned above, this peak point P' is a point which becomes an apex of the measurement line Ly within a predetermined defocus range. Then, the calculator 153 calculates gradient (β/Z) of the tangential line passing through thus obtained peak point P' (step ST15). Then, the calculator 153 calculates the amount of asymmetric aberration with reference to the prepared table 154 or on the basis of a constant of proportionality (i.e., known constant) specific to the optical system to be inspected.

Also, the calculator 153 calculates, within a predetermined defocus range, the maximum clearance between the tangential line passing through the peak point P' of the measurement line Ly and the measurement line Ly as an amount of deviation α (step ST16). Then, the calculator 153 calculates the amount of symmetric aberration with reference to the prepared table 154 or on the basis of a constant of proportionality (i.e., known constant) specific to the optical system to be inspected.

Further, the calculator 153 calculates a bending amount A of the measurement line Ly with respect to the tangential line at peak point P' of the measurement line Ly (step ST17). Then, the calculator 153 calculates the amount of eclipse with reference to the prepared table 154 or on the basis of a constant of proportionality (i.e., known constant) specific to the optical system to be inspected.

Here, the above-mentioned signal processor 152 and calculator 153 are included in an inspection unit 151 within the main control system 100.

In the first embodiment of the inspection method in accordance with the present invention, the amount of deviation α of the measurement line Lx may change depending not only on the defocus range but on such factors as illumination a (i.e., ratio of the numerical aperture of the illumination optical system to that of the image-forming optical system) and the pattern form. Accordingly, it is preferable for the inspection sensitivity to be controlled, by appropriately changing, for example, the illumination a and defocus range as well as the pitch, duty cycle, taper angle, bright and dark difference, difference in level, and the like of the phase pattern, such that inspection can be optimally performed under a practical condition.

Also, in the second embodiment of the inspection method in accordance with the present invention, the range of relative movement of a point of convergence, form of a luminous flux, and the like can be appropriately changed so as to control the inspection sensitivity.

Further, in the third embodiment of the inspection method in accordance with the present invention, it is preferable for the inspection sensitivity to be controlled, by appropriately changing, for example, the illumination σ and defocus range as well as the pitch, duty cycle, difference in level, and the like of the phase pattern, such that inspection can be optimally performed under a practical condition.

In a projection exposure apparatus, the aberration condition of a projection optical system as well as the optical adjustment conditions of an illumination optical system and the projection optical system are inspected by the first to third embodiments of the inspection apparatus in accordance with the present invention which will be explained in the following. Then, while various aberrations of the projection optical system are corrected on the basis of the detected aberration condition, an optical adjustment mechanism, which will be explained later, performs optical adjustment of the illumination optical system and projection optical system on the basis of the detected optical adjustment conditions. Accordingly, by way of the projection optical system in which the aberrations have been favorably corrected and which has been optically adjusted, overlay exposure can be performed with a high accuracy.

In the following, each embodiment of the inspection apparatus in accordance with the present invention will be explained with reference to attached drawings.

Figure 13:
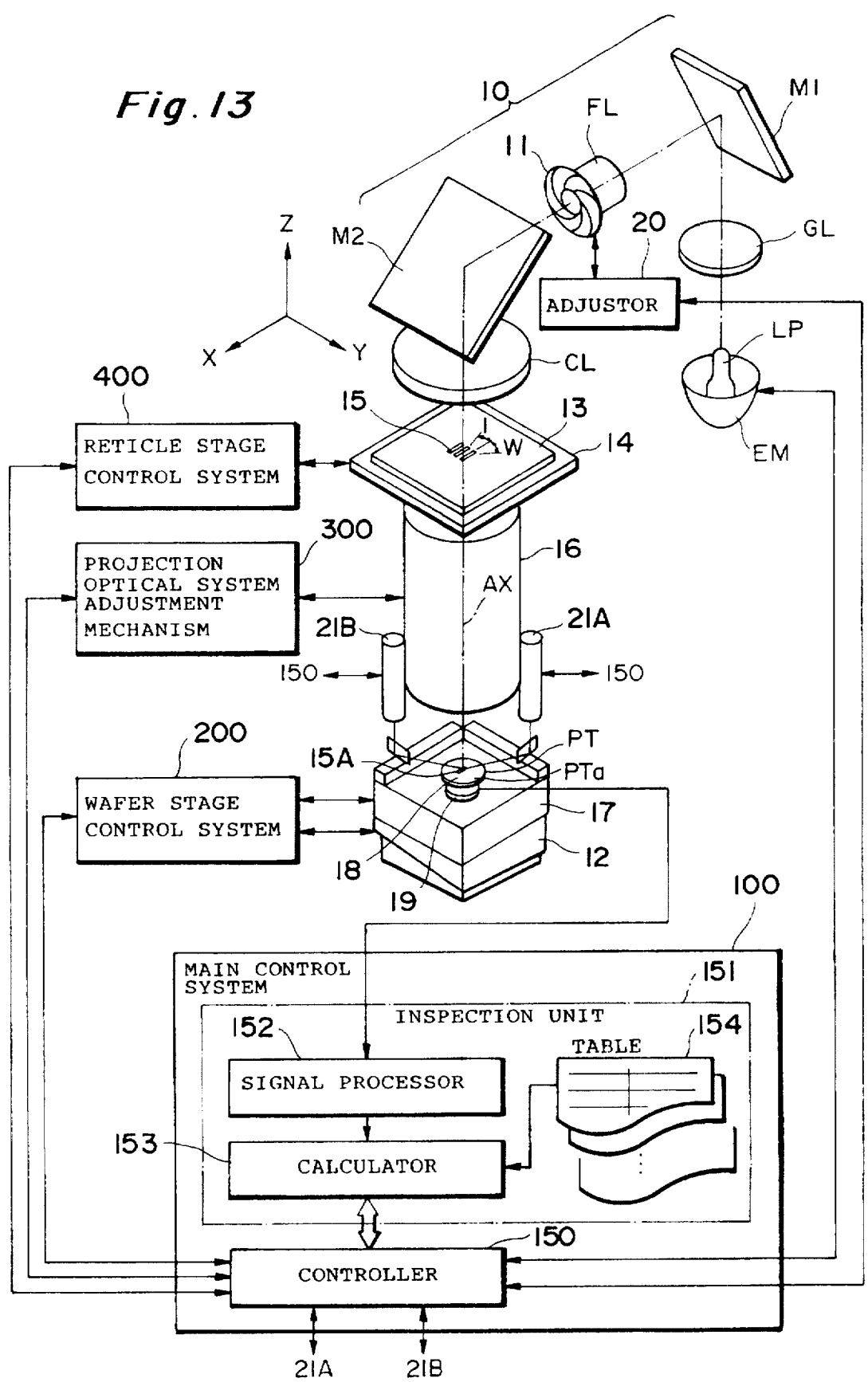
FIG. 13 is a perspective view showing a schematic configuration of a projection exposure apparatus provided with the first embodiment of the inspection apparatus in accordance with the present invention.

FIG. 13 is a perspective view showing a schematic configuration of a projection exposure apparatus provided with the first embodiment of the inspection apparatus in accordance with the present invention.

In this drawing, Z-axis is set in parallel to an optical axis AX of a projection optical system 16 of the projection exposure apparatus, while X-axis and Y-axis are set orthogonal to each other within a plane perpendicular to the optical axis AX.

The projection exposure apparatus of FIG. 13 has a light source LP which comprises, for example, an extra-high pressure mercury lamp. The light source LP is positioned at a first focal position of a converging mirror (i.e., ellipsoidal mirror) EM having a reflective surface made of an ellipsoid of revolution. Accordingly, an illumination luminous flux emitted from the light source LP forms a light source image (i.e., secondary light source) at a second focal position of the ellipsoidal mirror EM.

The light from the secondary light source is turned into a parallel luminous flux by way of a collimator lens GL and a mirror M1 and then enters a fly-eye lens FL. The configuration of the fly-eye lens is disclosed, for example, in U.S. Pat. No. 4,939,630.

The luminous flux entering the fly-eye lens FL is two-dimensionally divided by a plurality of lens units constituting the fly-eye lens FL, thereby forming a plurality of light source images (i.e., tertiary light source) at the rear-side focal point (i.e., near the emitting surface) of the fly-eye lens FL.

The luminous fluxes from a plurality of the light source images are limited by a variable aperture stop 11 disposed at the emitting surface of the fly-eye lens FL and then enter a condenser lens CL by way of a mirror M2. The light converged by way of the condenser lens CL uniformly illuminates a mask 13, in which a transfer pattern has been formed, in a superposing manner. The mask 13 is held by a reticle stage 14 which is movable by a reticle stage control system 400.

In this manner, the light source PL, the ellipsoidal mirror EM, the collimator lens GL, the mirror M1, the fly-eye lens FL, the variable aperture stop 11, the mirror M2, and the condenser lens CL constitute an illumination optical system 10.

Also, at least the variable aperture stop 11, an adjustor 20 for controlling the aperture size of the variable aperture stop 11, and a controller 150 within a main control system 100 constitute a sensitivity adjustment mechanism for controlling the inspection sensitivity for the optical adjustment condition and aberration condition of the optical system to be inspected.

Upon exposure, the luminous flux passing through the mask 13 reaches a wafer (not depicted), which is a photosensitive substrate, by way of the projection optical system 16. Thus, a pattern image of the mask 13 is formed on the wafer. The wafer is supported on an XY stage 17 which is two-dimensionally movable in an XY-plane perpendicular to the optical axis AX (parallel to Z-direction) of the projection optical system as well as on a Z stage 12 which is movable along the direction of the optical axis AX of the projection optical system 16. Accordingly, when exposure is effected while the wafer is two-dimensionally moved, patterns of the mask 13 can be sequentially transferred to respective exposure areas of the wafer.

The projection exposure apparatus of FIG. 13 is provided with oblique light-entering type autofocus systems 21A and 21B. In the oblique light-entering type autofocus systems, the light-emitting system 21A obliquely illuminates the surface of the wafer. The light regularly reflected on the wafer surface is received by the light-receiving system 21B, so that the position of the wafer in the Z-direction is detected on the basis of positional change in the reflected light.

In this manner, according to operations of the autofocus systems 21A and 21B, the wafer surface can substantially coincide with the image-forming surface of the projection optical system 16 (i.e., surface which is conjugate with the mask 13) upon exposure. These autofocus systems 21A and 21B are controlled by the controller 150 in the main control system 100.

On the other hand, upon inspection, a reference member PT and a light detector 19 are disposed on the XY stage 17 in place of the wafer. Then, by the operations of the autofocus systems 21A and 21B and Z stage 12, a surface PTa of the reference member PT is positioned at a predetermined defocus position with respect to the projection optical system 16. The stages 12 and 17, a wafer stage control system 200 for driving these stages 12 and 17, and the controller 150 within the main control system 100 constitute a defocus mechanism for performing these operations.

In this case, the autofocus systems 21A and 21B are initially used to make the surface PTa of the reference member PT substantially coincide with image-forming surface of the projection optical system 16 and then this position is defined as the best focus position (Z=0). Thereafter, from the best focus position (Z=0), the Z stage 12 can be driven by a predetermined amount Z (i.e., defocus amount) so as to place the surface PTa (i.e. detection surface) of the reference member PT at a predetermined defocus position. Alternatively, the pattern 15 or the projection optical system 16 may be moved in the Z-direction to form a defocus condition.

Under each defocus condition, the luminous flux passing through the inspection pattern 15 formed on the mask 13 reaches the surface PTa of the reference member PT by way of the projection optical system 16. In this manner, an inspection pattern image 15A for the mask 13 is formed on the surface PTa of the reference member PT under each defocus condition. The light from the pattern image 15A enters the light detector 19 by way of a slit 18 formed in the surface PTa of the reference member PT.

The slit 18 is formed, for example, by a single slit pattern. Accordingly, in a slit scan technique in which the pattern image 15A and the slit 18 are relatively moved with respect to each other in a predetermined direction, an electric signal corresponding to the light intensity distribution of the pattern image 15A can be obtained at the light detector 19.

Figure 12:
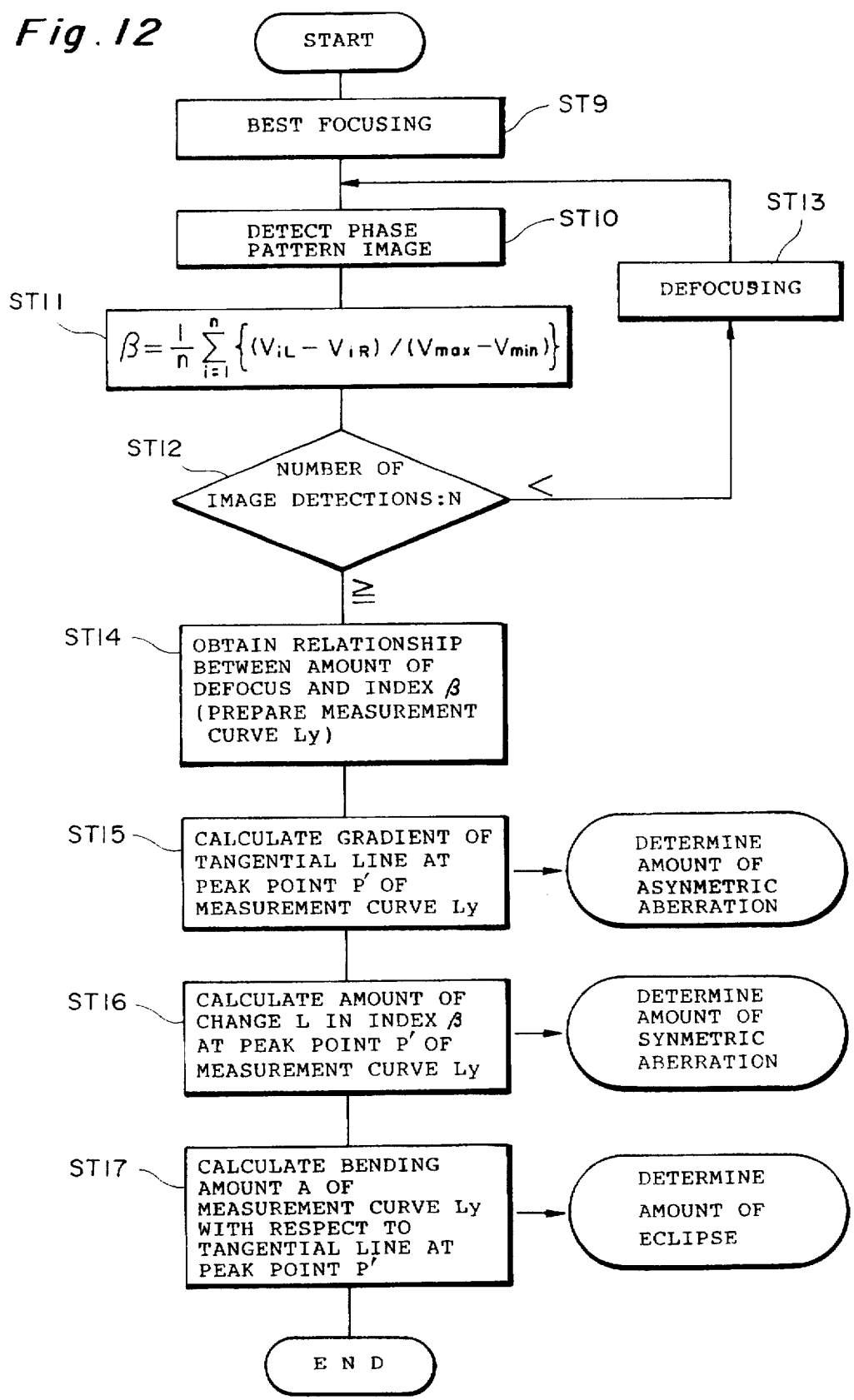
FIG. 12 is a flow chart explaining the third embodiment of the method of inspecting an optical system in accordance with the present invention.

The main control system 100 includes an inspection unit 151 for performing the operations shown in FIG. 12 and the controller 150 for controlling a reticle stage control system 400, a projection optical system adjustment mechanism 300, and the wafer stage control system 200 which respectively drive the reticle stage 14, the projection optical system 16, and the wafer stages 12 and 17.

The inspection apparatus in accordance with the present invention is applicable to collective exposure apparatuses as well as scanning type exposure apparatuses.

Technologies in conjunction with these kinds of exposure apparatuses are disclosed, for example, in U.S. patent application Ser. Nos. 08/255,927, 08/260,398, and 08/299,305 as well as in U.S. Pat. Nos. 4,497,015, 4,666,273, 5,194,893, 5,253,110, 5,333,035, and 5,379,091. The projection optical system in accordance with the present invention is applicable to any of the exposure apparatuses disclosed in these literatures.

The above-mentioned U.S. patent application Ser. No. 08/255,927 discloses an illumination optical system (using a laser source) applicable to a scanning type exposure apparatus. The above-mentioned U.S. patent application Ser. No. 08/260,398 discloses an illumination optical system (using a lamp light source) applicable to a scanning type exposure apparatus. U.S. patent application Ser. No. 08/299,305 discloses an alignment mechanism which is applicable to a scanning type exposure apparatus. U.S. Pat. No. 4,497,015 discloses an illumination optical system (using a lamp light source) which is applicable to a general exposure apparatus. U.S. Pat. No. 4,666,273 discloses an example of a step and repeat type exposure apparatus. U.S. Pat. No. 5,194,893 discloses a scanning type exposure apparatus and, in particular, an illumination optical system, an illumination area, interference systems on the mask and reticle sides, an autofocus mechanism, and an alignment optical system. U.S. Pat. No. 5,253,110 discloses an illumination optical system (using a laser source) which is applied to a step and repeat type exposure apparatus. The illumination optical system disclosed therein is also applicable to a scanning type exposure apparatus. U.S. Pat. No. 5,333,035 discloses a modified illumination optical system which is applied to a general exposure apparatus. U.S. Pat. No. 5,379,091 discloses an illumination optical system (using a laser source) which is applied to a scanning type exposure apparatus. In addition, U.S. Pat. No. 5,245,384 discloses an illumination optical system which uses a mercury lamp and is applicable to a normal exposure apparatus (stepper).

FIGS. 14 to 17 are charts showing results of simulation concerning relationships between the positional change in the inspection pattern image 15A formed by way of the projection optical system 16 and the aberration in the projection optical system 16 under individual defocus conditions in the first embodiment.

In this simulation, the inspection pattern 15 is a bright and dark pattern whose line width W and interval I are 0.5 μm each on the reticle 13 (cf. FIG. 13). Also, numerical aperture NA of the projection optical system 16 is 0.5, while wavelength $\lambda$ of the exposure light is 365 nm. The value of illumination σ, which depends on the aperture size of the variable aperture stop 11, is 0.5.

Figure 14:
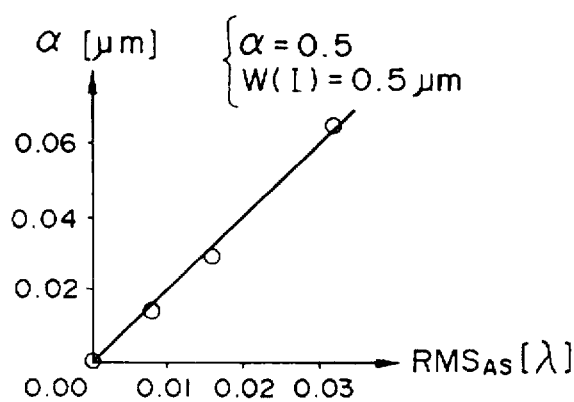
FIGS. 14 to 17 are charts showing, in the first embodiment of the present invention shown in FIG. 13, for individual defocus conditions, relationships between the positional change of an image 15A of an inspection pattern 15 formed by way of a projection optical system 16 and the aberrations generated in the projection optical system 16.

FIG. 14 is a chart showing the results of simulation when only asymmetric aberration is applied to the projection optical system 16 which is an optical system to be inspected. Its vertical axis indicates the amount of deviation α of the measurement line (cf. amount of deviation a of curves L4 and Lx shown in FIGS. 4 and 5), whereas its horizontal axis indicates the amount of asymmetric aberration ($RMS_{AS}[\lambda]$).

As shown in FIG. 14, a linear relationship is established well between the amount of deviation α of the measurement line and the amount of asymmetric aberration in the projection optical system 16.

Figure 15:
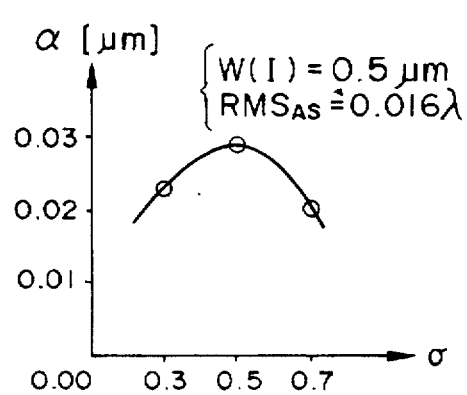

FIG. 15 shows the change in the amount of deviation α of the measurement line when the illumination σ is changed among 0.3, 0.5, and 0.7 while the amount of asymmetric aberration is constant at $RMS_{AS}=0.016\lambda$.

Figure 16:
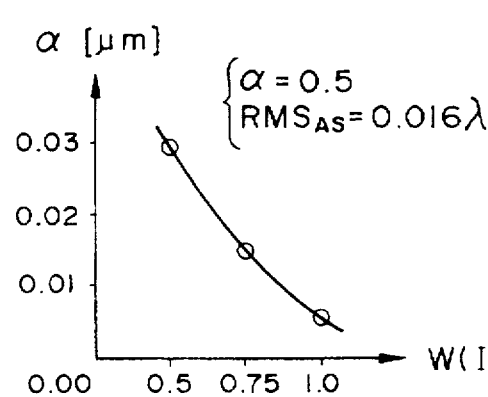

On the other hand, FIG. 16 shows the change in the amount of deviation α of the measurement line when both line width W and interval I of the pattern 15 is changed among 0.5 μm, 0.75 μm, and 1.0 μm while the amount of asymmetric aberration is constant at $RMS_{AS}=0.16\lambda$.

In view of FIGS. 15 and 16, it is understood that the sensitivity of the amount of deviation α of the measurement line with respect to the change in illumination σ is lower than that with respect to the change in pattern. Accordingly, in terms of the control of inspection sensitivity, it is preferable that the illumination a for inspection coincides with that under a practical condition and then the defocus range, form of the pattern, and the like are changed so as to control the inspection sensitivity (by a sensitivity control mechanism).

Figure 17:
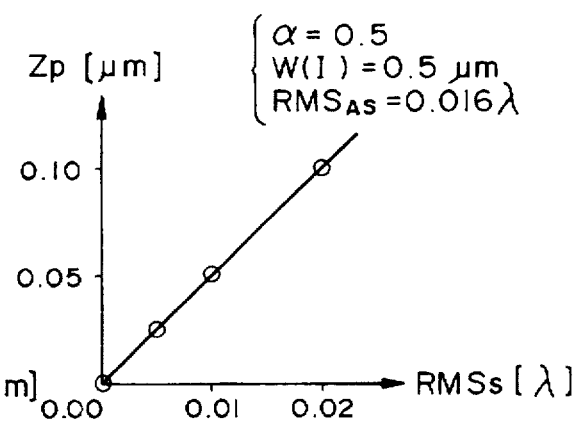

FIG. 17 is a chart showing results of simulation where symmetric aberration is applied as symmetric aberration, in addition to asymmetric aberration, to the projection optical system 16. Its vertical axis indicates the amount of defocus Zp corresponding to the peak point P of the measurement line (cf. Zp of curves L4 and Lx shown in FIGS. 4 and 5), whereas its horizontal axis indicates the amount of symmetric aberration ($RMS_S[\lambda]$). In this chart, the amount of asymmetric aberration is constant at $RMS_{AS}=0.016\lambda$. Also, he best focus position (Z=0) is determined from the position where the light intensity of the image 15A of the 1-μm bright and dark pattern 15 is maximized.

As shown in FIG. 17, a linear relationship is established well between the amount of defocus Zp corresponding to the peak point P of the measurement line and the amount of symmetric aberration in the projection optical system 16.

As already explained, the amount of telecentricity of the projection optical system 16 can be determined on the basis of the tangential line at the peak point P of the resulting measurement line. Alternatively, a line approximating the whole measurement line may be used in place of the tangential line.

In this manner, in the first embodiment of the inspection apparatus in accordance with the present invention, based on the positional change in the pattern image under individual defocus conditions, the amount of asymmetric aberration, amount of symmetric aberration, and telecentric index of the projection optical system 16 of the projection exposure apparatus can be detected simultaneously with a favorable reproducibility.

Also, a plurality of patterns having forms different from each other may be disposed on the mask and, based on difference between positional change of these pattern images, the aberration condition of the projection optical system 16 and the optical adjustment condition of the projection exposure apparatus may be inspected. By using a difference between measurement lines of images of patterns having forms different from each other, the aberration condition of an optical system containing higher-order aberrations as well as lower-order aberrations can be inspected with high accuracy.

Further, though the amount of change in the image position within a predetermined defocus range is used as the amount of deviation a of the measurement line in this first embodiment, the amount of secondary or tertiary component of the measurement line may also be used therefor.

In the projection exposure apparatus shown in FIG. 13, in order to correct the symmetric and asymmetric aberrations of the projection optical system 16, among the lens components constituting the projection optical system, a lens sensitive to the symmetric or asymmetric aberration is shifted or tilted with respect to the optical axis AX. On the other hand, in order to correctly adjust the optical adjustment condition in this projection exposure apparatus, the variable aperture stop 11 or an aperture stop in the projection optical system 16 is appropriately driven with respect to the optical axis AX. Accordingly, in this configuration, the projection optical system adjustment mechanism 300 and the controller 150 within the main control system 100 constitute the aberration correction mechanism and optical adjustment mechanism.

Figure 18:
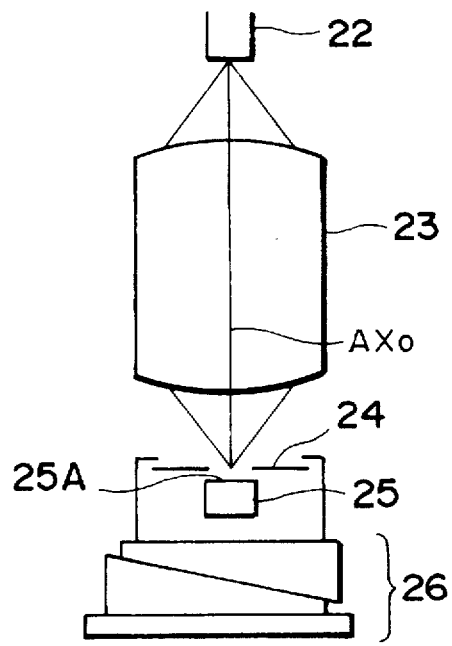
FIG. 18 is a view showing a schematic configuration of a projection exposure apparatus provided with the second embodiment of the inspection apparatus in accordance with the present invention.

FIG. 18 is a view showing a schematic configuration of the second embodiment of the inspection apparatus in accordance with the present invention. While the above-mentioned first embodiment measures the position of the pattern image formed by way of the optical system, this second embodiment measures the position of the converging luminous flux formed by way of an optical system. Examples of such an optical system include the LSA disclosed in Japanese Unexamined Patent Publication Sho No. 62-038303 and the laser reflector apparatus (Japanese Unexamined Patent Publication Hei No. 6-234092).

The inspection apparatus shown in FIG. 18 is provided with a laser source 22 for supplying a luminous flux. The luminous flux from the laser source 22 is converged by way of an optical system 23 to be inspected. The position of the converging luminous flux is detected at a detection surface 25A of a light detector 25, for example, by a slit scan technique in which a slit plate 24 and the position of the converging luminous flux are relatively moved with respect to each other.

Then, in this second embodiment, a stage 26 is driven so as to appropriately move the slit plate 24 and the light detector 25 in the direction of an optical axis $AX_0$ of the optical system 23 to be inspected, while the position of the converging luminous flux is measured. Thus, in this second embodiment, the position of the converging luminous flux is measured simply in place of the position of the pattern image in the first embodiment. Accordingly, in this second embodiment, a measurement line which is basically the same as that of the first embodiment can be obtained and, in a manner similar to that of the first embodiment (cf. the flow chart of FIG. 12), the amount of asymmetric aberration, amount of symmetric aberration, and telecentric index of the optical system 23 to be inspected can be inspected simultaneously with a favorable reproducibility.

Figure 19:
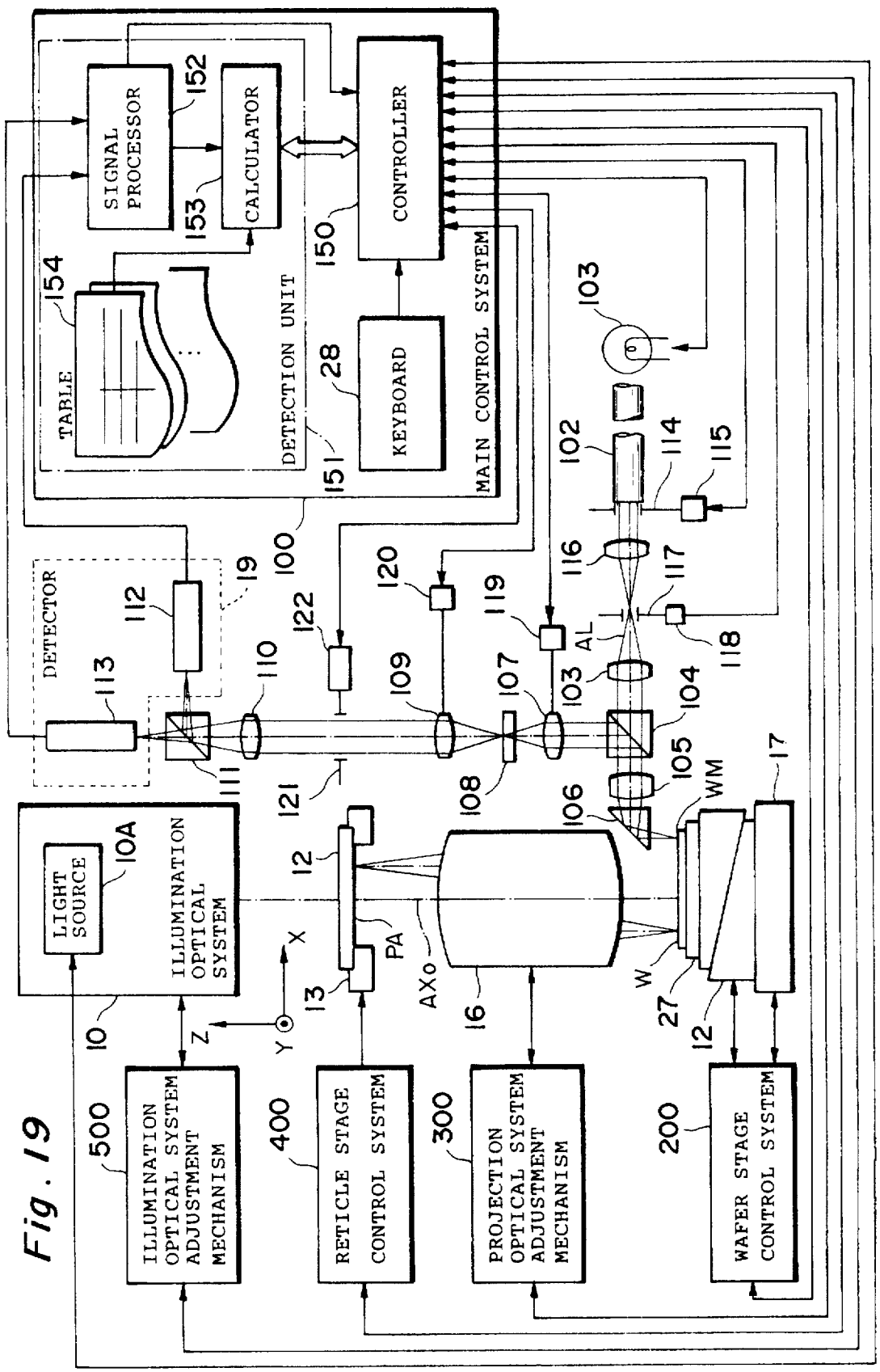
FIG. 19 is a view showing a schematic configuration of a projection exposure apparatus provided with the third embodiment of the inspection apparatus in accordance with the present invention.

FIG. 19 is a view showing a schematic configuration of a projection exposure apparatus provided with the third embodiment of the inspection apparatus in accordance with the present invention. While the first embodiment of the inspection apparatus inspects the projection optical system and illumination optical system of the projection exposure apparatus, this third embodiment inspects an image-forming optical system and an illumination optical system in an off-axis type alignment optical system of the projection exposure apparatus.

In FIG. 19, Z-axis is set in parallel to the optical axis AXo of a projection optical system 16, X-axis is set in a direction parallel to the paper surface of FIG. 19 within a plane perpendicular to the optical axis, and Y-direction is set in a direction perpendicular to both Z- and X-directions.

The projection exposure apparatus shown in FIG. 19 is provided with an exposure illumination optical system 10 for uniformly illuminating a reticle 12, as a mask, with appropriate exposure light from a light source 10A. The reticle 12 is supported on a reticle stage 13 substantially in parallel to the XY-plane and a circuit pattern to be transferred is formed in a pattern area PA thereof. The reticle stage 13 is driven by a reticle stage control system 400 according to an instruction from a controller 150 within a main control system 100.

The light passing through the reticle 12 reaches a wafer (or glass plate) W by way of the projection optical system 16 so as to form a pattern image of the reticle 12 on the wafer W.

Here, the wafer W is supported substantially in parallel to the XY-plane on a Z stage 12 by way of a wafer holder 27. The Z stage 12 is driven by a wafer stage control system 200 along the optical axis of the projection optical system 16.

Further, the Z stage 12 is supported on an XY stage 17. Also by the wafer stage control system 200, the XY stage 17 is two-dimensionally driven within the XY-plane which is perpendicular to the optical axis $AX_0$ of the projection optical system 16.

Figure 20:
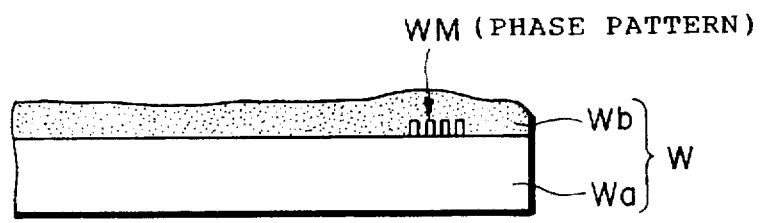
FIG. 20 is a view showing a cross-sectional configuration of the photosensitive substrate shown in FIG. 19.

Upon projection exposure, it is necessary for the pattern area PA and the individual exposure area on the wafer W to be optically positioned (i.e., aligned) with respect to each other. Therefore, the position of an alignment level difference mark formed on the wafer, i.e., a wafer mark WM, within a reference coordinate system is detected and, based on its positional information, alignment if effected. In order to detect the position of the wafer mark WM so as to effect alignment, the alignment apparatus of the present invention is used. FIG. 20 shows a cross-sectional configuration of the photosensitive substrate W in which the wafer mark WM is formed. In this photosensitive substrate W, a photosensitive material Wb is coated on the surface of an exposure object Wa such as a silicon wafer or glass plate.

In order to supply illumination light (i.e., alignment light AL), the alignment apparatus shown in FIG. 19 is provided with a light source 103 such as a halogen lamp. The light from the light source 103 is guided to a predetermined position by way of a waveguide 102 such as an optical fiber.

The illumination light emitted from an exit end of the waveguide 102 is limited, if necessary, by an illumination aperture stop 114 and then enters a condenser lens 116 as an illumination luminous flux having an appropriate cross-sectional form.

The alignment light AL passing through the condenser lens 116 is converged and then enters an illumination relay lens 103 by way of an illumination field stop 117. The alignment light AL is turned into parallel light by way of the illumination relay lens 103 and then passes through a half prism 104 so as to enter a first objective lens 105. The alignment light AL is converged by the first objective lens 105 and then reflected, downward in this drawing, by a reflective surface of a reflective prism 106 so as to illuminate the wafer mark WM which is an alignment mark formed on the wafer W.

In this manner, the light source 103, the waveguide 102, the illumination aperture stop 114, the condenser lens 116, the illumination field stop 117, the illumination relay lens 103, the half prism 104, the first objective lens 105, and the reflective prism 106 constitute an illumination optical system for irradiating the wafer mark WM with illumination light.

The reflection light from the wafer mark WM with respect to the illumination light enters the half prism 104 by way of the reflective prism 106 and the first objective lens 105. The light reflected upward in the drawing by the half prism 104 forms an image of the wafer mark WM on an index plate 108 by way of a second objective lens 107. The light passing through the index plate 108 enters an XY-branching prism 111 by way of a relay lens system 109 and 110. Then, the light component reflected by the XY-branching prism 111 and the light component passing therethrough enter a Y-direction CCD 112 and an X-direction CCD 113, respectively. Here, an image-forming aperture stop 121 is disposed in the parallel light path of the relay lens system 109 and 110 as occasion demands.

In this manner, the reflective prism 106, the first objective lens 105, the half prism 104, the second objective lens 107, the index plate 108, the relay lens system 109 and 110, the image-forming aperture stop 121, and the half prism 111 constitute an image-forming optical system for forming a mark image based on the reflected light from the wafer mark with respect to the illumination light.

Also, the Y-direction CCD 112 and the X-direction CCD 113 form an image detector for detecting the mark image formed by way of the image-forming optical system.

In this manner, the mark image is formed on the image-pickup surfaces of the Y-direction CCD 112 and the X-direction CCD 113 together with the index pattern image of the index plate 108. The output signals from the Y-direction CCD 112 and the X-direction CCD 113 are supplied to a signal processor 152 within the main control system 100. Then, the positional information of the wafer mark WM obtained at the signal processor 152 by signal processing (e.g., waveform processing) is supplied to the controller 150 within the main control system 100.

Based on the positional information of the wafer mark WM from the signal processor 152, the controller 152 outputs a stage control signal to the wafer stage control system 200. According to the stage control signal, the wafer stage control system 200 appropriately drives the XY stage 17 so as to effect alignment of the wafer W.

For example, by way of an input device 28 such as a keyboard, instructions with respect to the illumination aperture stop 114, the illumination field stop 117, and the image-forming aperture stop 121 are supplied to the controller 150. Based on these instructions, the controller 150 drives the illumination aperture stop 114 by way of a driving system 115, the illumination field stop 117 by way of a driving system 118, or the image-forming aperture stop 121 by way of a driving system 120. Also, based on instructions for correcting aberration which will be explained later, the controller 150 drives the second objective lens 107 and the relay lens 109 by way of driving systems 119 and 122, respectively (i.e., by an aberration correction mechanism).

As already mentioned, FIGS. 7 and 8 are charts in which integrated signal $\Sigma V$, which is obtained as signals V corresponding to the light intensity of the phase pattern image are integrated in a non-measurement direction Sa, is plotted with respect to a measurement direction S in order to explain asymmetry index $\beta$ of the phase pattern image.

In the third embodiment of the inspection apparatus in accordance with the present invention, the image of the wafer mark WM composed of a phase pattern is formed on the image-pickup surfaces of the CCDs 112 and 113 which form an image-pickup device 19. Accordingly, in FIG. 8, the integrated signal $\Sigma V$, which is obtained as image-pickup signals V from the image-pickup device 19 are integrated in the non-measurement direction Sa, is plotted with respect to the measurement direction S.

As shown in FIG. 8, the integrated signal $\Sigma V$ changes with each period BP (B: magnification of the image-forming optical system; P: pitch of the phase pattern WM on the wafer) along the measurement direction S. In order to quantify the asymmetry of the phase pattern image, the minimal signal values at the left and right in the drawing (i.e., signal values at collapsing edge portions) at the i-th period (second period in FIG. 8) in the distribution of the integrated signal $\Sigma V$ are defined as $V_{iL}$ and $V_{iR}$ (n=1, 2, 3, ...), respectively. Also, in the whole area of the integrated signal $\Sigma V$ excluding the both ends thereof extending over all the periods, the maximum value and minimum value are defined as $V_{max}$ and $V_{min}$, respectively.

Then, the asymmetry index $\beta$ of the phase pattern image is determined, as previously mentioned, by the following expression:

wherein:

$$\beta = (1/n) \sum_{i=1}^{n} \{(V_{iL} - V_{iR})/(V_{max} - V_{min})\}$$

n: number of periodicity and $\Sigma$: sum mark of i=1 to n.

Though the index $\beta$ is standardized (i.e., made dimensionless) by $(V_{max}-V_{min})$, it is not always necessary to standardize it. The foregoing processing is effected in an inspection unit within the main control system 100 provided with the signal processing portion 152 and calculator 153.

Figure 21:
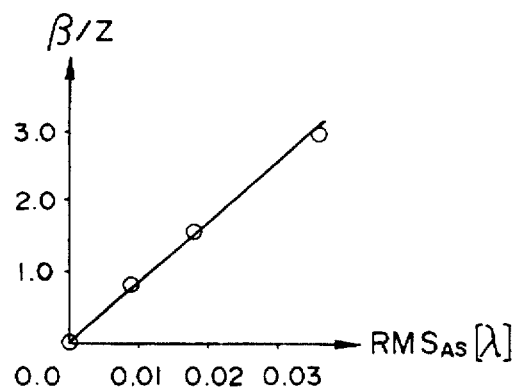
FIGS. 21 to 23 are charts showing, in the third embodiment of the present invention shown in FIG. 19, for individual defocus conditions, relationships between the positional change of an image of a wafer mark WM (i.e., phase pattern) formed by way of an image-forming optical system and the aberrations generated in the image-forming optical system.
Figure 22:
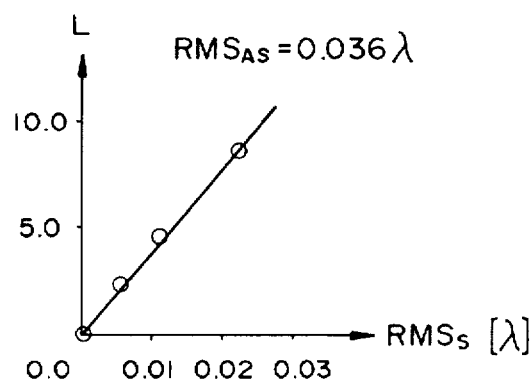
Figure 23:
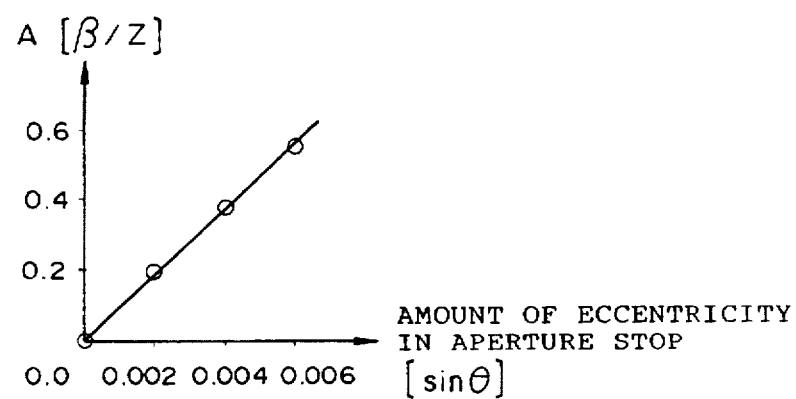

FIGS. 21 to 23 are charts showing results of simulation concerning relationships between the change in asymmetry index $\beta$ of the wafer mark image (i.e., phase pattern image) formed by way of the image-forming optical system and the aberration in the image-forming optical system under individual defocus conditions in the third embodiment.

In this simulation, the wafer mark is a phase pattern whose line width and interval are 0.6 µm each on the wafer and whose level difference is 85 nm. Also, numerical aperture NA of the image-forming optical system is 0.2, while wavelength $\lambda$ of the illumination light, i.e., alignment light, is 656 nm. The value of illumination $\sigma$, which depends on the aperture size of the image-forming optical system and that of the illumination optical system, is 0.8.

FIG. 21 is a chart showing the results of simulation when only asymmetric aberration is applied to the image-forming optical system. Its vertical axis indicates amount of gradient β/Z, i.e., the asymmetry index β with respect to the amount of defocus Z (cf. gradient β/Z of line L6 shown in FIG. 9), whereas its horizontal axis indicates the amount of asymmetric aberration ($RMS_{AS}[\lambda]$).

As shown in FIG. 21, a linear relationship is established well between the amount of gradient β/Z and the amount of asymmetric aberration in the image-forming optical system.

FIG. 22 is a chart showing the results of simulation when symmetric aberration is applied as symmetric aberration, in addition to asymmetric aberration of $RMS_{AS}$32 0.036λ, to the image-forming optical system.

Its vertical axis indicates the amount of parallel movement L (cf. amount of parallel movement L of line L in FIG. 9) which is the difference of the asymmetry index β from the best focus position (Z=0), whereas its horizontal axis indicates the amount of symmetric aberration ($RMS_S[\lambda]$). Here, the best focus position (Z=0) is determined from the position where the light intensity of the image of a 1-µm bright and dark pattern is maximized.

As shown in FIG. 22, a linear relationship is established well between the amount of parallel movement L and the amount of symmetric aberration in the image-forming optical system.

FIG. 23 is a chart showing the results of simulation where eclipse is applied to the alignment system. Its horizontal axis indicates the amount of eccentricity (sin θ) of the image-forming aperture stop (121), whereas its vertical axis indicates the bending amount A (β/Z) of the asymmetry index β with respect to the amount of defocus Z (cf. the bending amount A of bent line L8 with respect to line L5 in FIG. 10).

As shown in FIG. 23, a linear relationship is established well between the bending amount A (β/Z) and the amount of eclipse.

In this manner, in the third embodiment of the inspection apparatus in accordance with the present invention, based on the change in asymmetry of the phase pattern image under individual defocus conditions, the amount of asymmetric aberration, amount of symmetric aberration, and amount of eclipse in the image-forming optical system of the alignment system can be detected simultaneously with a favorable reproducibility.

Also, based on the difference in asymmetry of the pattern images with respect to a plurality of phase patterns having forms different from each other, the aberration condition of the image-forming optical system and the optical adjustment condition of the alignment system can be inspected.

When the level difference of the inspection phase pattern is π(2n+1)/4 (n=0, 1, 2, . . . ) at the center wavelength of the illumination light, i.e., alignment light, the asymmetry index β of the phase pattern becomes the most sensitive.

Also, the sensitivity of the asymmetry index β of the phase pattern image depends on the illumination σ and the pitch, duty cycle, taper, and level difference of the pattern. Accordingly, it is preferable for these parameters to be appropriately selected so as to control the inspection sensitivity such that inspection can be optimally performed under a practical condition (by a sensitivity control mechanism).

In the foregoing third embodiment, the left and right minimum levels of the signal are used in order to quantify the asymmetry index β of the phase pattern image. However, the width between the left and right collapsing edge portions in a single period of the signal may be used to quantify the asymmetry index β of the phase pattern image. This technique is disclosed in detail in Japanese Patent Application Hei No. 7-20325.

In the alignment optical system of FIG. 19, the illumination aperture stop 114 and image-forming aperture stop 121, which constitute the optical adjustment mechanism in this embodiment, influence both the optical adjustment condition shown in FIG. 1 and eclipse according to their individual positions. Accordingly, the optical adjustment condition and the eclipse are adjusted while moving both of the illumination aperture stop 114 and image-forming aperture stop 121.

Here, the telecentric index measured by the first and second embodiments of the inspection method and apparatus in accordance with the present invention actually depends on the remaining amount of eclipse as well. On the other hand, the amount of eclipse measured by the third embodiments of the inspection method and apparatus in accordance with the present invention does not depend on the telecentric index. Accordingly, it is preferable for the adjustment to be effected on the basis of measurement information concerning both of the telecentric index measured by the first or second embodiment and the amount of eclipse measured by the third embodiment.

First, based on the information concerning the foregoing aberration condition and optical adjustment condition, in order to adjust the position thereof, the illumination aperture stop 114 is appropriately driven by way of the driving system 115. Also, in cases where the exit end of the waveguide 102 also functions as the illumination aperture stop, the waveguide 102 is appropriately driven. Further, in order to effect adjustment, system for moving a luminous flux in parallel such as a plane parallel plate may be disposed in an optical path between the waveguide 102 and the condenser lens 116 or in an optical path between the illumination relay lens 103 and the half prism 104.

Also, in order to adjust the position of the image-forming aperture stop 121, it is appropriately driven by way of the driving system 122. Further, in order to effect adjustment, system for moving a luminous flux in parallel such as a plane parallel plate may be disposed in an optical path between the half prism 104 and the second objective lens 107 or at a position nearer to the wafer than is the image-forming aperture stop 121 in an optical path between the relay lens 109 and the relay lens 110.

As can be seen from the foregoing explanation of the optical adjustment operations, the optical adjustment mechanism in this third embodiment includes at least the controller 150 within the main control system 100, the driving systems 115, 118, 119, 120, and 122, and the like.

Further, in order to correct the symmetric aberration of the image-forming optical system, a part of the second objective lens 107 and the relay lens 109 is appropriately driven along the optical axis. Also, in order to correct the asymmetric aberration of the image-forming optical system, all or a part of the lens system comprising the second objective lens 107 and relay lens 109 may be eccentrically driven in perpendicular to the optical axis. In addition to the second objective lens 107 and the relay lens 109, among the lens components in the image-forming optical system, lenses which are sensitive to the symmetric or asymmetric aberration such as the first objective lens 105 and the relay lens 110, as a whole lens system or as a part thereof, may be driven along the optical axis or eccentrically driven with respect to the optical axis.

As can be seen from the foregoing explanation of the aberration adjustment operations, the aberration adjustment mechanism in this third embodiment includes at least the controller 150 within the main control system 100, the driving systems 119 and 120, and the like.

This embodiment is also applicable to an overlay accuracy measurement apparatus in which the positional deviation between the main scale by the first exposure and the vernier by the second exposure is measured in order to determine the accuracy in overlay exposure process. In this case, in the first to third embodiments of the inspection method in accordance with the present invention, the positions of the main scale and vernier or the difference in the amount of change in asymmetry with respect to focus may be measured as two different patterns so as to inspect the aberration condition and optical adjustment condition of the optical system and further to optimize these conditions. By using a difference between measurement lines of images of patterns having forms different from each other, the aberration condition of an optical system containing higher-order aberrations as well as lower-order aberrations can be inspected with high accuracy.

Also, in each embodiment of the inspection method and apparatus in accordance with the present invention, the position of the pattern image, the position of the converging luminous flux, or the asymmetry of the phase pattern may be detected by an image-pickup method as well as by a scan technique.

Further, these embodiments do not depend on types of illumination techniques such as transmitting illumination and drop illumination (i.e., reflecting illumination).

Also, the inspection apparatus in accordance with the present invention is applicable to an overlay accuracy measurement apparatus which is disposed inside or outside a projection exposure apparatus and other general apparatuses having an optical system to be inspected.

As explained in the foregoing, in the inspection method and apparatus for an optical system in accordance with the present invention, the position of the pattern image, the position of the converging luminous flux, or the asymmetry of the phase pattern image are measured under defocus conditions, thereby enabling the aberration condition and optical adjustment condition of the optical system to be inspected under a practical condition with a desirable sensitivity and a favorable reproducibility.

Also, in accordance with the present invention, the correction of aberration and optical adjustment of the optical system to be inspected can be performed efficiently and correctly according to the aberration condition and optical adjustment condition of the optical system inspected.

In the following, embodiments of the optical system in accordance with the present invention will be explained with reference to FIGS. 24 to 55. This optical system has a configuration for compensating for the aberration generated thereby. The embodiments explained in the following refer to cases where the optical system in accordance with the present invention is applied to an image-forming optical system of an alignment optical system of an alignment apparatus (i.e., positioning apparatus) of both off-axis type and image-pickup type provided with a projection exposure apparatus.

Figure 24:
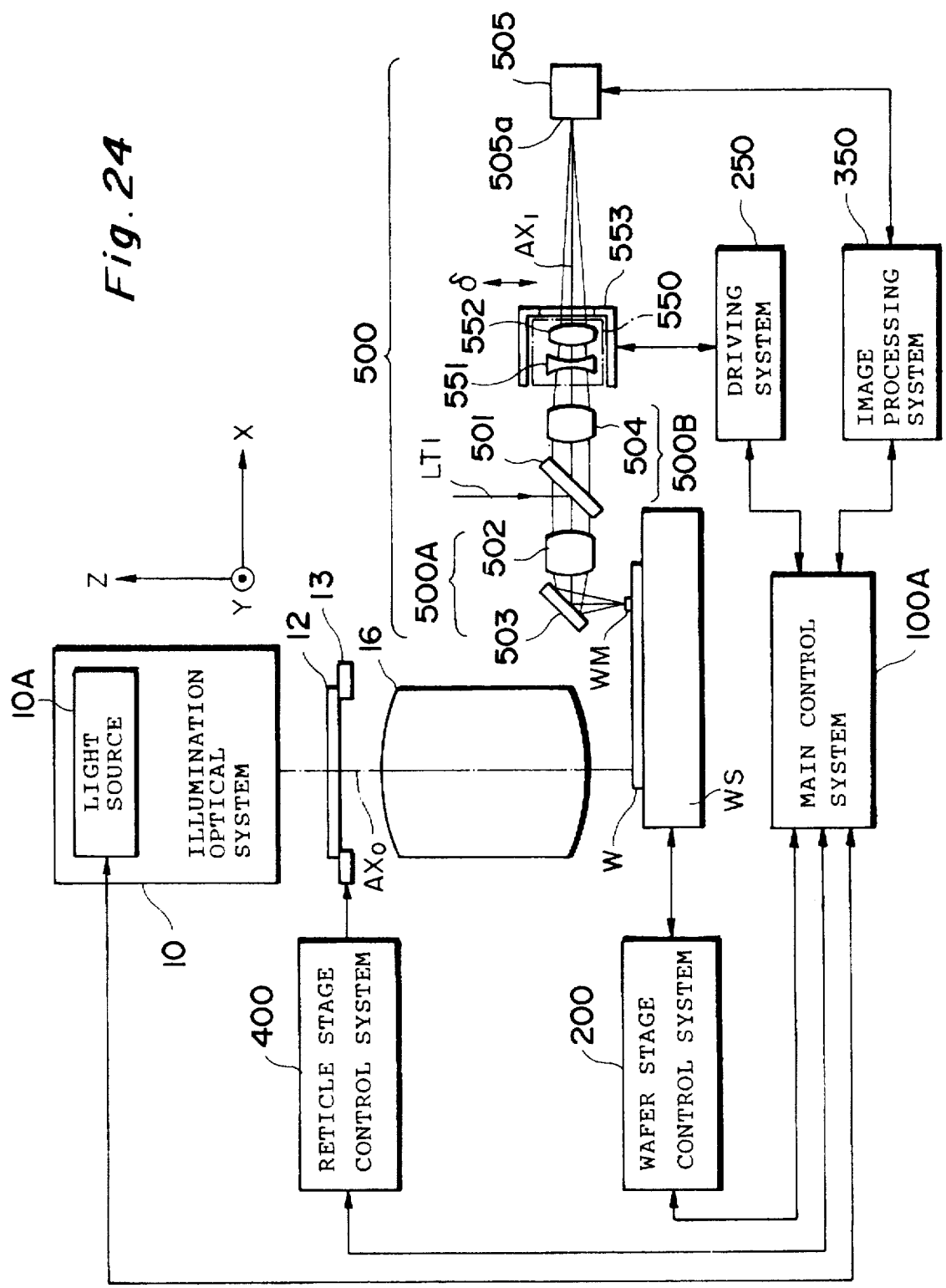
FIG. 24 is a view showing a schematic configuration of a projection exposure apparatus provided with the first embodiment of the alignment apparatus in accordance with the present invention, including the first embodiment of the decentering mechanism.

FIG. 24 is a view showing a schematic configuration of a projection exposure apparatus having an alignment apparatus to which the first embodiment of the optical system in accordance with the present invention is applied. In this drawing, under exposure light from a light source 10A within an illumination optical system 10, an image of a pattern on a reticle 12 is projected, by way of a projection optical system 16, upon each shot area on a wafer W coated with a photoresist. Here, Z-axis is taken in parallel to an optical axis $AX_0$) of the projection optical system 16, X-axis is taken in parallel to the paper surface of FIG. 24 within a plane perpendicular to the Z-axis, and Y-axis is taken in perpendicular to the paper surface of FIG. 24.

Here, the reticle 12 is held by a reticle stage 13 which is driven in the X- and Y-directions by a reticle stage control system 400 according to the instructions from a main control system 100A. The cross-sectional configuration of the wafer W coincides with that shown in FIG. 20.

The wafer W is held on a wafer stage WS which is constituted by a Z stage for positioning the wafer W in the Z-direction, an XY stage for moving the wafer W within the XY-plane, and the like. The wafer stage WS is driven by a wafer stage control system 200 according to instructions from the main control system 100A. After a certain shot area on the wafer W is exposed to the pattern image of the reticle 12, the next shot area is set at the exposure position by a stepping operation of the wafer stage WS. Subsequently, by a step and repeat technique, a plurality of shot areas on the wafer w are exposed to the light. In order to correctly position the individual shot area here, it is necessary to measure the position of the individual shot area on the wafer, i.e., the position of the alignment mark (i.e., wafer mark WM) attached to the individual shot area, and, based on the results of this measurement, to determine the stepping amount of the wafer stage ws. In the following explanation, the position of a predetermined wafer mark WM attached to a predetermined shot area is assumed to be determined.

In the embodiment shown in FIG. 24, an off-axis type alignment optical system 500 is disposed beside the projection optical system 16. In this alignment optical system 500, illumination light LT1, which is emitted from a non-depicted lamp light source such as a halogen lamp and has a wide band and to which the photoresist shows a low photosensitivity, impinges on a half mirror 501. The illumination light LT1 reflected by the half mirror passes through a first objective lens 502 (i.e., objective optical system 500A) and a mirror 503 to downward illuminate the wafer mark WM on the wafer W. The light reflected by the wafer mark WM is reflected by the mirror 503 and then converged by the first objective lens 502 so as to return to the half mirror 501. Then, the reflected light passing through the half mirror 501 successively passes through a second objective lens 504 (i.e., condenser optical system 500B) and a substantially same-magnification Galilean afocal optical system 550 (i.e., correction optical system) so as to form an enlarged image of the wafer mark WM on an image-pickup surface 505a of an image-pickup device 505 composed of a two-dimensional CCD.

The afocal optical system 550 comprises, in the following order from the side of the second objective lens 504, a lens group 551 having a negative refractive power and a lens group 552 having a positive refractive power. This afocal optical system 550 is unitedly held by a holder 553 and configured such that it can be shifted in an arbitrary direction perpendicular to an optical axis AX, of this image-forming optical system by a predetermined amount within a predetermined range. When an image-pickup signal from the image-pickup device 505 is subjected to image processing by an image processing system 350, the position of the wafer mark WM is detected. Based on the results of detection, the main control system 100A positions (i.e., aligns) the corresponding shot area of the wafer W with respect to the exposure apparatus.

Figure 25:
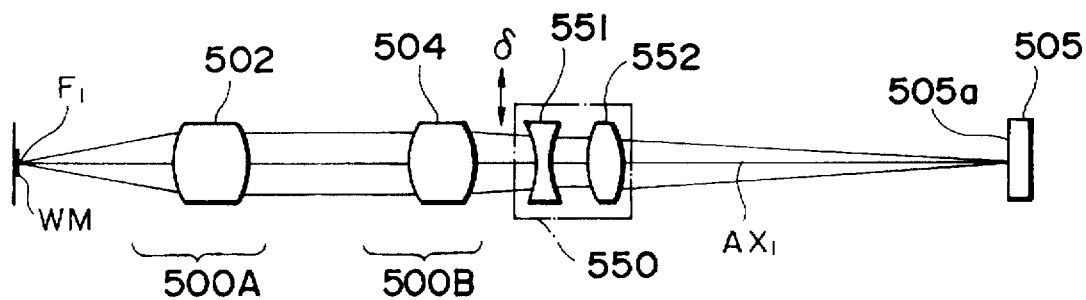
FIGS. 25 to 27 are views showing configurations of alignment optical systems (i.e., image-forming optical systems) applicable to the alignment apparatus shown in FIG. 24, specifically, FIG. 25 showing an image-forming relationship of the alignment optical system (i.e., image-forming optical system) shown in FIG. 24, FIG. 26 showing a conjugate relationship of the pupils of the optical system shown in FIG. 25, and FIG. 27 showing an image-forming relationship of the optical system of a modified example for the optical system shown in FIG. 25.
Figure 26:
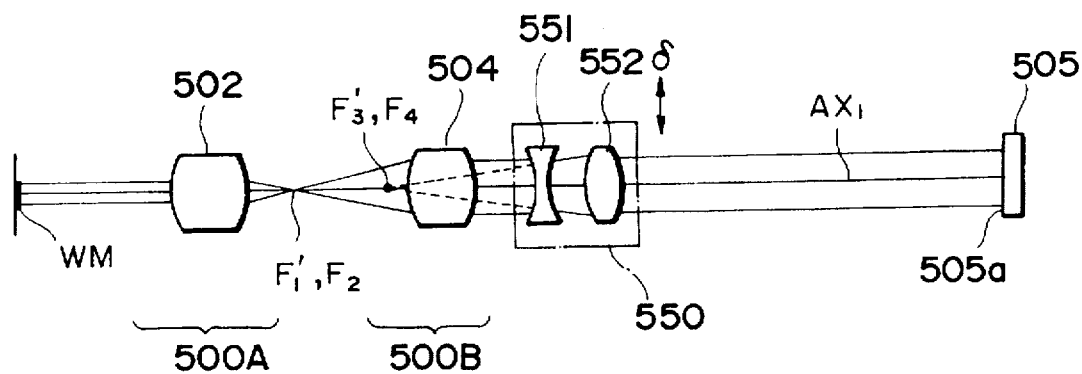

FIGS. 25 and 26 are enlarged views showing an image-forming optical system in the alignment optical system 500 shown in FIG. 24. In FIGS. 25 and 26, the half mirror 501 and the mirror 503 are not depicted. First, in FIG. 25 which shows the conjugate relationship between the object surface and the image surface, under a focus-matching condition, the wafer mark WM is positioned on a plane which passes through an object-side focal point $F_1$, of the first objective lens 502 and is perpendicular to an optical axis $AX_1$. The light from the wafer mark WM passes through the first objective lens 502 and enters, as a substantially parallel luminous flux, the second objective lens 504. The luminous flux from the second objective lens 504 forms, by way of the afocal optical system 550, an image of the wafer mark WM on the image-pickup surface 505a (i.e. detection surface) of the image-pickup device 505.

Also, in FIG. 26 which shows the conjugate relationship between pupils, an image-side focal point $F_1'$ of the first objective lens 502 and an object-side focal point $F_2$ of the second objective lens 504 substantially coincide with each other. The principal ray which is emitted from the wafer mark WM and is parallel to the optical axis $AX_1$, also becomes substantially parallel to the optical axis $AX_1$ when emitted from the second objective lens 504. It is particularly desirable for the optical system in this embodiment to be configured such that the space between the second objective lens 504 and the afocal optical system 550 is telecentric. In the afocal optical system 550 subsequent to the second objective lens 504, an image-side focal point $F_3'$ of the lens group 551 and an object-side focal point $F_4$ of the lens group 552 substantially coincide with each other, thereby forming a substantially same-magnification Galilean afocal optical system. Accordingly, the principal ray which is emitted from the second objective lens 501 and is parallel to the optical axis $AX_1$, also becomes substantially parallel to the optical axis $AX_1$ when emitted from the afocal optical system 550. Therefore, the image-forming optical system in this embodiment from the first objective lens 502 to the afocal optical system 550, as a whole, is substantially a both-side telecentric system. Also, the focal length of the second objective lens 504 is set longer than that of the first objective lens 502. As a result, the magnification from the surface where the wafer mark WM is formed to the image-pickup surface 505a of the image-pickup device 505 is an enlarged magnification.

In these optical systems, the aberration of the first objective lens 502 is corrected so as to substantially approximate an ideal lens. On the other hand, an appropriate amount of asymmetric aberration generated at the second objective lens 504 and that generated at the afocal optical system 550 are corrected so as to substantially cancel each other on the image-pickup surface 505a. While this may cause the second objective lens 504 to secondarily generate symmetric aberration, the aberration in this case can be corrected such that the symmetric aberration generated at the second objective lens 504 and that generated at the afocal optical system 550 substantially cancel each other on the image-pickup surface 505a.

Also, the asymmetric aberration and symmetric aberration generated at the above-mentioned second objective lens 504 and afocal optical system 550 (i.e., correction optical system) are substantially at the level of the tertiary aberration. Other kinds of aberration hardly occur in any lens system and, if any, are sufficiently corrected. In these optical systems, since the refractive power and numeric aperture (NA) of the second objective lens 504 are sufficiently smaller than those of the first objective lens 502 by the amount corresponding to the enlarged magnification, it is easy for the aberration to be manipulated so as to offset the asymmetric aberration in the second objective lens 504 and afocal optical system 550 against each other in the above-mentioned manner. In the image-forming optical system configured with such a relationship of aberrations, the image of the wafer mark WM projected upon the image-pickup surface 505a of the image-pickup device 505 can be regarded as a substantially ideally formed image.

Next, when there occurs asymmetric aberration on the image-pickup surface 505a due to errors in manufacture of the first objective lens 502 and the like in the alignment optical system to which the first embodiment of the optical system in accordance with the present invention is applied, the afocal optical system 550 (i.e., correction optical system) may be shifted in an appropriate direction among directions perpendicular to the optical axis $AX_1$ by an appropriate amount so as to generate eccentric asymmetrical aberration with desired amount and direction on the image-pickup surface 505a. Thus, when, among two kinds of asymmetric aberration occurring due to errors in manufacture and the like, asymmetric aberration symmetrical to the ideal optical axis occurs, such asymmetric aberration can be cancelled by the asymmetric aberration generated by shifting the afocal optical system 550 within the range where the asymmetric aberration on the image-pickup surface 505a is problematic in particular. Also, when there is an eccentric asymmetrical aberration, the eccentric asymmetrical aberration in the whole image-pickup surface can be cancelled by the asymmetric aberration generated by shifting the afocal optical system 550. Other kinds of aberrations hardly occur in this range where the asymmetric aberration is cancelled, thereby making the image of the wafer mark WM approximate an ideally formed image.

Figure 28:
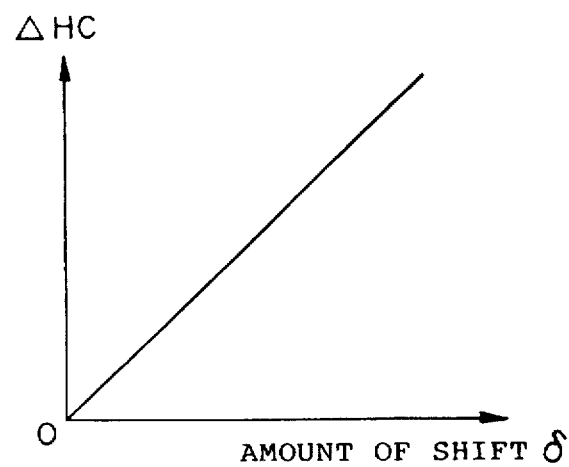
FIGS. 28 and 29 are charts showing optical characteristics of the afocal optical system in the first embodiment (FIG. 24) and fourth embodiment (FIG. 44) of the alignment apparatus in accordance with the present invention, specifically, FIG. 28 showing a relationship between amount of shift δ and eccentric asymmetrical aberration ΔHC in the afocal optical system and FIG. 29 showing a relationship between ratio ΔHC/δ of eccentric asymmetric aberration AHC to amount of asymmetric aberration ΔC in the afocal optical system.

FIG. 28 shows amount of eccentric asymmetrical aberration AHC generated with respect to amount of shift δ in the afocal optical system 550 in this embodiment. As shown in this chart, the amount of eccentric asymmetrical aberration ΔHC is proportional to the amount of shift δ, while its gradient is proportional to the amount of asymmetric aberration which is offset by the second objective lens 504 and the afocal optical system 550 against each other. Accordingly, when the amount of asymmetric aberration which is offset by the second objective lens 504 and the afocal optical system 550 against each other is appropriately set and the afocal optical system 550, which can be easily adjusted, is shifted by an appropriate amount, a desirable eccentric asymmetrical aberration is generated. Assuming that the amount of offset asymmetric aberration is ΔC and the constant of proportionality is $k_1$, the amount of eccentric aberration ΔHC generated with respect to the amount of shift δ in the afocal optical system 550 is expressed as follows:

$$\Delta HC = k_1 \cdot \Delta C \cdot \delta \quad (1)$$

Equation (1) can be modified as:

$$\Delta HC/\delta = k_1 \cdot \Delta C$$

Figure 29:
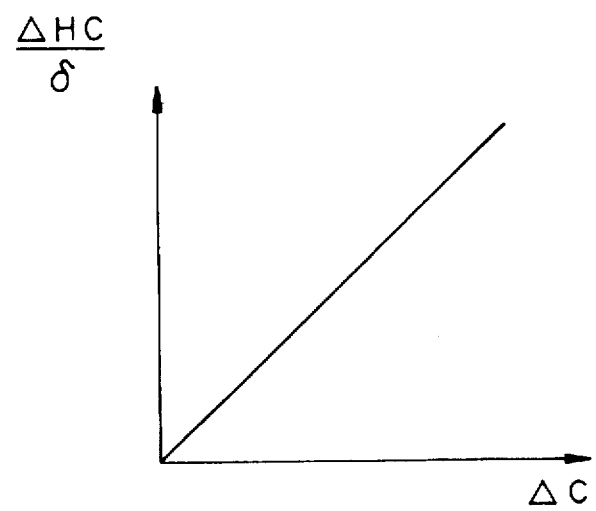

This relationship is shown in FIG. 29.

In the above-mentioned embodiment, the Galilean afocal optical system 550, which is a correction optical system, is a same-magnification system. The same-magnification system is advantageous, for example, in that, when the afocal optical system 550 is shifted, the optical axis AX, hardly deviates (i.e., tilts or shifts) thereafter.

Though the afocal optical system 550 is shifted in a perpendicular direction from the optical axis $AX_1$ in the above-mentioned embodiment, the second objective lens 504 may be shifted in a perpendicular direction from the optical axis $AX_1$ in FIG. 25 as long as the deviation (i.e., tilt or shift) of the optical axis on the image-pickup surface 505a is not problematic. Also, while the afocal optical system 550 is formed as a substantially same-magnification Galilean system in this embodiment, it may be of any type as long as it is substantially a same-magnification and erect system.

Though the object-side space of the first objective lens 502 is telecentric in the optical system shown in FIG. 26, it is not always necessary for the object-side to be telecentric in particular. When the image-side of the first objective lens 502 is telecentric, by contrast, as in the case of the optical system shown in FIG. 25, the position of the second objective lens 504 and that of the afocal optical system 550 may be exchanged for each other so as to attain a similar aberration offset relationship, thereby yielding a similar performance.

Also, when the deviation (i.e., tilt or shift) of the optical axis is not problematic, the afocal optical system 550 may not be a same-magnification erect system. In addition, this correction optical system may be a lens having a predetermined refractive power. In this case, the condenser optical system 500B is constituted by two lens groups.

Figure 27:
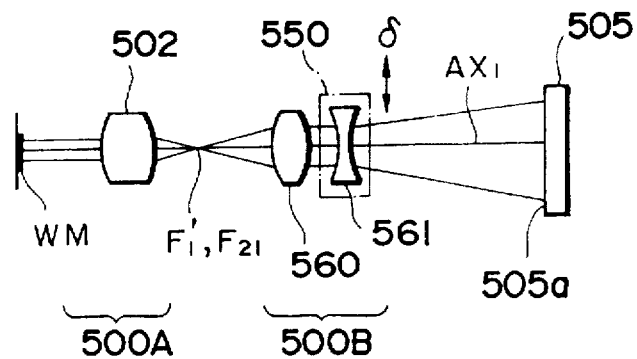

FIG. 27 shows a modified example thereof in which a lens having a refractive power is used. In FIG. 27, light from a wafer mark WM forms an image of the wafer mark WM on an image-pickup surface 505a of an image-pickup device 505 by way of a first objective lens 502 and a second objective lens system (i.e., condenser optical system 500B). The second objective lens system comprises, in the following order from the side of the first objective lens 502, a first lens group 560 having a positive refractive power and a second lens group 561 having a negative refractive power.

In this modified example, an image-side focal point $F_1'$ of the first objective lens 502 and an object-side focal point $F_{21}$ of the first lens group 560 within the second objective lens group coincide with each other, thereby rendering a both-side telecentric relationship to a combination system composed of the first objective lens 502 and the first lens group 560. Also, in the first lens group 560 and the second lens group 561, asymmetric aberrations substantially cancelling each other are generated while chromatic aberration is corrected within a wide wavelength band. Further, the second lens group 561 is configured such that it can be shifted in an arbitrary direction perpendicular to the optical axis $AX_1$ of the whole system. Then, when there remains asymmetric aberration due to errors in manufacture and the like, the second lens group 561 is shifted so as to generate a desired eccentric asymmetrical aberration, thereby enabling the remaining asymmetric aberration to be cancelled.

Though the second lens group 561 is shifted in a perpendicular direction from the optical axis $AX_1$ in this modified example, the first lens group 560 may be shifted in a perpendicular direction from the optical axis $AX_1$ in FIG. 27.

In the following, explanation will be provided for the configuration of a decentering mechanism which shifts the afocal optical system 550, which functions as the correction optical system, in a direction perpendicular to the optical axis $AX_1$ by a predetermined amount $\delta$ in the above-explained first embodiment of the optical system in accordance with the present invention.

The first configuration of the decentering mechanism comprises the image processing system 350 for detecting the position of the image of the wafer mark WM formed on the image-pickup surface 505a of the image-pickup device 505 on the basis of the signal from the image-pickup device 505; the main control system 100A having a function for specifically calculating, based on the above-mentioned relationship between the amount of shift $\delta$ and the amount of aberration, an amount of shift by which the afocal optical system 550 is made eccentric; and the driving system 250 for shifting the holder 553, which unitedly holds the afocal optical system 550, with respect to the optical axis $AX_1$ of the image-forming optical system according to the instruction from the main control system 100.

Figure 30:
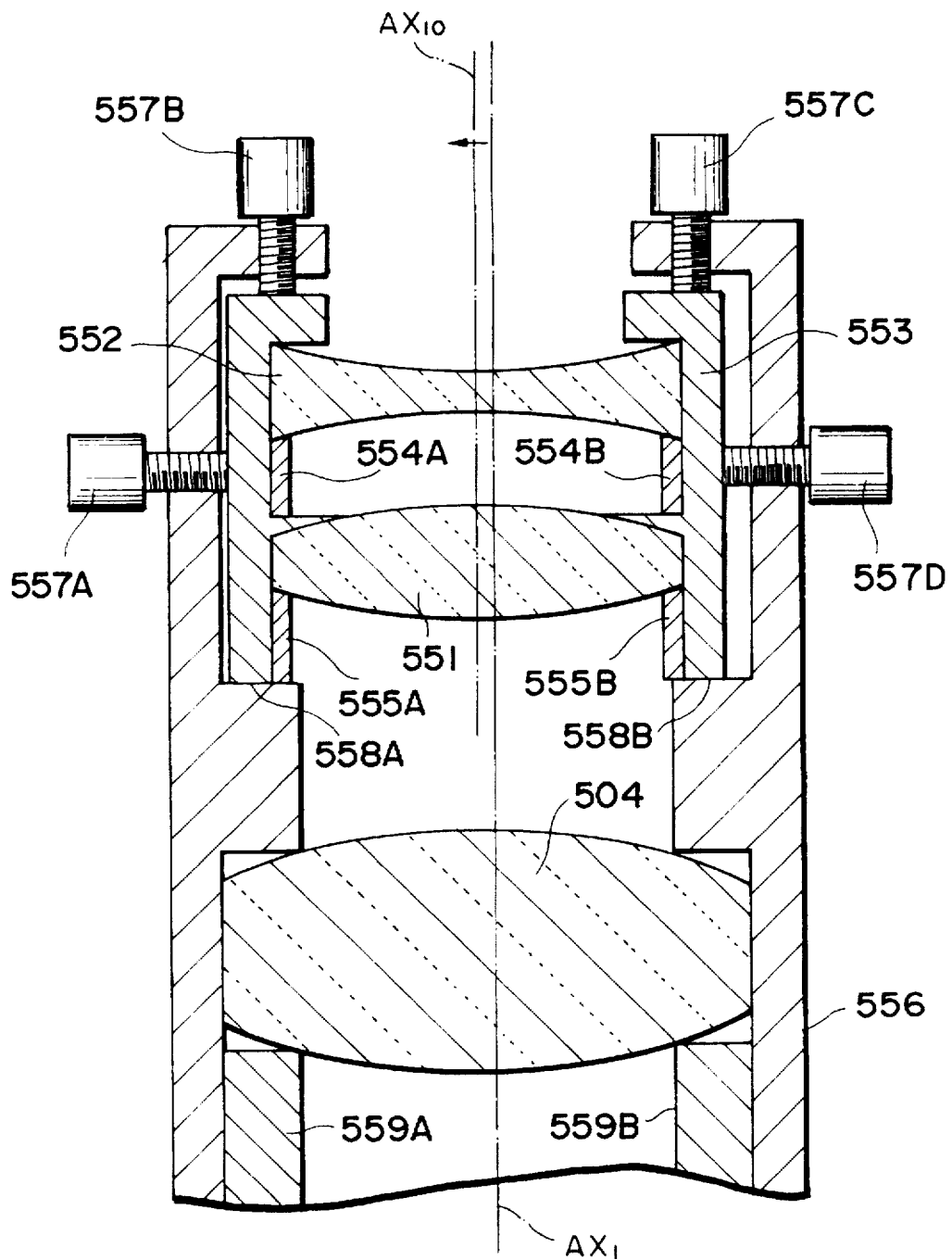
FIG. 30 is a view showing the second embodiment of the decentering mechanism in the alignment apparatus in accordance with the present invention.

On the other hand, the second configuration of the decentering mechanism is shown in FIG. 30. For example, when asymmetric aberration occurs due to errors in manufacture and the like, it is preferable for the afocal optical system 550, which is the correction optical system, to be made eccentric by a predetermined amount so as to fix the positional relationship between the eccentric afocal optical system and the second objective lens 504 (i.e., condenser optical system) beforehand. Specifically, as shown in FIG. 30, the second objective lens 504 is fixed to an external holder 556. This external holder 556 is provided with a cavity for accommodating an inner holder 553 in which lens groups 551 and 552 constituting the afocal optical system 550 are unitedly held. There is a gap between the inner wall of this cavity and the inner holder 553 so that the inner holder 553 can change its position within the cavity. The position of the inner holder within the cavity is determined by adjustment screws 557A and 557D which define its position in a direction perpendicular to the optical axis $AX_1$ of the image-forming optical system as well as by reference surfaces 558A and 558B and adjustment screws 557B and 557C which define its position in a direction along the optical axis $AX_1$. In this configuration, the inner holder 553 is movable along the reference surfaces 558A and 558B in a direction perpendicular to the optical axis $AX_1$. Here, $AX_{10}$ indicates the optical axis of the afocal optical system 550 which is made eccentric with respect to the optical axis $AX_1$ by a predetermined amount. Also, 554A, 554B, 555A, 555B, 559A, and 559B in this drawing indicate spacers.

Figure 31:
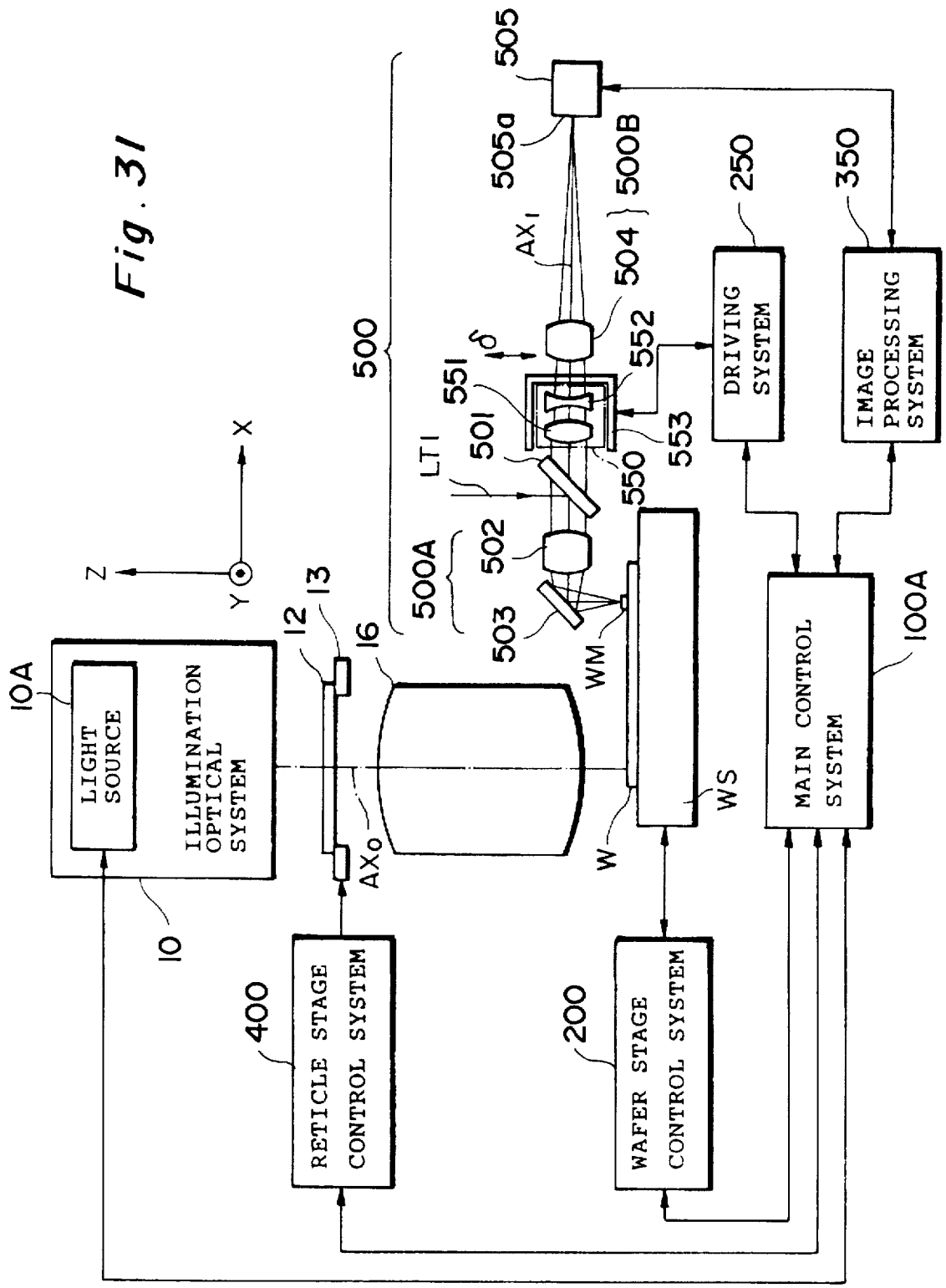
FIG. 31 is a view showing a schematic configuration of a projection exposure apparatus provided with the second embodiment of the alignment apparatus in accordance with the present invention.
Figure 32:
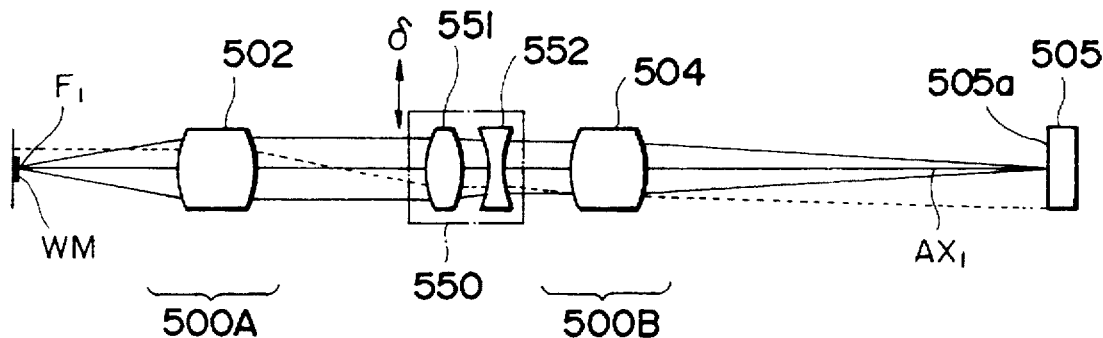
FIG. 32 is a chart showing an image-forming relationship of the alignment optical system (i.e., image-forming optical system) shown in FIG. 31.

In the following, the second embodiment of the optical system in accordance with the present invention will be explained. It corresponds to an embodiment in which the orders of the second objective lens 504 and afocal optical system 550 in the first embodiment are exchanged and the space between second objective lens 504 and the afocal optical system 550 is non-telecentric. In FIGS. 31 and 32, the parts corresponding to those of FIG. 24 are referred to by the same marks without repeating their explanations in detail.

FIG. 31 shows a schematic configuration of a projection exposure apparatus provided with an alignment apparatus to which the second embodiment of the optical system in accordance with the present invention is applied. In this drawing, illumination light LT1 having a wide band guided by a half mirror 501 downward illuminates a wafer mark WM on a wafer W by way of a first objective lens 502 (i.e., objective lens system 500A) and a mirror 503. The reflected light from the wafer mark WM is converged by way of the mirror 503 and the first objective lens 502 and returns to the half mirror 501. The luminous flux passing through the half mirror 501 forms an enlarged image of the wafer mark WM on an image-pickup surface 505a of an image-pickup device 505, which is used as a detector, by way of a substantially same-magnification Galilean afocal optical system 550 (i.e., correction optical system) and a second objective lens 504 (i.e., condenser optical system 500B). The afocal optical system 550 comprises, in the following order from the side of the first objective lens 502, a lens group 551 having a positive refractive power and a lens group 552 having a negative refractive power. The afocal optical system 550 is unitedly held by a holder 553 such that it can be shifted in an arbitrary direction perpendicular to the optical axis $AX_1$ of the image-forming optical axis by an arbitrary amount within a predetermined range. Except for the afocal optical system 550, the configuration of this embodiment is similar to that of the first embodiment.

FIG. 32 shows the image-forming optical system of the alignment optical system shown in FIG. 31. Under a focus-matching condition, the wafer mark WM is positioned on a plane which passes through an object-side focal point $F_1$ of the first objective lens 502 and is perpendicular to the optical axis $AX_1$. The light from the wafer mark WM is output from the first objective lens 502 and then enters the afocal optical system 550 as a substantially parallel luminous flux. Thereafter, the luminous flux output from the afocal optical system 550 enters the second objective lens 504 next thereto so as to form an image of the wafer mark WM on the image-pickup surface 505a of the image-pickup device 505.

Also, the principal ray (indicated by broken line) which is emitted by the wafer mark WM and in parallel to the optical axis $AX_1$ becomes non-parallel to the optical axis $AX_1$ after being output from the first objective lens 502 and enters the afocal optical system 550 and then the second objective lens 504. It is particularly desirable for the optical system in this embodiment to be configured such that the space between the afocal optical system 550 and the second objective lens 504 is non-telecentric. Also, the focal length of the second objective 504 is made longer than that of the first objective lens 502 so that the magnification between the surface where the wafer mark is formed to the image-pickup surface 505a is an enlarged magnification.

Further, the aberration of the first objective lens 502 is corrected so as to substantially approximate an ideal lens. On the other hand, an appropriate amount of symmetric aberration generated at the second objective lens 504 and that generated at the afocal optical system 550 are corrected so as to substantially cancel each other on the image-pickup surface 505a. Here, the symmetric aberrations generated at the above-mentioned second objective lens 504 and afocal optical system 550 are substantially at the level of the tertiary aberration. Other kinds of aberration hardly occur in any lens system and, if any, are sufficiently corrected. Also, in the optical system shown in FIG. 32, since the refractive power and numeric aperture (NA) of the second objective lens 504 are sufficiently smaller than those of the first objective lens 502 by the amount corresponding to the magnification, it is easy for the aberration to be manipulated so as to offset the symmetric aberration in the second objective lens 504 and afocal optical system 550 against each other in the above-mentioned manner. In the image-forming optical system configured with such a relationship of aberrations, the image of the wafer mark WM projected upon the image-pickup surface 505a of the image-pickup device 505 can be regarded as a substantially ideally formed image.

When asymmetric aberration is generated on the image-pickup surface 505a by the first objective lens 502 and the like due to errors in manufacture and the like, the afocal optical system 550 is shifted in a predetermined direction perpendicular to the optical axis $AX_1$ by an appropriate amount so as to form an eccentric asymmetrical aberration with desired amount and direction. Thus, when, among two kinds of asymmetric aberration occurring due to errors in manufacture and the like, asymmetric aberration symmetrical to the ideal optical axis occurs, such asymmetric aberration can be cancelled on the image-pickup surface 505a within the range in which asymmetric aberration is problematic in particular. Also, when there is an eccentric asymmetrical aberration, the eccentric asymmetrical aberration in the whole image-pickup surface can be cancelled. Though there occurs slight separation of a meridional image surface and a sagittal image surface from each other (without any tilting of the image surfaces) as another kind of aberration within the range where the asymmetric aberration is generated, other kinds of aberration hardly occur.

Figure 33:
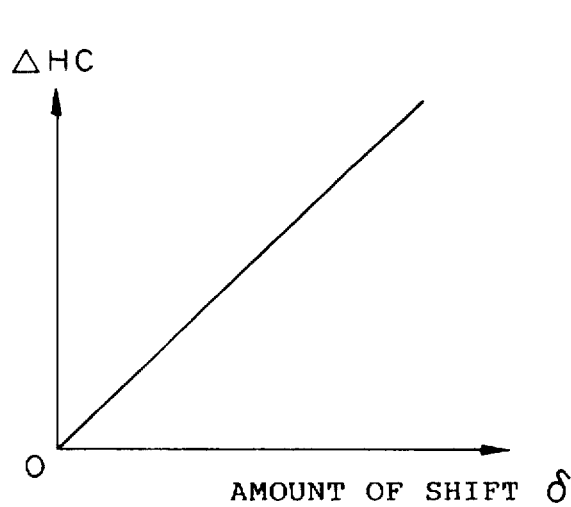
FIGS. 33 and 34 are charts showing optical characteristics of the afocal optical system in the second embodiment (FIG. 31) and fifth embodiment (FIG. 47) of the alignment apparatus in accordance with the present invention, specifically, FIG. 33 showing a relationship between amount of shift δ and eccentric asymmetrical aberration ΔHC in the afocal optical system and FIG. 34 showing a relationship between ratio ΔHC/δ of eccentric asymmetrical aberration ΔHC to amount of symmetric aberration ΔS in the afocal optical system.

FIG. 33 shows amount of eccentric asymmetrical aberration $\Delta HC$ generated with respect to amount of shift $\delta$ from the optical axis $AX_1$ of the afocal optical system 550 in FIG. 32. As shown in this chart, the amount of eccentric asymmetrical aberration $\Delta HC$ is proportional to the amount of shift $\delta$, while its gradient is proportional to the amount of symmetric aberration which is mutually offset. Accordingly, when the amount of symmetric aberration which is mutually offset is appropriately set and the afocal optical system 550, which can be easily adjusted, is shifted in an appropriate direction by an appropriate amount, a desirable eccentric asymmetrical aberration is generated with desired amount and direction. Assuming that the amount of offset symmetric aberration is $\Delta S$ and the constant of proportionality is $k_2$, the amount of eccentric aberration $\Delta HC$ generated with respect to the amount of shift $\delta$ in the afocal optical system 550 is expressed as follows:

$$\Delta HC = k_2 \cdot \Delta S \cdot \delta \qquad (2)$$

Equation (2) can be modified as:

$$\Delta HC/\delta = k_2 \cdot \Delta S$$

Figure 34:
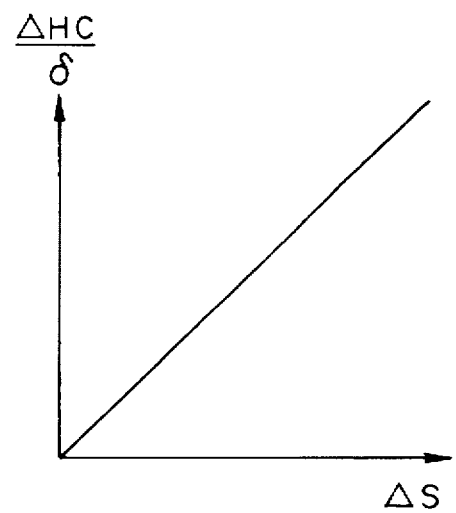

This relationship is shown in FIG. 34. Also, assuming that the amount of offset symmetric aberration is $\Delta S$, amount of shift of the afocal optical system 550 is $\delta$, and the constant of proportionality is $k_3$, the amount of generated image surface separation $\Delta\Delta S$ is expressed as follows:

$$\Delta\Delta S = k_3 \cdot \Delta S \cdot \delta^2 \qquad (3)$$

Namely, within the range where the amount of shift $\delta$ is small, the amount of image surface separation $\Delta\Delta S$ has a magnitude which can be neglected. Nevertheless, even when the amount of shift $\delta$ is so large that the amount of image surface separation $\Delta\Delta S$ cannot be neglected, there is no problem when its adjustment mechanism (e.g., that utilizing a cylindrical lens) is inherently provided within the optical system.

In the embodiments shown in FIGS. 31 and 32, the Galilean afocal optical system 550 is substantially a same-magnification system. It is advantageous, for example, in that, when the afocal optical system 550 is shifted so as to generate an eccentric asymmetrical aberration, the optical axis $AX_1$ hardly deviates thereafter.

The afocal optical system 550 is formed as a substantially same-magnification Galilean system in the embodiment shown in FIGS. 31 and 32. However, it may be of any type as long as it is substantially a same-magnification and erect system.

When the deviation (i.e., tilt or shift) of the optical axis at the image-pickup surface 505a is not problematic, the second objective lens 504, rather than the afocal optical system 550, may be shifted in a direction perpendicular to the optical axis $AX_1$ in the optical system shown in FIG. 32 to yield a similar effect. Also, the afocal optical system 550, which is a correction optical system, is disposed between the first objective lens 502 and the second objective lens 504 in the optical system shown in FIG. 32. However, the positions of the second objective lens 504 and the afocal optical system 550 may be exchanged to realize a similar optical system as long as the space between the second objective lens 504 and the afocal optical system 550 is non-telecentric.

Here, the configuration of the decentering mechanism for making the afocal optical system 550, which is the correction optical system, eccentric is similar to that of the first embodiment of the optical system in accordance with the present invention shown in FIGS. 24 and 30.

In the following, the third embodiment of the optical system in accordance with the present invention will be explained. This embodiment relates to a case where the optical system in accordance with the present invention is applied to an illumination optical system of an alignment apparatus which is of both off-axis type and so-called laser step alignment type provided with the projection exposure apparatus.

Figure 35:
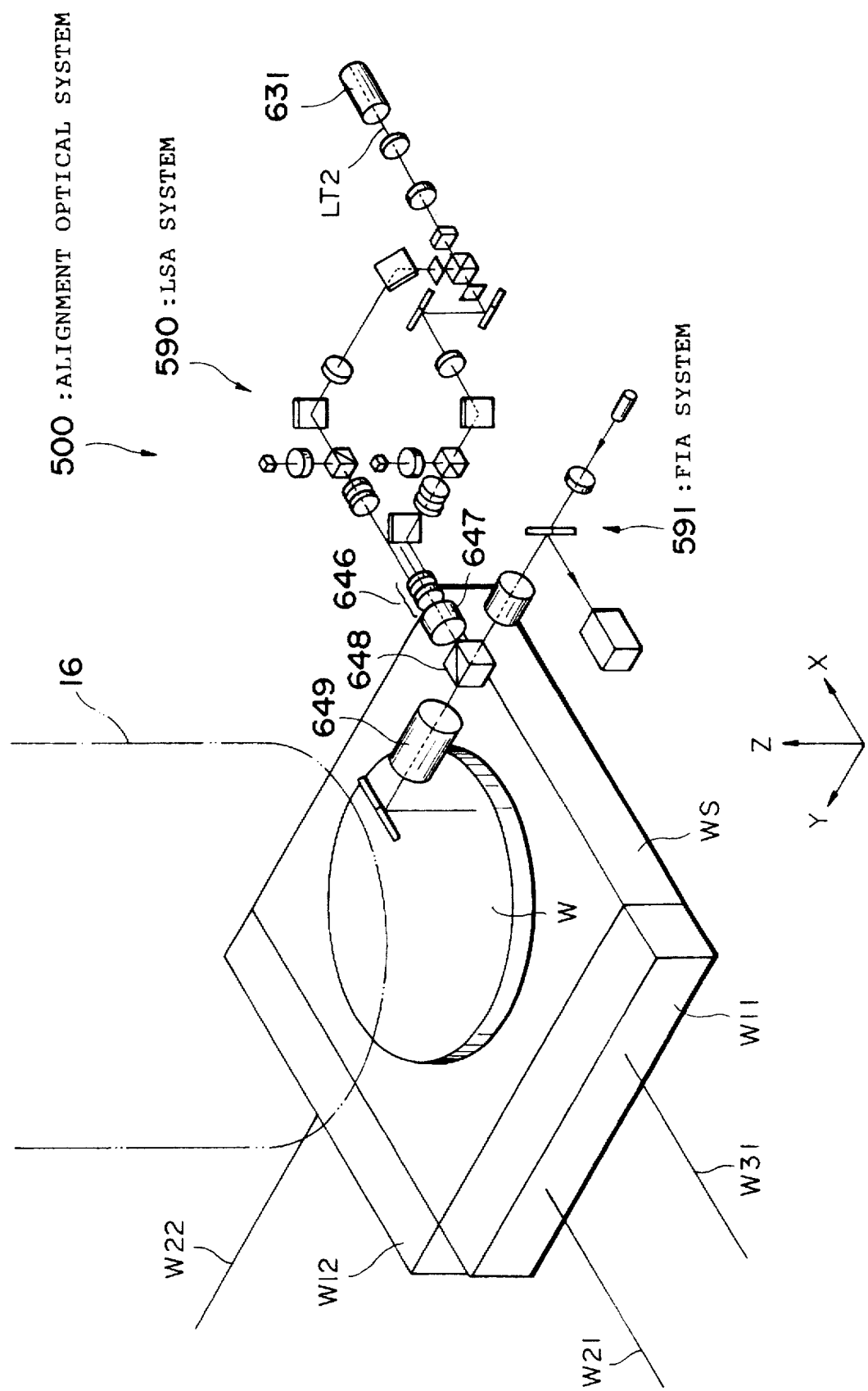
FIG. 35 is a perspective view showing a configuration of a main portion of the projection exposure apparatus provided with the third embodiment of the alignment apparatus in accordance with the present invention.

FIG. 35 is a perspective view of a main portion of the projection exposure apparatus provided with an alignment apparatus to which the third embodiment of the optical system in accordance with the present invention is applied. In this drawing, an image of a pattern of a reticle, which is not depicted, is projected upon each shot area in a wafer W on a wafer stage WS by way of a projection optical system 16. To the upper portion of the wafer stage WS, a movable mirror W11 having a reflective surface perpendicular to X-axis and a movable mirror W12 having a reflective surface perpendicular to Y-axis are fixed. A laser beam W21 from a non-depicted X-axis laser interferometer irradiates the movable mirror W11 along a line which passes through an optical axis of the projection optical system 16 and is in parallel to the X-axis, whereas a laser beam W22 from a non-depicted Y-axis laser interferometer irradiates the movable mirror W12 along a line which passes through the optical axis of the projection optical system 16 and is in parallel to the Y-axis, such that these interferometers measure two-dimensional coordinates (X,Y) of the wafer stage WS.

Beside the projection optical system 16, an alignment optical system 500 of an alignment apparatus of an off-axis type is disposed. In this alignment optical system 500, a laser step alignment type detection system 590 (referred to as "LSA" system in the following) and an FIA system 591 which is a detection system of an image-pickup type are united together. A laser beam from the LSA system 590 and illumination light from the FIA system 591 are combined together by a half prism 648 so as to be directed to a common first objective lens 649. The luminous flux passing through the first objective lens 649 is reflected by a mirror to downward illuminate the wafer W. Then, a non-depicted rotation detection laser interferometer supplies a laser beam W31 to the movable mirror W11 along a line which passes through the optical axis of the alignment optical system 500 bent by the above-mentioned mirror and is in parallel to the X-axis. Thereafter, based on the difference between the value measured by the rotation detection laser interferometer and that measured by the X-axis laser interferometer, the rotation angle of the wafer stage is detected.

Figure 36:
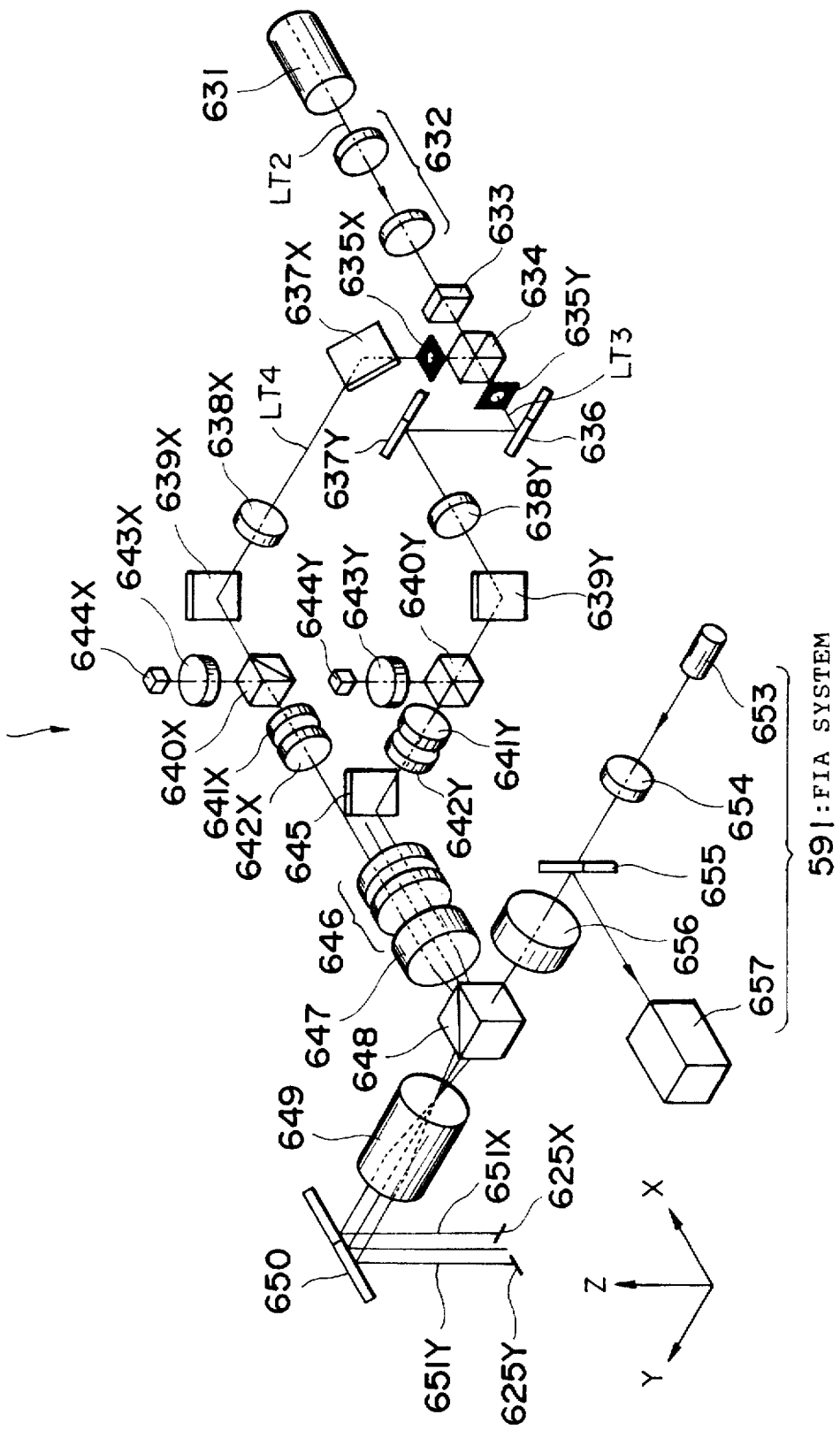
FIG. 36 is a perspective view showing a configuration of the alignment optical system in the alignment apparatus shown in FIG. 35.

FIG. 36 is an enlarged perspective view showing the alignment optical system 500 shown in FIG. 35. In the LSA system 590 shown in FIG. 36, a laser beam LT2 emitted from a He—Ne laser source 631 passes through a beam expander 632 and a cylindrical lens 633 to reach an XY-separable polarizing beam splitter 634 where it is divided into an X-axis sheet beam LT4 having a thin cross-section and a Y-axis sheet beam LT3. Then, by way of a field stop 635Y, a mirror 636, a mirror 637Y, a relay lens 638Y, and a mirror 639Y, the Y-axis sheet beam LT3 reaches a polarizing beam splitter 640Y for separating emitted and receiving light components. The sheet beam passing through the polarizing beam splitter 640Y enters an afocal optical system 646 by way of a Fourier transform lens 641Y, a ¼-wavelength plate 642Y, and a mirror 645.

On the other hand, substantially symmetrically to the Y-axis sheet beam LT3, by way of a field stop 635X to a ¼-wave plate 642X, the X-axis sheet beam LT4 is combined, in the visual field, with the Y-axis sheet beam LT3 near a plane which is conjugate with the surface of the wafer W (cf. FIG. 35) and then enters the substantially same-magnification Galilean afocal optical system 646. Both sheet beams output from the afocal optical system 646 are converged by a second objective lens 647 and are reflected by the half prism 648 so as to intersect each other. Then, by way of the first objective lens 649 and a mirror 650, they impinge on the wafer W as an X-axis sheet beam 651X and a Y-axis sheet beam 651Y. On the wafer W near positions where the sheet beams 651X and 651Y are incident, an X-axis wafer mark 625X and a Y-axis wafer mark 625Y are formed, respectively.

Also, in the FIA system 591, illumination light having a wide band emitted from a waveguide 653 such as an optical fiber is converged by a condenser lens 654 and passes through a half mirror 655. Then, it enters the half prism 648 by way of a second objective lens 656. The illumination light passing through the half prism 648 impinges on the wafer W by way of the common first objective lens 649 and the mirror 650. The reflected light from the wafer W forms an image of the wafer mark on a CCD camera 657 by way of the mirror 650, the first objective lens 649, the half prism 648, the second objective lens 656, and the half mirror 655.

Figure 37:
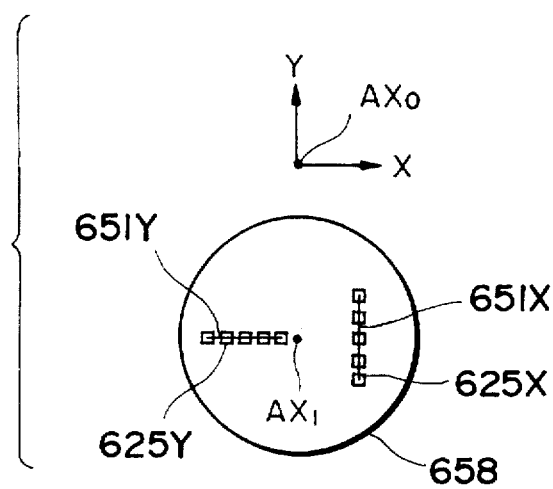
FIG. 37 is a view showing a relationship between a wafer mark and an irradiating sheet beam in the alignment optical system (i.e., enlarged plan view of the wafer surface) in the alignment optical system shown in FIG. 36.

FIG. 37 shows an observation visual field 658 of the first objective lens 649 on the wafer W. In this drawing, the X-axis wafer mark 625X comprises a dot pattern arranged in the Y-direction with a predetermined pitch, whereas the Y-axis wafer mark 625Y comprises a dot pattern arranged in the X-direction with a predetermined pitch. The X-axis sheet beam 651X is a light beam extending like a slit in the Y-direction, whereas Y-axis sheet beam 651Y is a light beam extending like a slit in the X-direction. Also, these sheet beams 651X and 651Y are disposed so as to hold an optical axis $AX_1$ of the first objective lens 649 therebetween, while a line passing the optical axis $AX_1$ of the first objective lens 649 and the optical axis $AX_0$ of the projection optical system 16 shown in FIG. 35 is in parallel to the Y-axis. In FIG. 37, 658 indicates a shot area on the wafer W with respect to the alignment light.

In FIG. 37, when the wafer stage WS is driven so as to effect scanning such that the wafer mark 625X crosses the sheet beam 651X in the X-direction, diffracted light is emitted in a predetermined direction when the sheet beam 651X coincides with the wafer mark 625X. Accordingly, when the X-coordinate of the wafer stage WS at the position where the intensity of the diffracted light becomes maximum is detected, the X-coordinate of the wafer mark 625X can be detected. Similarly, when the wafer stage WS is driven so as to effect scanning such that the wafer mark 625Y crosses the sheet beam 651Y in the Y-direction, the diffracted light emitted from the point where the sheet beam 651Y coincides with the wafer mark 625Y is detected, thereby yielding the Y-coordinate of the wafer mark 625Y. The diffracted light (including the reflected light) from the wafer mark 625Y returns to the half prism 648 by way of the mirror 650 and first objective lens 649 shown in FIG. 36.

In FIG. 36, the diffracted light reflected by the half prism 648 returns, by way of the second objective lens 647, the afocal optical system 646, the mirror 645, the ¼-wavelength plate 642Y, and the Fourier transform lens 641Y, to the polarizing beam splitter 640Y for separating emitted and receiving light components. The diffracted light reflected by the polarizing beam splitter 640Y is guided to a light-receiving device 644Y by way of a relay lens 643Y. At the light-receiving device 644Y, the diffracted light components other than the zero-order diffracted light component are selectively subjected to photoelectric conversion. Here, when the direction of the ¼-wavelength plate 642Y is optimally adjusted, the diffracted light from the wafer mark is substantially completely reflected by the polarizing beam splitter 640Y so as to be directed to the light-receiving device 644Y.

Similarly, in a manner symmetrical to the Y-axis diffracted light, the diffracted light from the X-axis wafer mark 625X shown in FIG. 37 returns to a polarizing beam splitter 640X for separating emitted and receiving light components. The diffracted light reflected by the polarizing beam splitter 640X is received by a light-receiving device 644X by way of a relay lens 643X. Then, based on the output signals from the light-receiving devices 644X and 644Y and the coordinates of the wafer stage WS, the X- and Y-coordinates of the wafer marks 625X and 625Y are measured and, based on the results of the measurement, the wafer W is aligned.

Here, according to a configuration similar to that shown in FIGS. 24 and 31 or FIG. 30, the afocal optical system 646 shown in FIG. 36, which is a correction optical system, is unitedly supported such that it can be shifted in an arbitrary direction perpendicular to the optical axis by an arbitrary amount within a predetermined range.

In the following, a brief explanation will be provided for problems which may occur when asymmetric aberration is generated in cases where the laser beam LT2 emitted from the He—Ne laser source 631 is repeatedly relayed as in the case of this embodiment. First, the relay of a laser beam can be regarded as the relay of the beam waist (i.e., position where the cross section is the smallest) of the laser beam.

Figure 41:
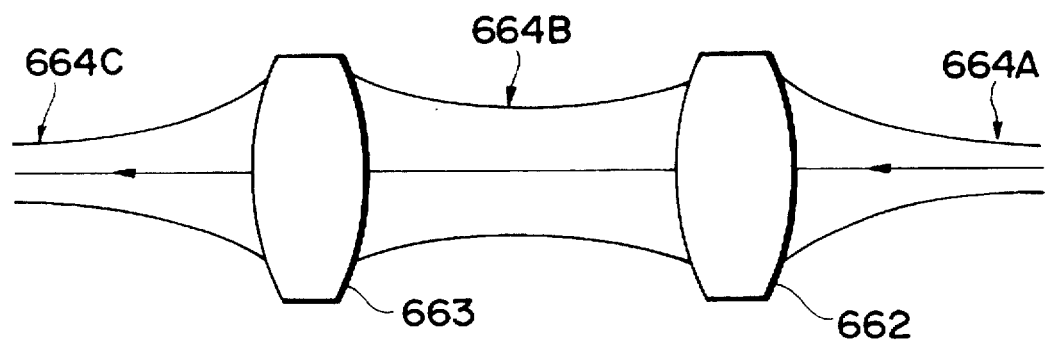
FIGS. 41 to 43 are views explaining influence of asymmetric aberration when the beam waist of a laser beam is relayed by a lens system.

FIG. 41 shows the relay of the laser beam at the beam expander 632 shown in FIG. 36. In FIG. 41, the beam expander 632 comprises two sheets of Fourier transform lenses 662 and 663. Accordingly, a beam waist 664A of the input laser beam is relayed to a beam waist 664B by the first Fourier transform lens 662. This beam waist 664B is relayed to a beam waist 664C by the second Fourier transform lens 663.

Figure 42:
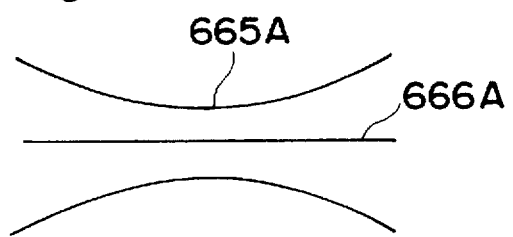
Figure 43:
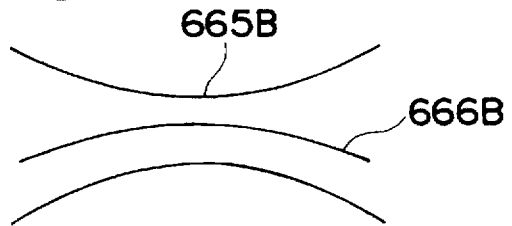

In this connection, FIG. 42 is an enlarged view in the proximity of a beam waist 665A which is relayed by an ideal lens. It also shows a line 666A where the energy of the beam cross section is maximized in the proximity of the beam waist 665A. As depicted, when the beam waist is relayed by the ideal lens, the line 666A is linearly distributed in front and behind of the beam waist. On the other hand, as shown in FIG. 43, when an eccentric asymmetrical aberration, for example, is generated in the relay lens, a line 666B where the energy of the beam cross section is maximized in the proximity of a beam waist 665B is warped in front and behind of the beam waist 665B. The amount of this warping is substantially proportional to the amount of asymmetric aberration. Similarly, the sheet beams 625X and 625Y irradiating the wafer W from the first objective lens 649 in FIG. 36 substantially become beam waists and accordingly, if eccentric asymmetrical aberration is generated in the sheet beams 625X and 625Y, the lines in the sheet beams 625X and 625Y where the energy distribution is maximized will be warped.

Such warping of the line where the energy distribution is maximized becomes influential to the accuracy in alignment when the wafer marks 625X and 625Y in FIG. 37 deviate (i.e., are defocused) from the converging points of the sheet beams 651X and 651Y in a direction (i.e., Z-direction) perpendicular to the paper surface of FIG. 37. Namely, when there is no warping in the energy distribution, in order to prevent the positions where the wafer marks 625X and 625Y are detected from deviating when defocused, it is sufficient for the line where the energy distribution becomes maximum to be made perpendicular to the wafer. For this purpose, in FIG. 36, for example, it is sufficient for a plane parallel plate to be disposed, with inclination by an appropriate angle, between the second objective lens 647 and the first objective lens 649.

However, when there is warping in the line where the energy distribution becomes maximum, such an adjustment cannot be effected. Accordingly, even when the wafer marks 625X and 625Y are slightly defocused in the Z-direction from the converging points, the positions where the wafer marks 625X and 625Y are detected laterally deviate, thereby generating errors in alignment. Therefore, it is necessary for such warping of the energy distribution to be eliminated. Thus, the asymmetric aberration, which causes such warping, should be almost nullified.

Figure 38:
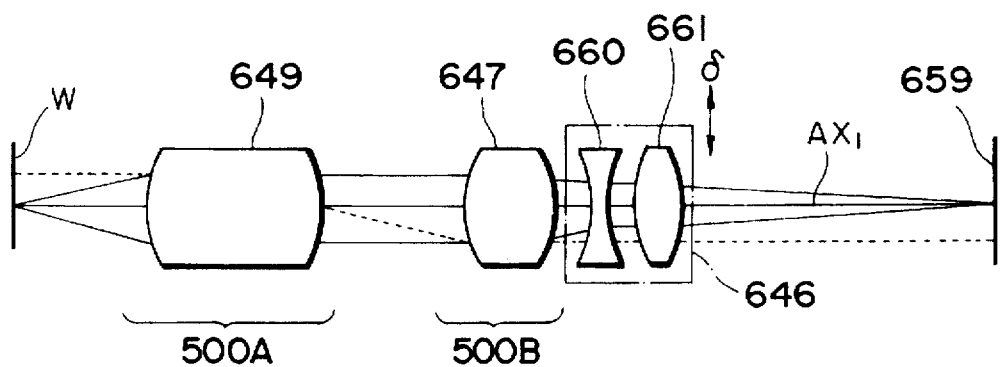
FIG. 38 is a view showing an image-forming relationship of a light-emitting system within the alignment optical system shown in FIG. 36.

FIG. 38 is an enlarged view showing a schematic configuration of the light-emitting system from the afocal optical system 646 to the wafer W in the LSA system 590 shown in FIG. 36. In FIG. 38, a combination optical system composed of the first objective lens 649, the second objective lens 647, and the afocal optical system 646 forms a both-side telecentric optical system. The focal length of the second objective lens 647 is set longer than that of the first objective lens 649. Also, the afocal optical lens system 646 comprises, in the following order from the side of the second objective lens 647, a lens group 660 having a negative refractive index and a lens group 661 having a positive refractive index. Further, the object-side focal plane of the first objective lens 649 coincides with the surface of the wafer W, while an image-side focal plane 659 of the combination optical system becomes a plane which is conjugate with the surface of the wafer W. Accordingly, a sheet beam guided to the image-side focal plane 659 which is conjugate with the surface of the wafer W is reduced and converged on the surface of the wafer surface.

In this embodiment, the aberration of the first objective lens 649 is corrected so as to substantially approximate an ideal lens. On the other hand, an appropriate amount of asymmetric aberration generated at the second objective lens 647 and that generated at the afocal optical system 646, which is the correction optical system, are corrected so as to substantially cancel each other on the surface of the wafer W. Namely, the light-emitting system shown in FIG. 38 uses the image-forming optical system shown in FIG. 25 and, accordingly, the configuration and effects of the former are similar to those of the latter.

In the light-emitting system shown in FIG. 38, even when asymmetric aberration is generated on the surface of the wafer W due to errors in manufacture of the first objective lens 649 and the like, the afocal optical system 646 can be shifted in an appropriate direction perpendicular to the optical axis $AX_1$ by an appropriate amount, thereby cancelling the asymmetric aberration. Accordingly, the sheet beam converged on the wafer W is supposed to be an ideal beam having no warping in the line where the energy distribution is maximized.

Figure 39:
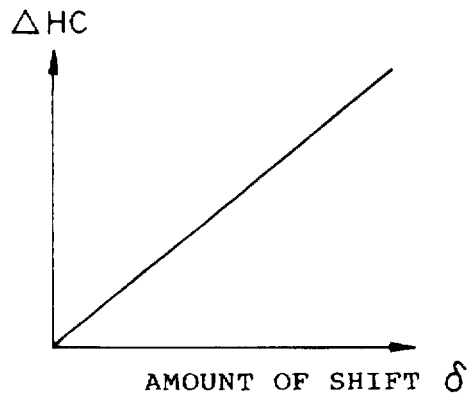
FIGS. 39 and 40 are charts showing optical characteristics of the afocal optical system in the third embodiment (FIG. 35) and sixth embodiment (FIG. 52) of the alignment apparatus in accordance with the present invention, specifically, FIG. 39 showing a relationship between amount of shift δ and eccentric asymmetrical aberration ΔHC in the afocal optical system and FIG. 40 showing a relationship between ratio ΔHC/δ of eccentric asymmetrical aberration ΔHC to amount of asymmetric aberration ΔC in the afocal optical system.
Figure 40:
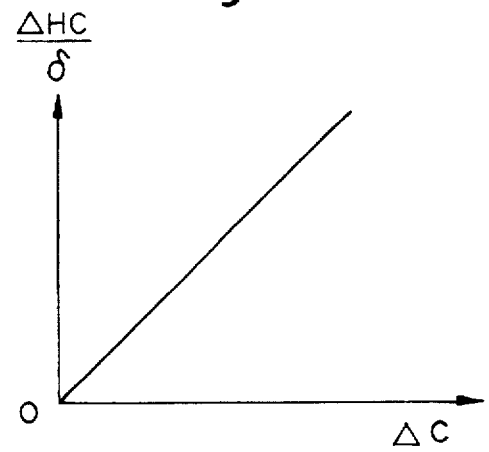

Also, in this embodiment, as shown in FIG. 39, amount of eccentric asymmetrical aberration $\Delta HC$ generated on the wafer W is proportional to amount of shift $\delta$ in the afocal optical system 646, while its gradient is proportional to the amount of offset asymmetric aberration. In view of these relationships, when the amount of offset asymmetric aberration is appropriately set and the afocal optical system 646 is shifted, a desirable eccentric asymmetrical aberration can be generated. Assuming that the amount of asymmetric aberration which is offset by the second objective lens 647 and the afocal optical system 646 against each other is ΔC and the constant of functionality is $k_1$, the relationship between the eccentric asymmetrical aberration ΔHC to be generated and the amount of shift δ of the afocal optical system 646 satisfies the above-mentioned expression (1) as in the case of the optical system shown in FIG. 24. Accordingly, as in the case of the optical system shown in FIG. 24, ΔHC/δ is proportional to ΔC as shown in FIG. 40. Also, in place of the substantially same-magnification afocal optical system 646, an afocal optical system having an angular magnification α(which indicates a reducing magnification with respect to the surface of the wafer W) or a lens having a refractive power, for example, may be used.

Here, the configuration of the decentering mechanism for making the afocal optical system 646, which is the correction optical system, eccentric is similar to that in the first embodiment of the optical system shown in FIGS. 24 and 30.

The optical system shown in FIG. 32 corrects the warping of the line where the energy distribution at the time of irradiation of a laser beam is maximized. Also, the optical system of the present invention can be applied, for example, to correction of asymmetric aberration which may disturb the spot form of the converged laser beam. Further, in addition to the alignment optical system, when the present invention is applied to overlay accuracy measurement systems for wafer mark, accuracy in the results of measurement is expected to increase. In particular, deviation of the true value in overlay accuracy measurement (so-called "TIS") can be substantially nullified.

Thus, without being restricted to the above-mentioned embodiments, the present invention can have various configurations as long as they do not deviate from the gist of the invention.

In the first to third embodiments of the optical system in accordance with the present invention, asymmetric aberration generated within the whole optical system due to errors in manufacture and the like can be easily offset in a simple lens configuration without hardly influencing other kinds of aberration. Also, depending on whether the object or image space of the condenser optical system is telecentric, an aberration correction optical system can be realized for at least one of them.

Further, cases where the correction optical system is a substantially same-magnification erect afocal optical system are advantageous in that, even when the afocal optical system is made eccentric so as to correct asymmetric aberration, the optical axis will not deviate thereafter.

Also, in an alignment apparatus to which the optical system of the present invention is applied, asymmetric aberration can be corrected in a simple configuration without hardly influencing other kinds of aberration, thereby detecting the position of an alignment mark with a high accuracy.

Further, the fourth to sixth embodiments of the optical system in accordance with the present invention will be explained with reference to attached drawings.

Figure 44:
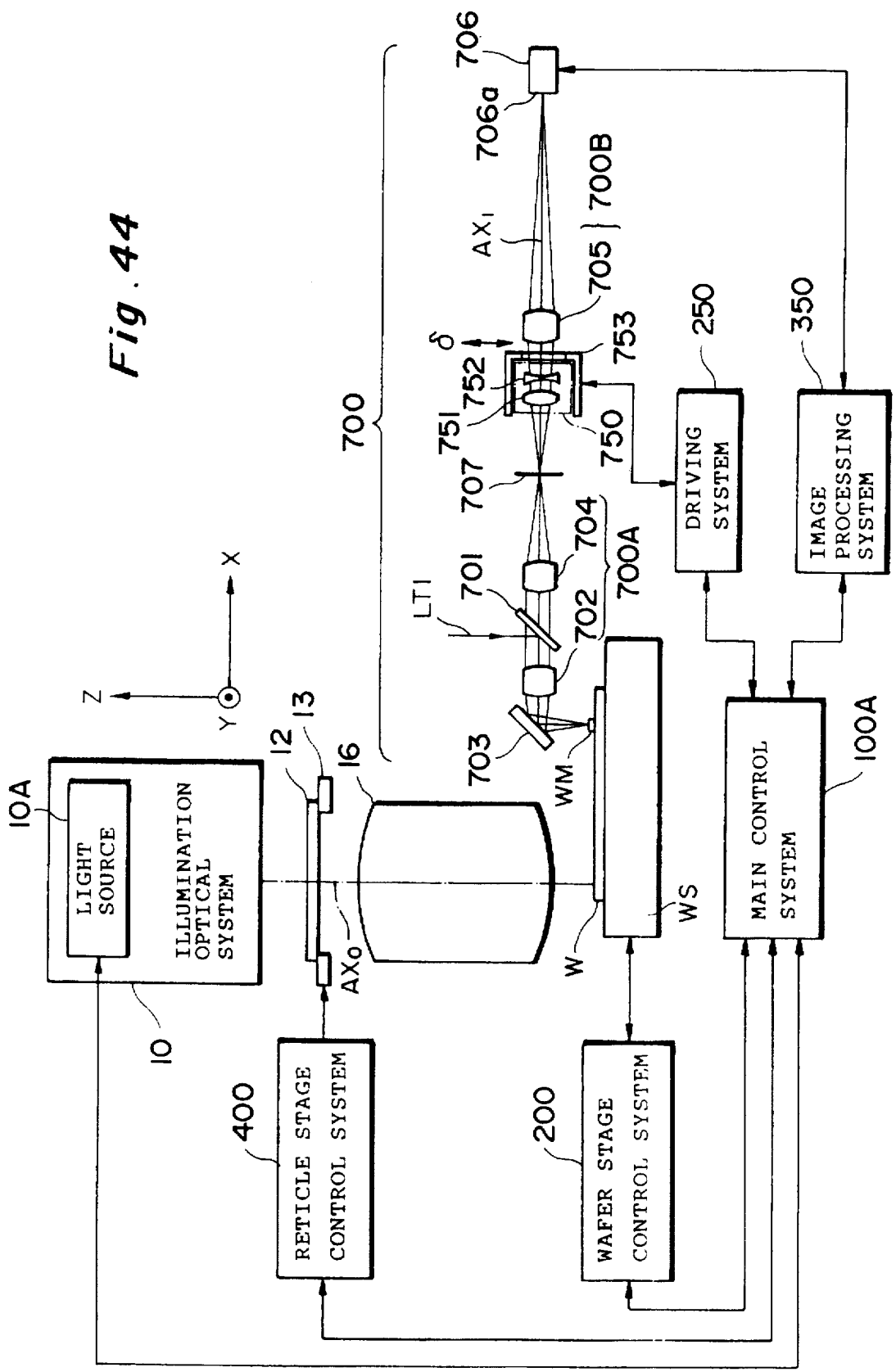
FIG. 44 is a view showing a schematic configuration of a projection exposure apparatus provided with the fourth embodiment of the alignment apparatus in accordance with the present invention.
Figure 45:
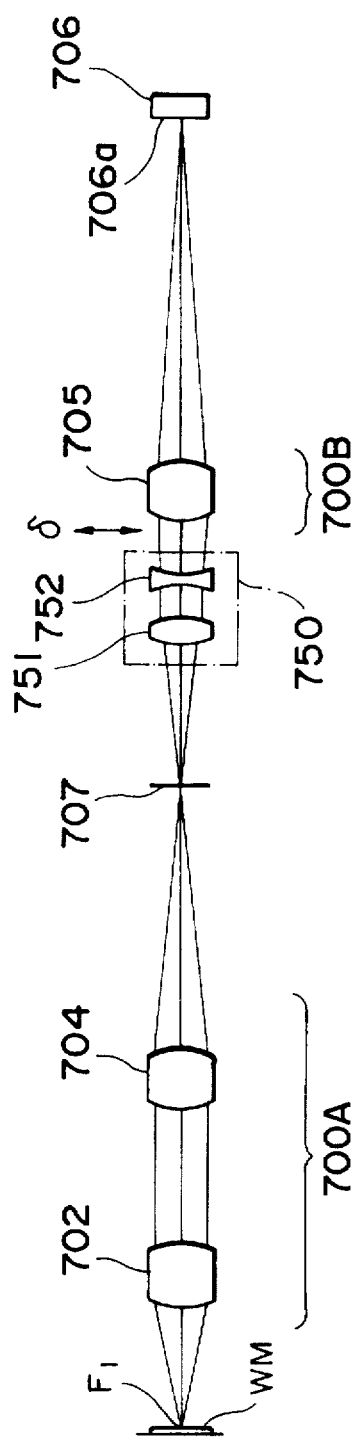
FIGS. 45 and 46 are views showing a configuration of an alignment optical system (i.e., image-forming optical system) applicable to the alignment apparatus shown in FIG. 44, specifically, FIG. 45 showing a conjugate relationship (i.e., image-forming relationship) between the object surface, intermediate image surface, and image surface of the alignment optical system (i.e., image-forming optical system) shown in FIG. 44 and FIG. 46 showing a conjugate relationship of the pupils in the optical system shown in FIG. 45.
Figure 46:
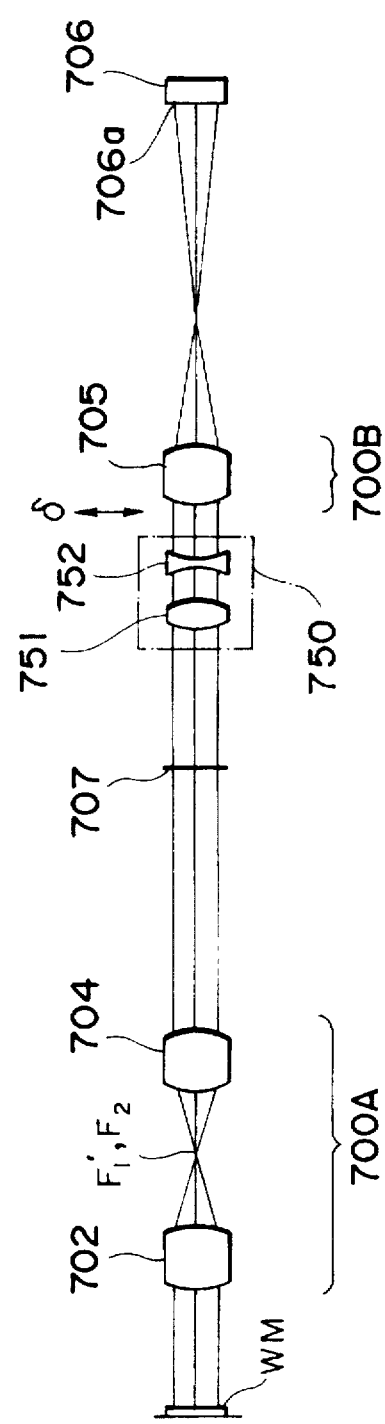

FIG. 44 is a schematic view showing a configuration of a projection exposure apparatus provided with an alignment apparatus to which the fourth embodiment of the optical system in accordance with the present invention is applied. FIG. 45 is an optical path chart showing a conjugate relationship (i.e., image-forming relationship) between an object surface, an intermediate image surface, and an image surface in the image-forming optical system (i.e., fourth embodiment) in accordance with the present invention. FIG. 46 is an optical path chart showing a conjugate relationship between pupils in the image-forming optical system (i.e., fourth embodiment) in accordance with the present invention. In FIGS. 45 and 46, a half mirror 701 and a mirror 703 shown in FIG. 44 are not depicted.

In the following embodiment, the optical system in accordance with the present invention is applied to an alignment apparatus (i.e., positioning apparatus) of both off-axis type and image-pickup type provided with a projection exposure apparatus.

In FIG. 44, based on exposure light supplied from a light source 10A within an illumination optical system 10, an image of a pattern of a reticle 12 is projected, by way of a projection optical system 16, upon each shot area (i.e., exposure area) on a wafer W coated with a photoresist. In FIG. 44, Z-axis is set at a direction which is in parallel to an optical axis $AX_0$ of the projection optical system 16, X-axis is set at a direction which is in parallel to the paper surface of FIG. 44 within a plane perpendicular to the Z-axis, and Y-axis is set at a direction which is perpendicular to the paper surface of FIG. 44 within a plane perpendicular to the Z-axis.

Here, the reticle 12 is held by a reticle stage 13 which is driven in the X- and Y-directions by a reticle stage control system 400 according to instructions from a main control system 100A. The cross-sectional configuration of the wafer W is similar to that shown in FIG. 20.

The wafer W is held on a wafer stage WS in parallel to the XY-plane. Also, the wafer stage WS comprises a Z stage for positioning the wafer W in the Z-direction, an XY stage for two-dimensionally moving the wafer W within the XY-plane, and the like. After the exposure of the shot area on the wafer W to the pattern image of the reticle 12 is completed, the next shot area is set at a predetermined position within an exposure field area of the projection optical system 16 due to a stepping operation (i.e., two-dimensional movement within the XY-plane) of the wafer stage WS.

Subsequently, as the stepping operation is repeated by a so-called step and repeat technique, the individual shot areas are successively exposed to light. In order to correctly effect the positioning of the individual shot areas, an alignment mark (i.e., wafer mark WM) is provided with each shot area on the wafer W. Accordingly, upon exposure of each shot area, it is necessary for the position of the wafer mark WM (and consequently the position of each shot area) to be measured so as to determine, based on the results of the measurement, the amount of stepping for the wafer stage WS. In the following, it is assumed that the alignment apparatus to which the optical system of FIG. 45 (i.e., fourth embodiment) is applied measures the position of a predetermined wafer mark WM provided with a predetermined shot area on the wafer W.

In the projection exposure apparatus shown in FIG. 44, an off-axis type alignment optical system 700 is provided beside the projection optical system 16. The alignment optical system 700 has a non-depicted lamp light source such as a halogen lamp. The light source supplies illumination light LT1 which has a wide wavelength band and to which the photoresist exhibits a low photosensitivity. After being reflected by a half mirror 701, the illumination light LT1 downward illuminates the wafer mark WM on the wafer W by way of a first objective lens 702 and a mirror 703.

The reflected light from the wafer mark WM is converged by the first objective lens 702 by way of the mirror 703 and then enters the half mirror 701 again. The reflected light passing through the half mirror 701 forms an intermediate image 707 by way of a second objective lens 704. The light from the intermediate image 707 forms an enlarged image of the wafer mark WM on an image-pickup surface 706 a of an image-pickup device 700, which comprises a two-dimensional CCD, by way of a substantially same-magnification Galilean afocal optical system 750, which is a correction optical system, and a relay lens 705.

In this manner, the mirror 703, the first objective lens 702, the half mirror 701, the second objective lens 704, the afocal optical system 750 which is the correction optical system, and the relay lens 705 constitute an image-forming optical system in the alignment optical system 700. Here, the first objective lens 702 and the second objective lens 704 constitute a first image-forming optical system for forming the primary image 707 of the wafer mark WM based on the reflected light from the wafer mark WM. On the other hand, the relay lens 705 constitutes a second image-forming optical system for forming the secondary image of the wafer mark WM based on the light from the primary image of the wafer mark WM.

The afocal optical system 750 comprises, in the following order from the side of the second objective lens 704, a positive lens group 751 having a positive refractive power and a negative lens group 752 having a negative lens group 752. Also, the afocal optical system 750 is held by a holder 753, in a configuration similar to that of FIGS. 24 and 30, such that it can be unitedly moved (i.e., shifted) in an arbitrary direction which is perpendicular to an optical axis $AX_1$ of the image-forming optical system of the alignment optical system 700 by an arbitrary amount within a predetermined range.

In the embodiment shown in FIG. 44, the image-pickup signal from the image-pickup device 706 is subjected to image processing in an image processing system 350 so as to detect the position of the wafer mark WM and, consequently, the position of each shot area. Then, based on the results of detection, the main control system 100A positions (i.e., aligns) the shot area of the wafer W with respect to a predetermined position within the exposure field area of the projection optical system 16.

As can be seen from FIG. 45 which shows the conjugate relationship between the object surface, intermediate image surface, and image surface in the image-forming optical system in the alignment apparatus shown in FIG. 44, under a focus-matching condition, the wafer mark WM is positioned on a plane which passes through an object-side focal point $F_1$ of the first objective lens 702 and is perpendicular to the optical axis $AX_1$. The light from the wafer mark WM passes through the first objective lens 702 and then, as a substantially parallel luminous flux, enters the second objective lens 704. The light converged by way of the second objective lens 704 forms the intermediate image 707.

The light from the intermediate image 707 forms an image of the wafer mark WM on the image-pickup surface 706a of the image-pickup device 706, which is a detector, by way of the afocal optical system 750 and the relay lens 705.

Also, as can be seen from FIG. 46 which shows the conjugate relationship between the pupils in the image-forming optical system in the alignment apparatus shown in FIG. 44, an image-side focal point $F_1'$ of the first objective lens 702 and an object-side focal point $F_2$ of the second objective lens 704 substantially coincide with each other. Thus, the principal ray which is output from the wafer mark WM in parallel to the optical axis $AX_1$ also becomes substantially parallel to the optical axis $AX_1$ when output from the second objective lens 704 and further, by way of the intermediate image 707, enters the afocal optical system 750 while being substantially in parallel to the optical axis $AX_1$. It is particularly desirable for the embodiment shown in FIG. 44 to be configured such that the space in which the afocal optical system 750 is disposed becomes substantially telecentric.

In the afocal optical system 750, an image-side focal point $F_3'$ of the positive lens group 751 and an object-side focal point $F_4$ of the negative lens group 752 substantially coincide with each other, thereby constituting, as a whole, a substantially same-magnification Galilean afocal optical system.

Also, the focal length of the second objective lens 704 is made longer than that of the first objective lens 702, thereby making the magnification from the surface for forming the wafer mark WM to the surface for forming the intermediate image 707 an enlarged magnification.

In the design of the embodiment shown in FIG. 45, the aberrations of the first objective lens 702 and second objective lens 704 are corrected so as to substantially approximate the condition of an ideal lens. However, since the numerical aperture (NA) of the first objective lens 702 is configured so as to be greater than that of the second objective lens 704 as mentioned above, aberrations such as asymmetric aberration are likely to remain in the first objective lens 702.

On the other hand, an appropriate amount of asymmetric aberration generated at the afocal optical system 750, which is the correction optical system, and the asymmetric aberration generated at the relay lens 705, which constitutes the second image-forming optical system 700B, are corrected so as to substantially cancel each other on the image-pickup surface 706a. Also, this may cause the relay lens 705 to secondarily generate symmetric aberration. In this case, it is sufficient for the symmetric aberration generated at the relay lens 705 and that generated at the afocal optical system 750 to be corrected so as substantially cancel each other on the image-pickup surface 706a.

Here, the asymmetric aberration and symmetric aberration generated at the afocal optical system 750 and relay lens 705 are substantially at the level of the tertiary aberration. Accordingly, other aberrations hardly occur in any lens system and, if any, are sufficiently corrected.

In the embodiment of FIG. 45, as mentioned above, the numerical aperture (NA) on the intermediate image surface is substantially smaller than that on the object surface (i.e., wafer surface) by the amount corresponding to the enlarged magnification. Accordingly, it is easy for the afocal optical system 750 and the relay lens 705 to manipulate the aberrations so as to offset the asymmetric aberration generated thereby. The image of the wafer mark WM projected upon the image-pickup surface 706a of the image-pickup device 706 by the image-forming optical system configured on the basis of such an aberration relationship can be substantially regarded as an ideally formed image.

In the alignment optical system 700 in the embodiment shown in FIG. 45, for example, asymmetric aberration may be generated on the image-pickup surface 706a due to errors in manufacture of the first objective lens 702 and the like. In this case, the afocal optical system 750 is shifted in an appropriate direction within a plane perpendicular to the optical axis $AX_1$ by an appropriate amount so as to generate a desirable amount of eccentric asymmetrical aberration in a desirable direction on the image-pickup surface 706a. Thus, among two kinds of aberration which may occur due to errors in manufacture and the like, when asymmetric aberration which is asymmetrical to an ideal optical axis occurs, within a range where the asymmetric aberration should be corrected on the image-pickup surface 706a in particular, such asymmetric aberration resulting from the errors in manufacture and the like can be cancelled by the asymmetric aberration generated when the afocal optical system 750 is shifted.

Here, the ideal optical axis is the optical axis $AX_1$ of the image-forming optical system and differs from the center of the visual field in the image-pickup surface 706a.

Also, among two kinds of aberration which may occur due to errors in manufacture and the like, when an eccentric asymmetrical aberration occurs, such an eccentric asymmetrical aberration can be cancelled in the whole area of the image-pickup surface 706a by the asymmetric aberration generated when the afocal optical system 750 is shifted. In this case, within the range where the asymmetric aberration resulting from the errors in manufacture and the like is cancelled, other kinds of aberration hardly occur, so that the image of the wafer mark WM approximates an ideally-formed image.

The relationship shown in FIG. 28 mentioned above corresponds to the relationship between amount of shift δ in the afocal optical system 750 and amount of eccentric asymmetrical aberration ΔHC generated in the embodiment shown in FIG. 45. Also, the relationship shown in FIG. 29 corresponds to the relationship between the ratio of the amount of shift δ in the afocal optical system 750 to the amount of eccentric asymmetrical aberration ΔHC generated and amount of asymmetric aberration ΔC offset by the afocal optical system 750 and the relay lens 705 against each other in the embodiment shown in FIG. 44.

As shown in FIG. 28, the amount of eccentric aberration ΔHC generated when the afocal optical system 750 is shifted is proportional to the amount of shift δ in the afocal optical system 750. Also, as shown in FIG. 29, the gradient of the linear relationship in FIG. 28, namely, the ratio of the amount of eccentric aberration ΔHC to the amount of shift δ in the afocal optical system 750, i.e., ΔHC/δ, is proportional to the amount of asymmetric aberration ΔC which is offset by the afocal optical system 750 and the relay lens 705 against each other. Accordingly, when the amount of asymmetric aberration ΔC which is offset by the afocal optical system 750 and the relay lens 705 against each other is appropriately set and the afocal optical system 750, which can be easily adjusted, is shifted by an appropriate amount, an eccentric asymmetrical aberration can be generated in a desirable direction with a desirable amount.

Namely, assuming that the amount of offset asymmetric aberration is ΔC and the constant of proportionality is $k_1$, the amount of eccentric aberration ΔHC generated with respect to the amount of shift δ in the afocal optical system 750 is expressed as follows:

$$\Delta HC = k_1 \cdot \Delta C \cdot \delta \qquad (4)$$

Here, equation (4) corresponds to the above-mentioned equation (1).

Equation (4) can be modified as:

$$\Delta HC/\delta = k_1 \cdot \Delta C$$

This linear relationship between ΔHC/δ and ΔC is shown in FIG. 29 as mentioned above.

In the embodiment of FIG. 45, the Galilean afocal optical system 750 is substantially a same-magnification system. When the afocal optical system 750 is substantially a same-magnification system, it is advantageous in that, when the afocal optical system 750 is shifted in order to generate an eccentric asymmetrical aberration, the optical axis $AX_1$ is substantially prevented from deviating (i.e., tilting or shifting), namely, the principal ray is substantially prevented from fluctuating, at the optical path on the image surface side from the afocal optical system 750.

Though the afocal optical system 750 is constituted by a substantially same-magnification Galilean optical system in the above-mentioned fourth embodiment, it is not always necessary to be a Galilean optical system as long as it is a substantially same-magnification erect optical system.

Also, in this fourth embodiment, the afocal optical system 750 is disposed in a telecentric space between the intermediate image 707 and the relay lens 705. However, the afocal optical system 750 may be disposed in a telecentric space within the relay lens 705. Also, the afocal optical system 750 may be disposed at any position in a substantially telecentric space between the intermediate image 707 and the image-pickup surface 706a.

In the embodiment of FIG. 44, only one relay lens 705 is disposed in the optical path between the intermediate image 707 and the image-pickup surface 706a. However, a plurality of relay lenses may be disposed in the optical path between the intermediate image 707 and the image-pickup surface 706a so as to form a plurality of intermediate images.

Also, in this fourth embodiment, the first objective lens 702 and the second objective lens 704 are clearly separated from each other, while making the object-side space of the first objective lens 702 telecentric. However, this condition is not always necessary for correcting aberration in the optical system of the present invention.

Further, as long as the above-mentioned deviation (i.e., tilt or shift) of the optical axis and the aberration other than asymmetric aberration generated at the time of correcting the asymmetric aberration are not so influential, the afocal optical system can may be disposed in a non-telecentric space and the afocal optical system may not be a same-magnification erect optical system. Also, in place of the afocal optical system, a lens having a predetermined refractive power may be used.

Here, the configuration of the decentering mechanism for making the afocal optical system 750, which is the correction optical system, eccentric is similar to that in the first embodiment (FIGS. 24 and 30) of the optical system in accordance with the present invention.

Figure 47:
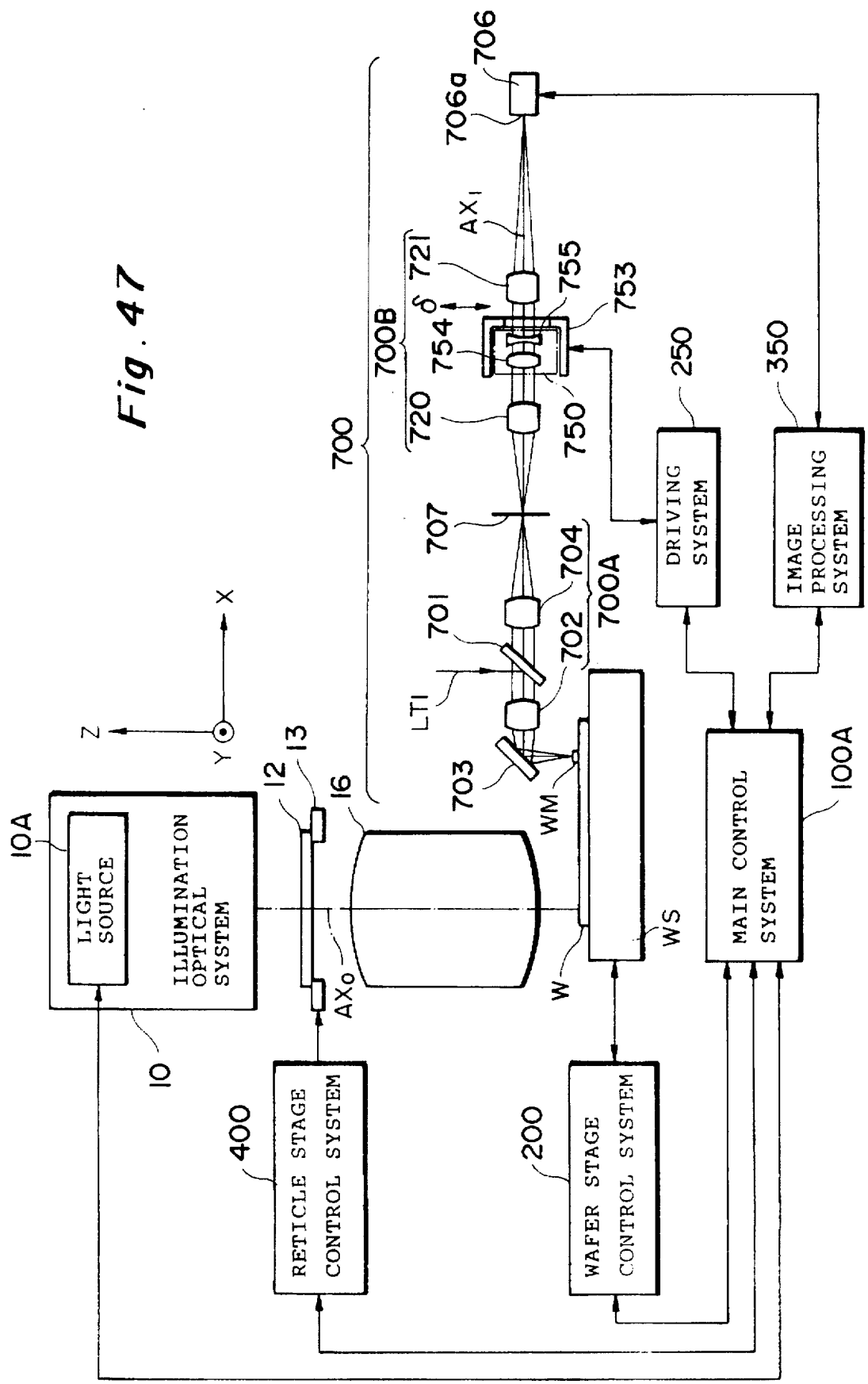
FIG. 47 is a view showing a schematic configuration of a projection exposure apparatus provided with the fifth embodiment of the alignment apparatus in accordance with the present invention.
Figure 48:
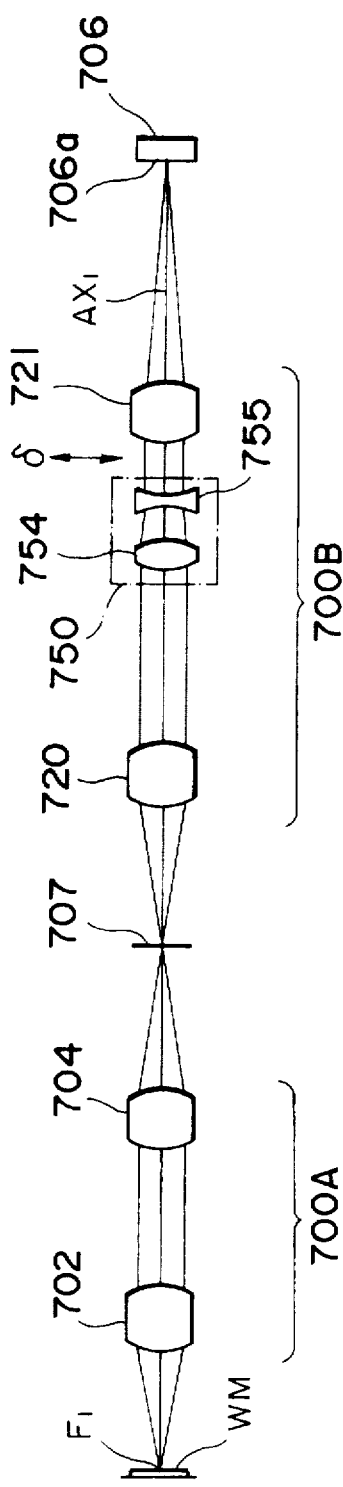
FIGS. 48 and 49 are views showing a configuration of an alignment optical system (i.e., image-forming optical system) applicable to the alignment apparatus shown in FIG. 47, specifically, FIG. 48 showing a conjugate relationship (i.e., image-forming relationship) between the object surface and image surface of the alignment optical system (i.e., image-forming optical system) shown in FIG. 47 and FIG. 49 showing a conjugate relationship of the pupils in the optical system shown in FIG. 48.
Figure 49:
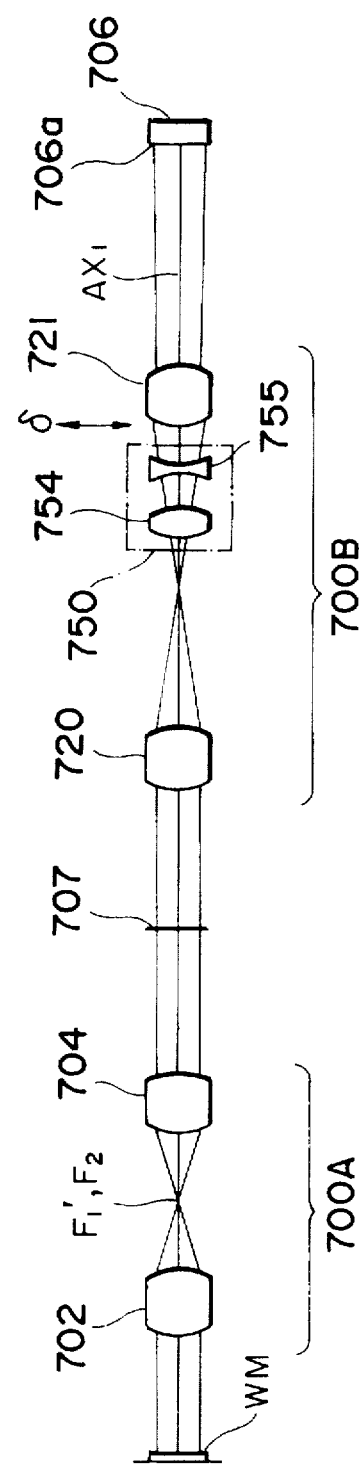

FIG. 47 is a schematic view showing a configuration of a projection exposure apparatus provided with an alignment apparatus to which the fifth embodiment of the optical system in accordance with the present invention is applied. FIG. 48 is an optical path chart showing a conjugate relationship (i.e., image-forming relationship) between an object surface and an image surface in the image-forming optical system of the alignment apparatus shown in FIG. 47. FIG. 49 is an optical path chart showing a conjugate relationship between pupils in the image-forming optical system of the alignment apparatus shown in FIG. 47. In FIGS. 48 and 49, a half mirror 701 and a mirror 703 shown in FIG. 47 are not depicted.

Also, in the embodiment shown in FIG. 47, the optical system in accordance with the present invention is applied to an alignment apparatus (i.e., positioning apparatus) of both off-axis type and image-pickup type provided with a projection exposure apparatus. However, the embodiment shown in FIG. 47 is basically different from that of FIG. 44 in that, in place of the relay lens 705 in the embodiment of FIG. 44, a first relay lens 720 and a second relay lens 721 are disposed and an afocal optical system 750, which is a correction optical system, is disposed in a non-telecentric space between a pair of the relay lenses 720 and 721. In FIGS. 47 to 49, parts corresponding to those of FIGS. 44 to 46 are referred to by the marks same as those of the latter, while omitting detailed explanation with respect to the overlapping portions of these embodiments.

In FIG. 47, illumination light LT1 guided by a half mirror 701 downward illuminates a wafer mark WM on a wafer w by way of a first objective lens 702 and a mirror 703. The reflected light from the wafer WM is converged by way of the mirror 703 and the first objective lens 702 so as to return to the half mirror 701. The luminous flux passing through the half mirror 701 forms an intermediate image 707 by way of a second objective lens 704.

The light from the intermediate image 707 forms an enlarged image of the wafer mark WM on an image-pickup surface 706a of an image-pickup device 706 (i.e., detector) comprising a two-dimensional CCD by way of the first relay lens 720, a substantially same-magnification Galilean afocal optical system 750, and the second relay lens 721.

In this manner, the mirror 703, the first objective lens 702, the half mirror 701, the second objective lens 704, the first relay lens 720, the afocal optical system 750, and the second relay lens 721 constitute an image-forming optical system in the alignment apparatus. Also, the first objective lens 702 and the second objective lens 704 constitute a first image-forming optical system, while the first relay lens 720 and the second relay lens 721 constitute a second image-forming optical system.

The afocal optical system 750 comprises, in the following order from the side of the second objective lens 704, a positive lens group 754 having a positive refractive power and a negative lens group 755 having a negative refractive power. Also, the afocal optical system 750 is configured such that, while being held by a holder 753, it can be unitedly moved (i.e., shifted) in an arbitrary direction perpendicular to an optical axis $AX_1$ of the image-forming optical system by an arbitrary amount within a predetermined range.

Also in the embodiment of FIG. 47, the image-pickup signal from the image-pickup device 706 is subjected to image processing in an image-processing system 350 so as to detect the position of the wafer mark WM and, consequently, the position of each shot area of the wafer W. Then, based on the results of detection, a main control system 100A positions (i.e., aligns) the shot area of the wafer W at a predetermined position within an exposure field of the projection optical system 16.

As can be seen from FIG. 47 which shows the conjugate relationship between the object surface, intermediate surface, and image surface in the image-forming optical system in the alignment apparatus shown in FIG. 47, under a focus-matching condition, the wafer mark WM is positioned on a plane which passes through an object-side focal point $F_1$ of the first objective lens 702 and is perpendicular to the optical axis $AX_1$. The light from the wafer mark WM passes through the first objective lens 702 and then, as a substantially parallel luminous flux, enters the second objective lens 704. The light converged by way of the second objective lens 704 forms the intermediate image 707.

The light from the intermediate image 707 forms an image of the wafer mark WM on the image-pickup surface 706a of the image-pickup device 706 by way of the first relay lens 720, the afocal optical system 750, and the second relay lens 721.

Also, as can be seen from FIG. 49 which shows the conjugate relationship between the pupils in the image-forming optical system in the alignment apparatus shown in FIG. 47, an image-side focal point $F_1'$ of the first objective lens 702 and an object-side focal point $F_2$ of the second objective lens 704 substantially coincide with each other. Thus, the principal ray which is output from the wafer mark WM in parallel to the optical axis $AX_1$ also becomes substantially parallel to the optical axis $AX_1$ when output from the second objective lens 704. Further, by way of the intermediate image 707, this principal ray enters the afocal optical system 750 while being substantially in parallel to the optical axis $AX_1$. The principal ray output from the first relay lens 720 enters the afocal optical system 750 while not being in parallel to the optical axis $AX_1$. It is particularly desirable for the embodiment shown in FIG. 48 to be configured such that the space in which the afocal optical system 750 is disposed becomes substantially telecentric.

In the afocal optical system 750, an image-side focal point $F_3'$ of the positive lens group 754 and an object-side focal point $F_4$ of the negative lens group 755 substantially coincide with each other, thereby constituting, as a whole, a substantially same-magnification Galilean afocal optical system.

Also, the focal length of the second objective lens 704 is made longer than that of the first objective lens 702, thereby making the magnification from the surface for forming the wafer mark WM to the surface for forming the intermediate image 707 an enlarged magnification.

In the design of the embodiment shown in FIG. 48, the aberrations of the first objective lens 702 and second objective lens 704 are corrected so as to substantially approximate the condition of an ideal lens. However, since the numerical aperture (NA) of the first objective lens 702 is configured so as to be greater than that of the second objective lens 704 as mentioned above, aberrations such as asymmetric aberration are likely to remain in the first objective lens 702.

On the other hand, an appropriate amount of symmetric aberration generated at the afocal optical system 750 and that generated at the second relay lens 721 are corrected so as to substantially cancel each other on the image-pickup surface 706a.

Here, the symmetric aberration generated at the afocal optical system 750 and second relay lens 721 are substantially at the level of the tertiary aberration. Accordingly, other aberrations hardly occur in any lens system and, if any, are sufficiently corrected.

In the embodiment of FIG. 48, as mentioned above, the numerical aperture (NA) on the intermediate image surface is substantially smaller than that on the object surface (i.e., wafer surface) by the amount of the enlarged magnification. Accordingly, it is easy for the afocal optical system 750 and the second relay lens 721 to manipulate the aberrations so as to offset the symmetric aberration generated thereby. The image of the wafer mark WM projected upon the image-pickup surface 706a of the image-pickup device 706 by the image-forming optical system configured on the basis of such an aberration relationship can be substantially regarded as an ideally formed image.

In the alignment optical system in the embodiment shown in FIG. 47, for example, asymmetric aberration may be generated on the image-pickup surface 706a due to errors in manufacture of the first objective lens 702 and the like. In this case, the afocal optical system 750 is shifted in an appropriate direction within a plane perpendicular to the optical axis $AX_1$ by an appropriate amount so as to generate a desirable amount of eccentric asymmetrical aberration in a desirable direction on the image-pickup surface 706a. Thus, among two kinds of aberration which may occur due to errors in manufacture and the like, when asymmetric aberration which is asymmetrical to an ideal optical axis occurs, within a range where the asymmetric aberration should be corrected on the image-pickup surface 706a in particular, such asymmetric aberration resulting from the errors in manufacture and the like can be cancelled by asymmetric aberration generated when the afocal optical system 750 is shifted.

Also, among two kinds of aberration which may occur due to errors in manufacture and the like, when an eccentric asymmetrical aberration occurs within the optical system, such an eccentric asymmetrical aberration can be cancelled in the whole area of the image-pickup surface 706*a* by asymmetric aberration generated when the afocal optical system 750 is shifted. In this case, within the range where the asymmetric aberration resulting from the errors in manufacture and the like is cancelled, though there occurs separation of a meridional image surface and a sagittal image surface from each other (without any tilting of the image surfaces), other kinds of aberration hardly occur.

The relationship shown in FIG. 33 mentioned above corresponds to the relationship between amount of shift δ in the afocal optical system 750 and amount of eccentric asymmetrical aberration ΔHC generated in the embodiment shown in FIG. 48. Also, the relationship shown in FIG. 34 corresponds to the relationship between the ratio of the amount of shift δ in the afocal optical system 750 to the amount of eccentric asymmetrical aberration ΔHC generated and amount of symmetric aberration ΔS offset by the afocal optical system 750 and the second relay lens 721 against each other in the embodiment shown in FIG. 48.

As shown in FIG. 33, the amount of eccentric aberration ΔHC generated when the afocal optical system 750 is shifted is proportional to the amount of shift δ in the afocal optical system 750. Also, as shown in FIG. 34, the gradient of the linear relationship in FIG. 33, namely, the ratio of the amount of eccentric aberration ΔHC to the amount of shift δ in the afocal optical system 750, i.e., ΔHC/δ, is proportional to the amount of symmetric aberration ΔS which is offset by the afocal optical system 750 and the second relay lens 721 against each other. Accordingly, when the amount of symmetric aberration ΔS which is offset by the afocal optical system 750 and the second relay lens 721 against each other is appropriately set and the afocal optical system 750, which can be easily adjusted, is shifted by an appropriate amount, an eccentric asymmetrical aberration can be generated in a desirable direction with a desirable amount.

Namely, assuming that the amount of offset symmetric aberration is ΔS and the constant of proportionality is $k_2$, the amount of eccentric aberration ΔHC generated with respect to the amount of shift δ in the afocal optical system 750 is expressed as follows:

$$\Delta HC = k_2 \cdot \Delta S \cdot \delta \qquad (5)$$

Here, equation (5) corresponds to the above-mentioned equation (2).

Equation (5) can be modified as:

$$\Delta HC/\delta = k_2 \cdot \Delta S$$

This linear relationship between ΔHC/δ and ΔS is shown in FIG. 34 as mentioned above.

Also, assuming that the amount of offset symmetric aberration is ΔS, amount of shift of the afocal optical system 550 is δ, and the constant of proportionality is $k_3$, amount of image surface separation ΔAS mentioned above is expressed as follows:

$$\Delta AS = k_3 \cdot \Delta S \cdot \delta^2 \qquad (6)$$

Here, equation (6) corresponds to the above-mentioned equation (3).

As indicated by the above-mentioned equation (3), within the range where the amount of shift δ in the afocal optical system 750 is small, the amount of image surface separation ΔAS has a magnitude which can be neglected. Nevertheless, even when the amount of shift δ is so large that the amount of image surface separation ΔAS cannot be neglected, there is no problem when its adjustment mechanism (e.g., that utilizing a cylindrical lens) is provided within the optical system.

In the embodiment of FIG. 48, the Galilean afocal optical system 750, which is the correction optical system, is substantially a same-magnification system. When the afocal optical system 750 is substantially a same-magnification system, it is advantageous in that, when the afocal optical system 750 is shifted in order to generate an eccentric asymmetrical aberration, the optical axis $AX_1$ is substantially prevented from deviating (i.e., tilting or shifting), namely, the principal ray is substantially prevented from fluctuating, at the optical path which is nearer to the image surface than the afocal optical system 750 is.

Though the afocal optical system 750 is constituted by a substantially same-magnification Galilean optical system in the embodiment shown in FIG. 48, it is not always necessary to be a Galilean optical system as long as it is a substantially same-magnification erect optical system.

Also, in the embodiment shown in FIG. 48, the afocal optical system 750 is disposed in a non-telecentric space between the first relay lens 720 and the second relay lens 721. However, the afocal optical system 750 may be disposed at any position in a non-telecentric space between the intermediate image 707 and the image-pickup surface 706*a*.

Also, in the embodiment of FIG. 48, only one relay lens system (702 and 721) is disposed in the optical path between the intermediate image 707 and the image-pickup surface 706*a*. However, a plurality of relay lens systems may be disposed in the optical path between the intermediate image 707 and the image-pickup surface 706*a* so as to form a plurality of intermediate images.

Further, in the embodiment shown in FIG. 48, the first objective lens 702 and the second objective lens 704 are clearly separated from each other, while the image-forming optical system comprising the first objective lens 702 and the second objective lens 704 is a both-side telecentric optical system. However, this condition is not always necessary for correcting aberration in the optical system of the present invention.

Figure 50:
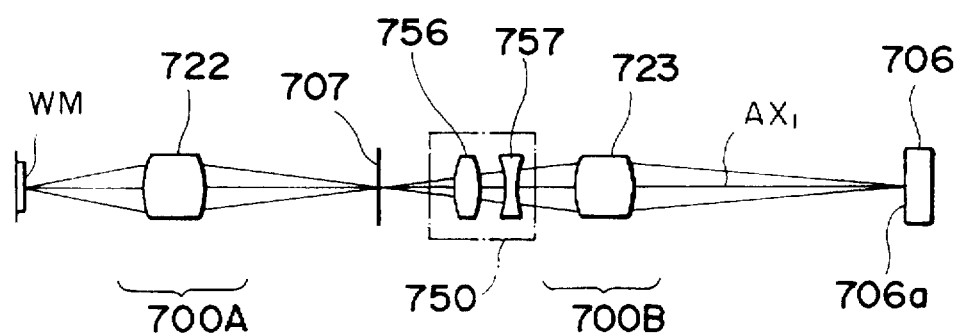
FIGS. 50 and 51 showing a configuration of a modified example of an alignment optical system applicable to the alignment apparatus shown in FIG. 47, specifically, FIG. 50 showing a conjugate relationship (i.e., image-forming relationship) between the object surface and image surface of the alignment optical system (i.e., image-forming optical system) and FIG. 51 showing a conjugate relationship of the pupils in the alignment optical system shown in FIG. 50.
Figure 51:
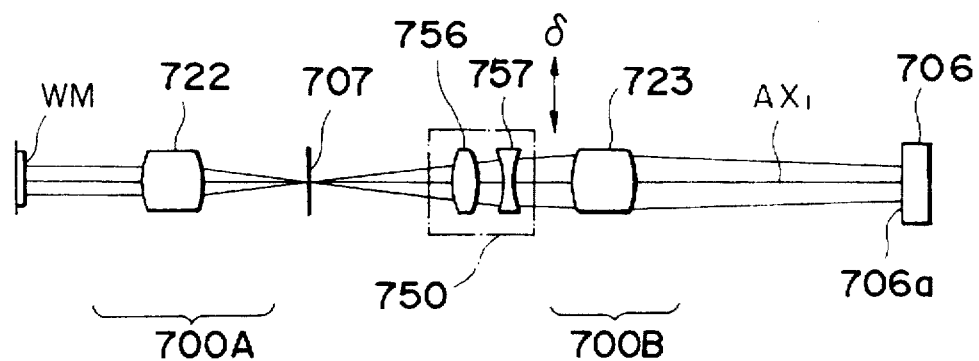

FIGS. 50 and 51 are schematic views showing a configuration of a modified example of the fifth embodiment of the image-forming optical system in accordance with the present invention. FIG. 50 is an optical path chart showing a conjugate relationship (i.e., image-forming relationship) between an object surface and an image surface. FIG. 51 is an optical path chart showing a conjugate relationship between pupils.

In the modified example shown in FIGS. 50 and 51, the first and second objective lenses are not distinguished from each other. Namely, in place of the first objective lens 702 and second objective lens 704 in the embodiment shown in FIG. 48, a first image-forming lens 722 is provided. Also, the first and second relay lenses are not distinguished from each other. Namely, in place of the first relay lens 720 and second relay lens 721 in the embodiment shown in FIG. 48, a second image-forming lens 723 is provided.

Further, while the afocal optical system 750 is disposed in the non-telecentric space between the first relay lens 720 and the second relay lens 721 in the embodiment shown in FIG. 48, it is disposed in a non-telecentric space between an intermediate image 707 and the second image-forming lens 723 in the modified example shown in FIGS. 50 and 51.

In FIG. 50 which shows the conjugate relationship between the object surface, intermediate image, and image surface, under a focus-matching condition, light from a wafer mark WM forms the intermediate image 707 by way of the first image-forming lens 722. The luminous flux from the intermediate image 707 forms an image of a wafer mark WM on an image-pickup surface 706a of an image-pickup device 706 by way of the afocal optical system 750 and the second image-forming lens 723.

Also, in FIG. 51 which shows the conjugate relationship between pupils, the principal ray which is output from the wafer mark WM in parallel to an optical axis $AX_1$ is not in parallel to the optical axis $AX_1$ when output from the first image-forming lens 722. Further, by way of the intermediate image 707, this principal ray enters the afocal optical system 750 while not being in parallel to the optical axis $AX_1$. It is particularly desirable for the modified example to be configured such that the space in which the afocal optical system 750 is disposed becomes non-telecentric.

In the afocal optical system 750, an image-side focal point $F_4'$ of the positive lens group 756 and an object-side focal point $F_5$ of the negative lens group 757 substantially coincide with each other, thereby constituting, as a whole, a substantially same-magnification Galilean afocal optical system. Also, the magnification of the first image-forming lens 722 from the surface where the wafer mark WM is formed to the surface where the intermediate image 707 is formed is an enlarged magnification.

Also, in the optical system in accordance with the modified example shown in FIGS. 50 and 51, the aberration of the first image-forming lens 722 is corrected so as to substantially approximate the condition of an ideal lens. On the other hand, an appropriate amount of symmetric aberration generated at the afocal optical system 750 and that generated at the second image-forming lens 723 are corrected so as to substantially cancel each other on the image-pickup surface 706a. Thus, in this modified example, effects similar to those of the embodiment of FIG. 48 are obtained.

Further, in the embodiment shown in FIG. 48 and the modified example shown in FIGS. 50 and 51, as long as the above-mentioned deviation (i.e., tilt or shift) of the optical axis and aberration other than the asymmetric aberration generated when asymmetric aberration is corrected are not so influential, the afocal optical system, which is the correction optical system, may not be a same-magnification erect optical system or a lens having a predetermined refractive power may be used in place of the afocal system.

The decentering mechanism for making the afocal optical system 750, which is the correction optical system, eccentric is configured in a manner similar to that of the first embodiment (FIGS. 24 and 30) of the optical system in accordance with the present invention.

Figure 52:
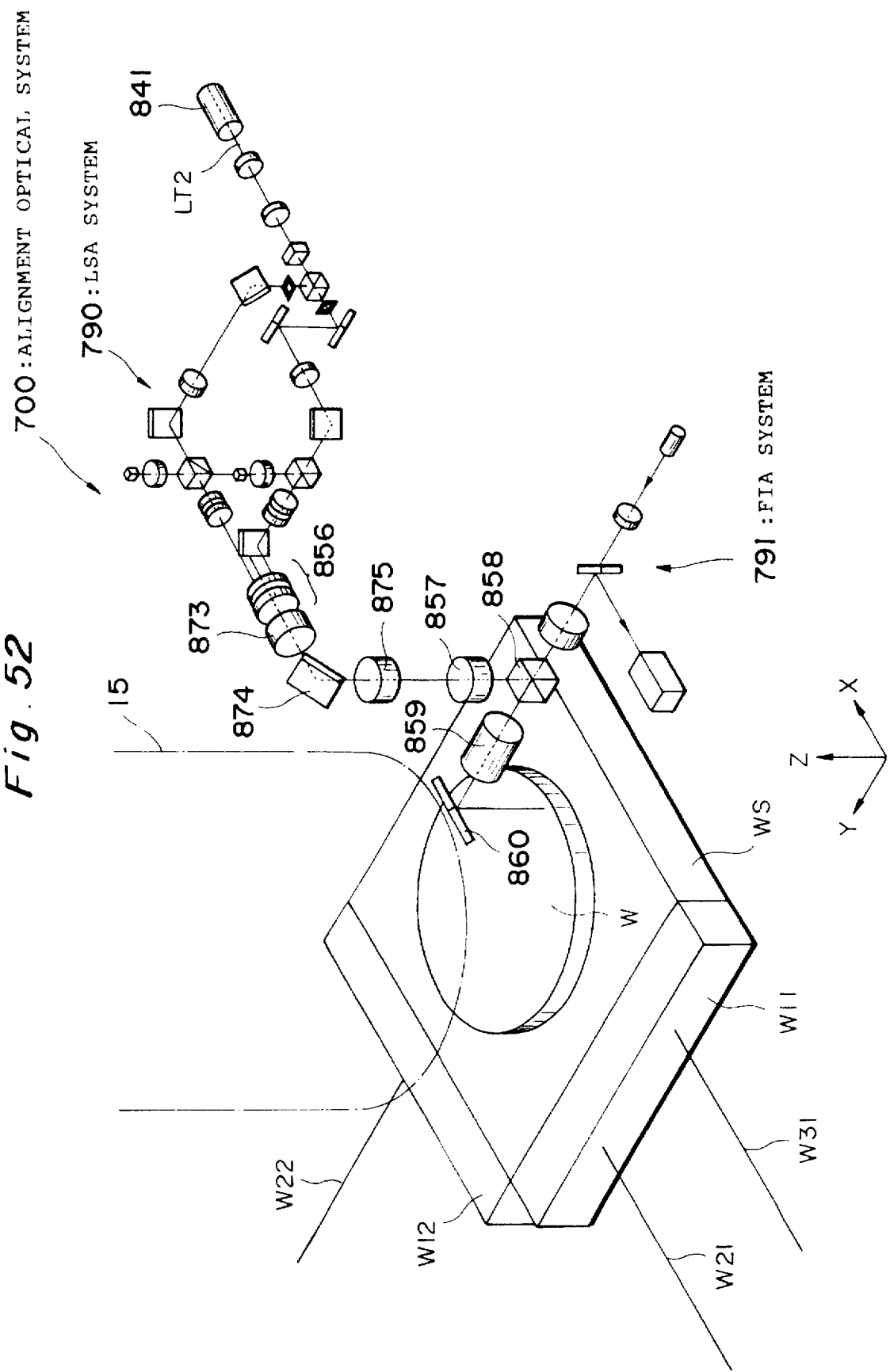
FIG. 52 is a perspective view showing a configuration of a main portion of a projection exposure apparatus provided with the sixth embodiment of the alignment apparatus in accordance with the present invention.
Figure 53:
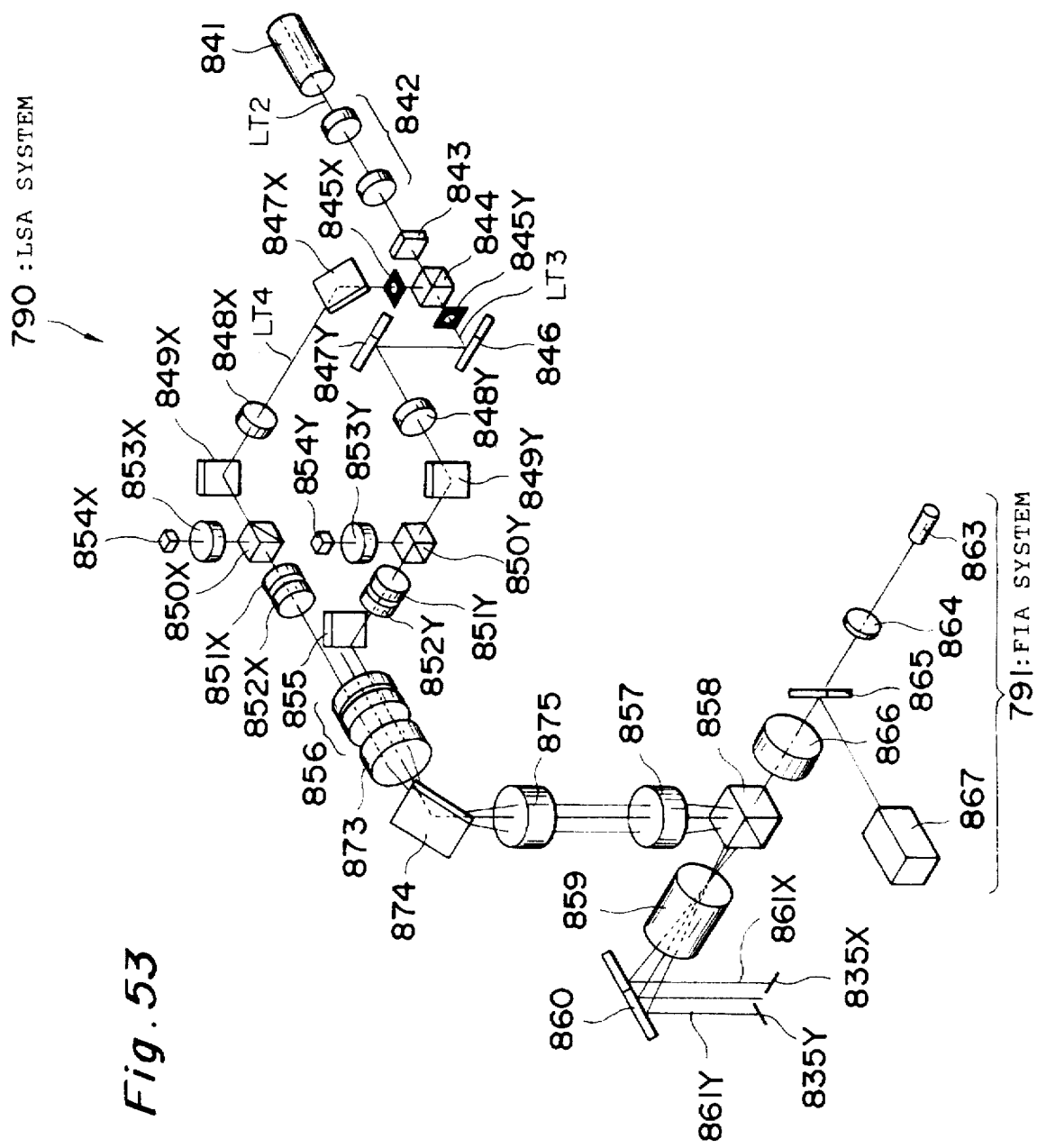
FIG. 53 is a perspective view showing a configuration of the alignment optical system in the alignment apparatus shown in FIG. 52.

FIG. 52 is a perspective view showing a schematic configuration of a projection exposure apparatus provided with an alignment apparatus to which the sixth embodiment of the present invention is applied. FIG. 53 is an enlarged perspective view showing a schematic configuration of the alignment apparatus shown in FIG. 52.

In the embodiment shown in FIG. 52, the present invention is applied to an illumination system of both off-axis type and LSA (laser step alignment) type provided with the projection exposure apparatus. In FIGS. 52 and 53, Z-axis is set in parallel to the optical axis of the projection optical system 16, while X-axis and Y-axis are set as directions orthogonal to each other within a plane perpendicular to the Z-axis.

In FIG. 52, an image of a pattern of a reticle (not depicted) is projected upon each shot area of a wafer W on a wafer stage WS by way of a projection optical system 16. To the upper portion of the wafer stage WS, a movable mirror W11 having a reflective surface perpendicular to the X-axis and a movable mirror W12 having a reflective surface perpendicular to the Y-axis are fixed. A laser beam W21 from an X-axis laser interferometer (not depicted) irradiates the movable mirror W11 along a line which passes through an optical axis of the projection optical system 16 and is in parallel to the X-axis.

Also, a laser beam W22 from a Y-axis laser interferometer (not depicted) irradiates the movable mirror W12 along a line which passes through the optical axis of the projection optical system 16 and is in parallel to the Y-axis. In this manner, these interferometers measure the amounts of movement of the wafer stage WS in the X- and Y-directions and, consequently, two-dimensional coordinates (X,Y) of the wafer WS in the XY-plane.

Beside the projection optical system 16, an alignment optical system 700 of an alignment apparatus of an off-axis type is disposed. This alignment optical system 700 comprises a laser step alignment type detection system 790 (referred to as "LSA" system in the following) and an FIA system 791 which is a detection system of an image-pickup type.

In the alignment optical system 700, a laser beam from the LSA system 790 and illumination light from the FIA system 791 are combined together by a half prism 858 so as to be directed to a common first objective lens 859. The luminous flux passing through the first objective lens 859 is reflected by a mirror to downward illuminate the wafer W.

Also, a non-depicted rotation detection laser interferometer supplies a laser beam W31 to the movable mirror W11 along a line which passes through the optical axis of the alignment optical system 700 bent by the above-mentioned mirror and is in parallel to the X-axis. Then, based on the difference between the value measured by the rotation detection laser interferometer and that measured by the X-axis laser interferometer, the rotation angle of the wafer stage within the XY-plane is detected.

In the LSA system 790 shown in FIG. 53, a laser beam LT2 emitted from a He—Ne laser source 841 passes through a beam expander 842 and a cylindrical lens 843 to reach an XY-separable polarizing beam splitter 844. By way of the polarizing beam splitter 844, the beam is divided into an X-axis sheet beam (i.e., linear beam) LT4 having a thin cross-section and a Y-axis sheet beam LT3. Then, by way of a field stop 845Y, a mirror 846, a mirror 847Y, a relay lens 848Y, and a mirror 849Y, the Y-axis sheet beam LT3 reaches a polarizing beam splitter 850Y for separating emitted and receiving light components. The sheet beam passing through the polarizing beam splitter 850Y enters an afocal optical system 856 by way of a Fourier transform lens 851Y, a ¼-wavelength plate 852Y, and a mirror 855.

On the other hand, substantially symmetrically to the Y-axis sheet beam LT3, by way of a field stop 845X to a ¼-wave plate 852X, the X-axis sheet beam LT4 is combined, in the visual field, with the Y-axis sheet beam LT3 near a plane which is conjugate with the surface of the wafer W (cf. FIG. 52) and then enters the substantially same-magnification Galilean afocal optical system 856. Both sheet beams output from the afocal optical system 856 pass through a relay lens 873, a mirror 874, and a relay lens 875 and then are converged by a second objective lens 857 so as to enter the half prism 858. Both sheet beams reflected by the half prism 858 intersect with each other and then, by way of the first objective lens 859 and the mirror 860, respectively form an X-axis sheet beam 861X and a Y-axis sheet beam 861Y on the wafer W. On the wafer W near positions where the sheet beams 861X and 861Y are incident, an X-axis wafer mark 835X and a Y-axis wafer mark 835Y are formed, respectively.

Also, in the FIA system 791, illumination light having a wide band emitted from a waveguide 863 such as an optical fiber is converged by a condenser lens 864 and then enters a half mirror 865. The illumination light passing through the half mirror 865 enters a half prism 868 by way of a second objective lens 866. The illumination light passing through the half prism 868 illuminates, by way of the first objective lens 859 and mirror 860 which are common with the LSA system, illuminate the X-axis wafer mark 835X and Y-axis wafer mark 835Y formed on the wafer W. The reflected light from the wafer W forms an image of the wafer mark on a CCD camera 867 by way of the mirror 860, the first objective lens 859, the half prism 868, the second objective lens 866, and the half mirror 865.

Figure 54:
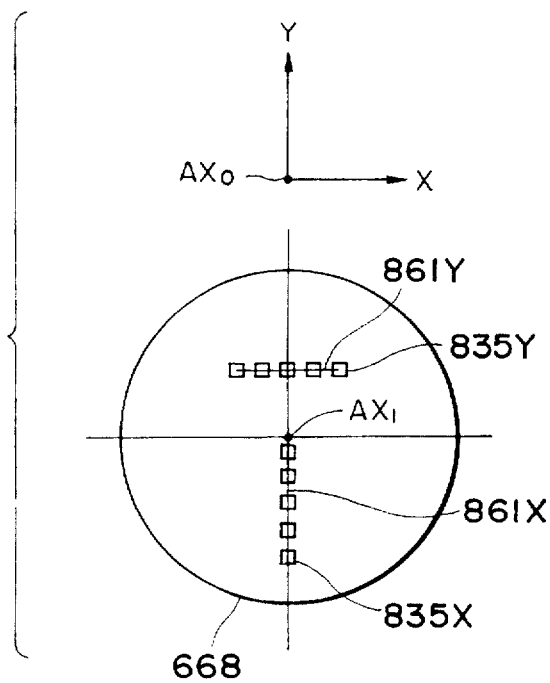
FIG. 54 is a view showing a relationship between a wafer mark and an irradiating sheet beam in the alignment optical system (i.e., enlarged plan view of the wafer surface) in the alignment optical system shown in FIG. 53.

FIG. 54 shows an observation field of the first objective lens 859 on the wafer W.

In FIG. 54, the X-axis wafer mark 835X comprises a dot pattern arranged in the Y-direction with a predetermined pitch, whereas the Y-axis wafer mark 835Y comprises a dot pattern arranged in the X-direction with a predetermined pitch. The X-axis sheet beam 861X is a light beam extending like a slit (i.e., linearly) in the Y-direction, whereas Y-axis sheet beam 861Y is a light beam extending like a slit in the X-direction. Also, these sheet beams 861X and 861Y are disposed so as to hold an optical axis $AX_1$ of the first objective lens 859 therebetween, while a line passing through the optical axis $AX_1$ of the first objective lens 859 and the optical axis $AX_0$ of the projection optical system 16 shown in FIG. 52 is in parallel to the Y-axis. In this drawing, 668 indicates a shot area on the wafer W according to the alignment light.

In FIG. 54, when the wafer stage WS is driven such that the wafer mark 835X is scanned in the X-direction with the sheet beam 861X, diffracted light is emitted in a predetermined direction when the sheet beam 861X coincides with the wafer mark 835X. Accordingly, when the X-coordinate of the wafer stage WS at the position where the intensity of the diffracted light becomes maximum is detected, the X-coordinate of the wafer mark 835X can be detected.

Similarly, when the wafer stage WS is driven such that the wafer mark 835Y is scanned with the sheet beam 861Y in the Y-direction, the diffracted light where the sheet beam 861Y coincides with the wafer mark 835Y can be detected, thereby yielding the Y-coordinate of the wafer mark 835Y.

The diffracted light (including the reflected light) from the wafer mark 835Y returns to the half prism 858 by way of the mirror 860 and first objective lens 859 shown in FIG. 53.

In FIG. 53, the diffracted light reflected by the half prism 858 returns, by way of the second objective lens 857, the afocal optical system 875, the mirror 874, the relay lens 873, the afocal optical system 856, the mirror 855, the ¼-wavelength plate 852Y, and the Fourier transform lens 851Y, to the polarizing beam splitter 850Y for separating emitted and receiving light components. The diffracted light reflected by the polarizing beam splitter 850Y is guided to a light-receiving device 854Y by way of a relay lens 853Y. At the light receiving device 854Y, the diffracted light components other than the zero-order diffracted light component are selectively subjected to photoelectric conversion. Here, when the direction of the ¼-wavelength plate 852Y is optimally adjusted, the diffracted light from the wafer mark is substantially completely reflected by the polarizing beam splitter 850Y so as to be directed to the light-receiving device 854Y.

Similarly, in a manner symmetrical to the Y-axis diffracted light, the diffracted light from the X-axis wafer mark 835X shown in FIG. 54 returns to a polarizing beam splitter 850X for separating emitted and receiving light components. The diffracted light reflected by the polarizing beam splitter 850X is received by a light-receiving device 854X by way of a relay lens 853X.

In this manner, based on the output signals from the light-receiving devices 854X and 854Y and the coordinates of the wafer stage WS, the X- and Y-coordinates of the wafer marks 835X and 835Y are measured. Then, based on the results of the measurement, the wafer w is aligned (i.e., positioned).

Here, the afocal optical system 856 is configured such that it can be unitedly shifted in an arbitrary direction perpendicular to the optical axis with an arbitrary amount within a predetermined range.

In the following, with reference to FIGS. 41 to 43 mentioned above, a brief explanation will be provided for problems which may occur when asymmetric aberration is generated in cases where the laser beam LT2 emitted from the He—Ne laser source 841 is repeatedly relayed as in the case of the embodiment shown in FIG. 52. First, the relay of a laser beam can be regarded as the relay of the beam waist (i.e., position where the cross section is the smallest) of the laser beam.

FIGS. 41 to 43 are views explaining the influence of asymmetric aberration when the beam waist of the laser beam is relayed by an optical system.

As shown in FIG. 41, the beam expander 842 comprises two sheets of Fourier transform lenses 662 and 663. Accordingly, a beam waist 664A of the input laser beam is relayed to a beam waist 664B by the first Fourier transform lens 662. This beam waist 664B is relayed to a beam waist 664C by the second Fourier transform lens 663.

In this connection, FIG. 42 is an enlarged view in the proximity of a beam waist 665A which is relayed by an ideal lens. It also shows a line 666A where the energy of the beam cross section is maximized in the proximity of the beam waist 665A.

As depicted, when the beam waist is relayed by the ideal lens, the line 666A is linearly distributed in front and behind of the beam waist.

However, as shown in FIG. 43, when an eccentric asymmetrical aberration, for example, is generated in the relay lens, a line 666B where the energy of the beam cross section is maximized in the proximity of a beam waist 665B is warped in front and behind of the beam waist 665B. The amount of this warping is substantially proportional to the amount of asymmetric aberration.

Similarly, the sheet beams 835X and 835Y irradiating the wafer from the first objective lens 859 in FIG. 53 substantially become beam waists. Accordingly, if eccentric asymmetrical aberration is generated in the sheet beams 835X and 835Y, the lines in the sheet beams 835X and 835Y where the energy distribution is maximized will be warped.

Such warping of the line where the energy distribution is maximized becomes influential to the accuracy in alignment when the wafer marks 835X and 835Y in FIG. 54 deviate (i.e., are defocused) from the converging points of the sheet beams 861X and 861Y in a direction (i.e., Z-direction) perpendicular to the paper surface of FIG. 54. Namely, when there is no warping in the energy distribution, in order to prevent the positions where the wafer marks 835X and 835Y are detected from deviating when defocused, it is sufficient for the line where the energy distribution becomes maximum to be made perpendicular to the wafer. For this purpose, in FIG. 53, for example, it is sufficient for a plane parallel plate to be disposed, with inclination by an appropriate angle, between the second objective lens 857 and the first objective lens 859.

However, in cases where there is warping in the line where the energy distribution becomes maximum, even when the plane parallel plate is inclined with an appropriate angle, the line where the energy distribution becomes maximum cannot be made perpendicular to the wafer. As a result, when the wafer marks 835X and 835Y are slightly deviated (i.e., defocused) in the Z-direction from the converging points, the positions where the wafer marks 835X and 835Y are detected laterally deviate, thereby generating errors in alignment.

Therefore, it is necessary for such warping of the energy distribution to be eliminated. Thus, the asymmetric aberration, which causes such warping, should be substantially nullified.

Figure 55:
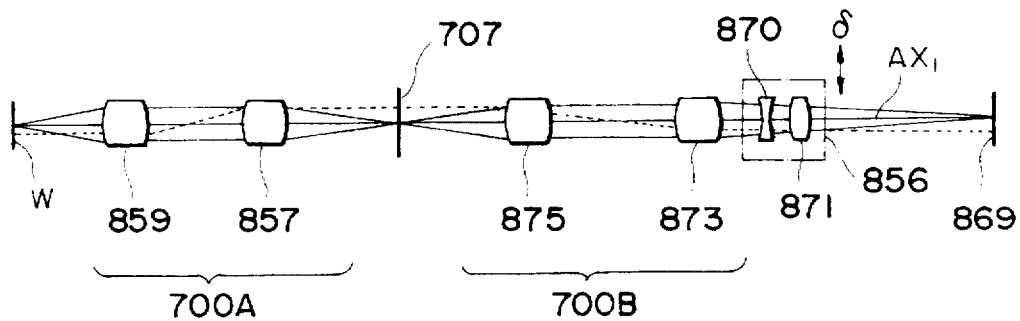
FIG. 55 is a view showing an image-forming relationship of a light-emitting system within the alignment optical system shown in FIG. 53.

FIG. 55 is an optical path chart of the light-emitting system from the afocal optical system 856 to the wafer W in the LSA system 790 shown in FIG. 53. In FIG. 55, a combination optical system composed of the first objective lens 859, the second objective lens 857, the relay lens 875, the relay lens 873, and the afocal optical system 856, which is the correction optical system, forms a both-side telecentric optical system. The focal length of the second objective lens 857 is set longer than that of the first objective lens 859.

The afocal optical lens system 856 comprises, in the following order from the side of the second objective lens 857, a lens group 870 having a negative refractive index and a lens group 871 having a positive refractive index. Also, the object-side focal plane of the first objective lens 859 coincides with the surface of the wafer W, while an image-side focal plane 869 of the combination optical system becomes a plane which is conjugate with the surface of the wafer W. Accordingly, a sheet beam guided to the image-side focal plane 869 which is conjugate with the surface of the wafer W is reduced and converged on the surface of the wafer surface.

In the embodiment shown in FIG. 55, the aberrations of the first objective lens 859, second objective lens 857, and relay lens 875 are corrected so as to substantially approximate an ideal lens. On the other hand, an appropriate amount of asymmetric aberration generated at the relay lens 873 and that generated at the afocal optical system 856 are corrected so as to substantially cancel each other on the surface of the wafer W. Also, the afocal optical system 856 is disposed in a telecentric space between the relay lens 873 and the image-side focal plane 869. Thus, the light-emitting system shown in FIG. 55 is equivalent to a case where the image-forming optical system in the embodiment shown in FIG. 48 is used as a light-emitting system and, accordingly, the configuration and effects of the former are similar to those of the latter.

In the light-emitting system shown in FIG. 55, asymmetric aberration may occur on the surface of the wafer W due to errors in manufacture of the first objective lens 859 and the like. In this case, the afocal optical system 856 can be shifted in an appropriate direction perpendicular to the optical axis $AX_1$ by an appropriate amount, thereby cancelling the asymmetric aberration. Accordingly, the sheet beam converged on the wafer W in this embodiment is supposed to be an ideal beam having no warping in the line where the energy distribution is maximized.

Also, in the embodiment shown in FIG. 53, as shown in FIG. 39 mentioned above, the amount of eccentric asymmetrical aberration ΔHC generated on the wafer w is proportional to the amount of shift δ in the afocal optical system 856. Further, since its gradient ΔHC/δ is proportional to the amount of offset asymmetric aberration ΔC, when the amount of offset asymmetric aberration ΔC is appropriately set and the afocal optical system 856 is shifted in an appropriate direction by an appropriate amount, a desirable eccentric asymmetrical aberration can be generated. Assuming that the amount of asymmetric aberration which is offset by the relay lens 863 and the afocal optical system 856 against each other is ΔC and the constant of functionality is $k_1$, the relationship between the eccentric asymmetrical aberration ΔHC to be generated and the amount of shift δ in the afocal optical system 856 satisfies the above-mentioned expression (1) or (4) as in the case of the foregoing embodiments. Accordingly, as shown in FIG. 40, as in the case of the foregoing embodiments, ΔHC/δ is proportional to ΔC in this embodiment as well.

Here, the configuration of the decentering mechanism for making the afocal optical system 856, which is the correction optical system, eccentric is similar to that in the first embodiment (FIGS. 24 and 30) of the optical system shown in accordance with the present invention.

In the embodiment shown in FIG. 53, the substantially same-magnification afocal optical system 856 is used as a correction optical system. However, in place of the substantially same-magnification afocal optical system 856, an afocal optical system having an angular magnification α (which indicates a reducing magnification with respect to the surface of the wafer W) or a lens having a refractive power, for example, may be used.

Also, in the embodiment shown in FIG. 53, the afocal optical system 856 is disposed in a telecentric space. However, the afocal optical system 856 may be disposed in a non-telecentric space under a predetermined condition.

Further, the optical system shown in FIG. 53 corrects the warping of the line where the energy distribution at the time of irradiation of a laser beam is maximized. However, the optical system of the present invention can also be applied, for example, to correction of asymmetric aberration which may disturb the spot form of the converged laser beam. Further, in addition to the alignment optical system, when the present invention is applied to overlay accuracy measurement systems for wafer-mark, accuracy in the results of measurement is expected to increase. In particular, when an FIA system is used as in the case of the first and second embodiments, deviation of the true value in overlay accuracy measurement (so-called "TIS") can be substantially nullified when the present invention is applied.

It is needless to state that, without being restricted to the above-mentioned embodiments, the present invention can be configured in various manners as long as they do not deviate from the gist of the invention.

As explained in the foregoing, in the fourth to sixth embodiments of the optical system in accordance with the present invention, asymmetric aberration generated within the whole optical system due to errors in manufacture and the like can be easily corrected in a simple lens configuration without hardly influencing other kinds of aberration.

Also, in an alignment apparatus to which the optical system of the present invention is applied, asymmetric aberration can be corrected in a simple configuration without hardly influencing other kinds of aberration, thereby detecting the position of an alignment mark with a high accuracy.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

The basic Japanese Application Nos. 003856/1995 (7-003856) filed on Jan. 13, 1995, 222677/1995 (7-222677) filed on Aug. 8, 1995, and 303932/1995 (7-303932) filed on Oct. 27, 1995, are hereby incorporated by reference.

What is claimed is:

1. An inspection apparatus for specifying at least one of an aberration condition and an optical adjustment condition of an optical system to be inspected, said optical system being provided between a first surface and a second surface and used for projecting an image of a pattern on said first surface onto said second surface, said inspection apparatus comprising:

a defocus mechanism for defocusing the image of the pattern on said first surface, which is to be formed on said second surface through said optical system to be inspected, from a best focus condition of the image on said second surface by a predetermined defocus amount;

a detector for detecting the image formed on said second surface under a predetermined focus condition; and an inspection unit for calculating a change in image position on said second surface within a predetermined defocus range, based on information concerning respective positions of a plurality of images detected by said detector under focus conditions different from each other, said plurality of images being formed on said second surface through said optical system to be inspected.

2. An inspection apparatus according to claim 1, wherein said inspection unit includes a calculator for calculating a measurement line which indicates a relationship between the amount of defocus and an image position corresponding thereto, based on information concerning the respective positions of said images on said second surface under at least three kinds of the focus conditions different from each other.

3. An inspection apparatus according to claim 1, wherein said inspection unit includes a calculator performing the steps of:

calculating, for each of a plurality of patterns on said first surface having forms different from each other, a change in image position on said second surface; and specifying the aberration condition and optical adjustment condition of said optical system to be inspected, based on a difference in the change in image position on said second surface between the respective patterns.

4. An inspection apparatus according to claim 1, wherein said defocus mechanism includes a control system for moving at least one of the pattern on said first surface, said optical system to be inspected, at least one of optical elements of said optical system to be inspected, and said detector along an optical axis of said optical system to be inspected.

5. An inspection apparatus according to claim 1, further comprising a sensitivity control mechanism for controlling inspection sensitivity of said inspection apparatus.

6. A projection exposure apparatus comprising:

an illumination optical system for illuminating a mask on which a predetermined pattern is formed with exposure light having a predetermined wavelength;

a projection optical system provided between said mask and a photosensitive substrate, for transferring an image of the pattern on said mask onto said substrate;

an inspection apparatus for specifying at least one of an aberration condition of said projection optical system and respective optical adjustment conditions of said projection optical system and said illumination optical system, said inspection apparatus comprising:

a defocus mechanism for defocusing the image of the pattern on said mask, which is to be formed on a major surface of said substrate through at least said projection optical system, from a best focus condition of the image on said major surface of said substrate by a predetermined defocus amount;

a detector for detecting the image formed on said major surface of said substrate under a predetermined focus condition; and an inspection unit for calculating a change in image position on said major surface of said substrate within a predetermined defocus range, based on information concerning respective positions of a plurality of images detected by said detector under focus conditions different from each other, said plurality of images being formed on said major surface of said substrate through at least said projection optical system;

an aberration correction mechanism for correcting the aberration of said projection optical system, based on the aberration condition of said projection optical system detected by said inspection apparatus; and an optical adjustment mechanism for performing optical adjustments of said illumination optical system and said projection optical system, based on the respective optical adjustment conditions of said illumination optical system and said projection optical system specified by said inspection apparatus.

7. A projection exposure apparatus comprising:

an illumination optical system for illuminating a mask on which a predetermined pattern is formed with exposure light having a predetermined wavelength;

a projection optical system between said mask and a photosensitive substrate, for transferring an image of the pattern on said mask onto said substrate;

an alignment apparatus for positioning said substrate, said alignment apparatus comprising a mark illumination optical system for illuminating an alignment mark formed on said substrate and a mark detection optical system for detecting light from the alignment mark;

an inspection apparatus for specifying at least one of an aberration condition of said mark detection optical system and respective optical adjustment conditions of said mark illumination optical system and said mark detection optical system, said inspection apparatus comprising:

a detector for detecting the image of the alignment mark formed on a detection surface thereof under a predetermined focus condition;

a defocus mechanism for defocusing the image of the alignment mark, which is to be formed on the detection surface of said detector through at least said mark detection optical system, from a best focus condition of the image on said detection surface of said detector by a predetermined defocus amount; and an inspection unit for calculating a change in image position on said detection surface of said detector within a predetermined defocus range, based on information concerning respective positions of a plurality of images detected by said detector under focus conditions different from each other, said plurality of images being formed on said detection surface of said detector through at least said mark detection optic system;

an aberration correction mechanism for correcting the aberration of said mark detection optical system, based on the aberration condition of said mark detection optical system detected by said inspection apparatus; and an optical adjustment mechanism for performing optical adjustments of said mark illumination optical system and said mark detection optical system, based on the respective optical adjustment conditions of said mark illumination optical system and said mark detection optical system specified by said inspection apparatus.

8. An overlay accuracy measurement apparatus for measuring an overlay accuracy of a pattern formed on a photosensitive substrate to be exposed with exposure light having a predetermined wavelength, said measurement apparatus comprising:

a mark illumination optical system for illuminating the mark on said substrate;

a mark detection optical system for detecting light from the mark on said substrate;

an inspection apparatus for specifying at least one of an aberration condition of said mark detection optical system and respective optical adjustment conditions of said mark illumination optical system and said mark detection optical system, said inspection apparatus comprising:

a detector for detecting the image formed on a detection surface thereof under a predetermined focus condition;

a defocus mechanism for defocusing the image of the mark on said substrate, which is to be formed on said detection surface of said detector through at least said mark detection optical system, from a best focus condition of the image on said detection surface of said detector by a predetermined defocus amount; and an inspection unit for calculating a change in image position on said detection surface of said detector within a predetermined defocus range, based on information concerning respective positions of a plurality of images detected by said detector under focus conditions different from each other, said plurality of images being formed on said detection surface of said detector through at least said mark detection optical system;

an aberration correction mechanism for correcting the aberration of said mark detection optical system, based on the aberration condition of said mark detection optical system detected by said inspection apparatus; and an optical adjustment mechanism for performing optical adjustments of said mark illumination optical system and said mark detection optical system, based on the respective optical adjustment conditions of said mark illumination optical system and said mark detection optical system specified by said inspection apparatus.

9. A projection exposure apparatus comprising:

an illumination optical system for illuminating a mask on which a predetermined pattern is formed with exposure light having a predetermined wavelength;

a projection optical system for transferring an image of the pattern on said mask to a photosensitive substrate; and an overlay accuracy measurement apparatus for measuring an overlay accuracy of a mark formed on said substrate to be exposed with exposure light having a predetermined wavelength, said measurement apparatus, comprising:

a mark illumination optical system for illuminating the mark on said substrate;

a mark detection optical system for detecting light from the mark on said substrate;

an inspection apparatus for specifying at least one of an aberration condition of said mark detection optical system and respective optical adjustment conditions of said mark illumination optical system and said mark detection optical system, said inspection apparatus comprising:

a detector for detecting the image formed on a detection surface thereof under a predetermined condition;

a defocus mechanism for defocusing the image of the mark on said substrate, which is to be formed on said detection surface of said detector through at least said mark detection optical system, from a best focus condition of the image an said detection surface of said detector by a predetermined defocus amount; and an inspection unit for calculating a chance in image position on said detection surface of said detector within a predetermined defocus range, based on information concerning respective positions of a plurality of images detected by said detector under focus conditions different from each other, said plurality of images being formed on said detection surface of said detector through at least said mark detection optical system;

an aberration correction mechanism for correcting the aberration of said mark detection optical system, based on the aberration condition of said mark detection optical system detected by said inspection apparatus; and an optical adjustment mechanism for performing optical adjustments of said mark illumination optical system and said mark detection optical system, based on the respective optical adjustment conditions of said mark illumination optical system and said mark detection optical system specified by said inspection apparatus.

10. An inspection method for specifying at least one of an aberration condition and an optical adjustment condition of an optical system to be inspected, said optical system including a system provided between a first surface and a second surface, for projecting an image of a pattern formed on said first surface onto said second surface, said method comprising the steps of:

defocusing the image of the pattern on said first surface, which is to be formed on said second surface through said optical system to be inspected, from a best focus condition on the image on said second surface by a predetermined defocus amount;

detecting the image formed on said second surface under a predetermined focus condition; and then calculating a change in image position on said second surface within a predetermined defocus range, based on information concerning respective positions of a plurality of images detected on said second surface under focus conditions different from each other, said plurality of images being formed on said second surface through said optical system to be inspected.

11. An inspection method according to claim 10, wherein said method comprises the step of calculating a measurement line which indicates a relationship between the amount of defocus and an image position corresponding thereto, based on information concerning the respective positions of said images on said second surface under at least three kinds of focus conditions different from each other.

12. An inspection method according to claim 11, wherein said method comprises the steps of:
specifying a peak point on said measurement line within the defocus range where curvature of said measurement line is maximized; and
calculating the magnitude of adjustment of the optical adjustment condition in said optical system to be inspected, based on gradient of a tangential line passing through the peak point on said measurement line.

13. An inspection method according to claim 11, wherein said method comprises the steps of:
specifying a peak point on said measurement line within the defocus range where curvature of said measurement line is maximized;
calculating a maximum clearance between said measurement line and a tangential line passing through the peak point on said measurement line; and
calculating an amount of asymmetric aberration of said optical system to be inspected, based on the obtained maximum clearance.

14. An inspection method according to claim 11, wherein said method comprises the steps of:
calculating an approximation line approximating said measurement line; and
calculating the magnitude of adjustment of the optical adjustment condition in said optical system to be inspected, based on gradient of said approximation line of said measurement line.

15. An inspection method according to claim 11, wherein said method comprises the steps of:
specifying a peak point on said measurement line within the defocus range where curvature of said measurement line is maximized;
calculating an approximation line approximating said measurement line; and
calculating an amount of asymmetric aberration of said optical system to be inspected, based on a distance between said approximation line and the peak point on said measurement line.

16. An inspection method according to claim 11, wherein said method comprises the steps of:
specifying a peak point on said measurement line within the defocus range where curvature of said measurement line is maximized; and
calculating an amount of symmetric aberration of said optical system to be inspected, based on a defocus amount in the peak point on said measurement line.

17. An inspection method according to claim 10, wherein said method comprises the step of moving at least one of said first surface, said optical system to be inspected, at least one of optical elements of said optical system to be inspected, and said second surface along an optical axis of said optical system to be inspected, whereby defocusing the image to be formed on said second surface from the best focus condition by the predetermined defocus amount.

18. An inspection method according to claim 10, wherein said method comprises the steps of:
calculating, for each of a plurality of patterns on said first surface having forms different from each other, a change in image position on said second surface; and
specifying the aberration condition and optical adjustment condition of said optical system to be inspected, based on a difference in the change in image position on said second surface between the respective patterns.

19. An inspection apparatus for specifying at least one of an aberration condition and an optical adjustment condition of an optical system to be inspected, said optical system including at least a system for converging a supplied luminous flux on a predetermined surface, said inspection apparatus comprising:
a detector for detecting, on a predetermined detection surface thereof, a converged luminous flux of said luminous flux guided through said optical system to be inspected;
a defocus mechanism for defocusing a point of convergence of said converged luminous flux by a predetermined defocus amount with respect to the detection surface of said detector; and
an inspection unit for calculating a change in position of the converged luminous flux on said detection surface of said detector within a predetermined defocus range, based on information concerning respective positions of a plurality of converged luminous fluxes on said detection surface of said detector under focus conditions different from each other, said plurality of converged luminous fluxes being guided onto said detection surface of said detector through said optical system to be inspected.

20. An inspection apparatus according to claim 19, wherein said inspection unit includes a calculator for calculating a measurement line which indicates a relationship between the amount of defocus and a position of said converged luminous flux corresponding thereto, based on information concerning the respective positions of the converged luminous fluxes on said second surface under at least three kinds of focus conditions different from each other.

21. An inspection method according to claim 19, wherein said inspection unit includes a calculator performing the steps of:
calculating, for each of said plurality of luminous fluxes on said detection surface, a change in the position of the converged luminous flux on said detection surface, said plurality of luminous fluxes being supplied to said optical system to be inspected and having cross-sectional formes different from each other; and
specifying the aberration condition and optical adjustment condition of said optical system to be inspected, based on a difference in the change in the position of the converged luminous flux on said detection surface between the respective luminous fluxes.

22. An inspection apparatus according to claim 19, wherein said defocus mechanism includes a control system for moving at least one of a light source for supplying said luminous flux to said optical system to be inspected, said optical system to be inspected, at least one of optical elements of said optical system to be inspected, and said detector along an optical axis of said optical system to be inspected.

23. An inspection apparatus according to claim 19, further comprising a sensitivity control mechanism for controlling inspection sensitivity of said inspection apparatus.

24. A projection exposure apparatus comprising:
an illumination optical system for illuminating a mask on which a predetermined pattern is formed with exposure light having a predetermined wavelength;
a projection optical system provided between said mask and a photosensitive substrate, for transferring an image of the pattern on said mask onto said substrate;

an inspection apparatus for specifying at least one of an aberration condition of said projection optical system and said respective optical adjustment conditions of said projection optical system and illumination optical system, said optical system including at least a system for converging a supplied luminous flux on redetermined surface and comprising:

a detector for detecting, on a predetermined detection surface thereof, a converged luminous flux of said luminous flux guided through said projection optical system to be inspected;

a defocus mechanism for defocusing a point of convergence of said converged luminous flux by a predetermined defocus amount with respect to the detection surface of said detector; and an inspection unit for calculating a change in position of the converged luminous flux on said detection surface of said detector within a predetermined defocus range, based on information concerning respective positions of a plurality of converged luminous fluxes on said detection surface of said detector under focus conditions different from each other, said plurality of converged luminous fluxes being guided onto said detection surface of said detector through said projection optical system to be inspected;

an aberration correction mechanism for correcting the aberration of said projection optical system, based on the aberration condition of said projection optical system detected by said inspection apparatus; and an optical adjustment mechanism for performing optical adjustments of said illumination optical system and said projection optical system, based on the respective optical adjustment conditions of said illumination optical system and said projection optical system specified by said inspection apparatus.

25. A projection exposure apparatus comprising:

an illumination optical system for illuminating a mask on which a predetermined pattern is formed with exposure light having a predetermined wavelength;

a projection optical system provided between said mask and a photosensitive substrate, for transferring an image of the pattern on said mask to a photosensitive substrate;

an alignment apparatus for positioning said substrate, said alignment apparatus comprising a mark illumination optical system for illuminating an alignment mark formed on said photosensitive substrate and a mark detection optical system for detecting light from said alignment mark on said substrate;

an inspection apparatus for specifying at least one of an aberration condition of said mark detection optical system and respective optical adjustment conditions of said mark illumination optical system and said mark detection optical system, said optical system including at least a system for converging a supplied luminous flux on a redetermined surface and comprising:

a detector for detecting, on a predetermined detection surface thereof, a converged luminous flux of said luminous flux guided through at least said mark detection optical system;

a defocus mechanism for defocusing a point of convergence of said converged luminous flux by a predetermined defocus amount with respect to the detection surface of said detector; and an inspection unit for calculating a change in position of the converged luminous flux on said detection surface of said detector within a predetermined defocus range, based on information concerning respective positions of a plurality of converged luminous fluxes on said detection surface of said detector under focus conditions different from each other, said plurality of converged luminous fluxes being guided onto said detection surface of said detector through at least said mark detection optical system to be inspected;

an aberration correction mechanism for correcting the aberration of said mark detection optical system, based on the aberration condition of said mark detection optical system detected by said inspection apparatus; and an optical adjustment mechanism for performing optical adjustment of said mark illumination optical system and said mark detection optical system, based on the respective optical adjustment conditions of said mark illumination optical system and said mark detection optical system specified by said inspection apparatus.

26. An overlay accuracy measurement apparatus for measuring an overlay accuracy of a mark formed on a photosensitive substrate to be exposed with exposure light having a predetermined wavelength, said measurement apparatus comprising:

a mark illumination optical system for illuminating the mark on said substrate;

a mark detection optical system for detecting light from the mark on said substrate;

an inspection apparatus for specifying at least one of an aberration condition of said mark detection optical system and respective optical adjustment conditions of said mark illumination optical system and said mark detection optical system, said optical system including at least a system for converging a supplied luminous flux on a predetermined surface and comprising:

a detector for detecting, on a predetermined detection surface thereof, a converged luminous flux of said luminous flux guided through at least said mark detection optical system;

a defocus mechanism for defocusing a point of convergence of said converged luminous flux by a predetermined defocus amount with respect to the detection surface of said detector; and an inspection unit for calculating a change in position of the converged luminous flux on said detection surface of said detector within a predetermined defocus range, based on information concerning respective positions of a plurality of converged luminous fluxes on said detection surface of said detector under focus conditions different from each other, said plurality of converged luminous fluxes being guided onto said detection surface of said detector through at least said mark detection optical system to be inspected;

an aberration correction mechanism for correcting the aberration of said mark detection optical system, based on the aberration condition of said mark detection optical system detected by said inspection apparatus; and an optical adjustment mechanism for performing optical adjustments of said mark illumination optical system and said mark detection optical system, based on the respective optical adjustment conditions of said mark illumination optical system and said mark detection optical system specified by said inspection apparatus.

27. A projection exposure apparatus comprising:

an illumination optical system for illuminating a mask on which a predetermined pattern is formed with exposure light having a predetermined wavelength;

a projection optical system for transferring an image of the pattern on said mask to a photosensitive substrate; and an overlay accuracy measurement apparatus for measuring an overlay accuracy of a mark formed on a photosensitive substrate to be exposed with exposure light having a predetermined wavelength, said measurement apparatus comprising:

a mark illumination optical system for illuminating the mark on said substrate;

a mark detection optical system for detecting light from the mark on said substrate;

an inspection apparatus for specifying at least one of an aberration condition of said mark detection optical system and respective optical adjustment conditions of said mark illumination optical system and said mark detection optical system, said optical system including at least a system for converging a supplied luminous flux on a predetermined surface and comprising:

a detector for detecting, on a predetermined detection surface thereof, a converged luminous flux of said luminous flux guided through at least said mark detection optical system;

a defocus mechanism for defocusing a point of convergence of said converged luminous flux by a predetermined defocus amount with respect to the detection surface of said detector; and an inspection unit for calculating a change in position of the converged luminous flux on said detection surface of said detector within a predetermined defocus range, based on information concerning respective positions of a plurality o converged luminous fluxes on said detection surface of said detector under focus conditions different from each other, said plurality of converged luminous fluxes being guided onto said detection surface of said detector through at least said mark detection optical system to be inspected;

an aberration correction mechanism for correcting the aberration of said mark detection optical system, based on the aberration condition of said mark detection optical system detected by said inspection apparatus; and an optical adjustment mechanism for performing optical adjustments of said mark illumination optical system and said mark detection optical system, based on the respective optical adjustment conditions of said mark illumination optical system detected by said inspection apparatus.

28. An inspection method for specifying at least one of an aberration condition and an optical adjustment condition of an optical system to be inspected, said optical system including at least a system for converging a supplied luminous flux on a predetermined surface, said method comprising the steps of:

defocusing, with respect to a predetermined detection surface for detecting a converged luminous flux of said luminous flux guided through said optical system to be inspected, a point of convergence of said converged luminous flux by a predetermined defocus amount;

detecting, on said detection surface, a converged luminous flux under a predetermined focus condition; and calculating a change in the position of converged luminous flux on said detection surface within a predetermined defocus range, based on information concerning respective positions of a plurality of said converged luminous fluxes on said detection surface under focus conditions different from each other, said plurality of converged luminous fluxes being guided through said optical system to be inspected.

29. An inspection method according to claim 28, wherein said method comprises the step of calculating a measurement line which indicates a relationship between the amount of defocus and a position of the converged luminous flux corresponding thereto, based on information concerning the respective positions of said converged luminous fluxes on said detection surface under at least three kinds of focus conditions different from each other.

30. An inspection method according to claim 29, wherein said method comprises the steps of:

specifying a peak point on said measurement line within the defocus range where curvature of said measurement line is maximized and then calculating a magnitude of adjustment of the optical adjustment condition in said optical system to be inspected, based on gradient of a tangential line passing through the peak point on said measurement line.

31. An inspection method according to claim 29, wherein said method comprises the steps of:

specifying a peak point on said measurement line within the defocus range where curvature of said measurement line is maximized;

calculating a maximum clearance between said measurement line and a tangential line passing through the peak point on said measurement line; and calculating an amount of asymmetric aberration of said optical system to be inspected, based on the obtained maximum clearance.

32. An inspection method according to claim 29, wherein said method comprises the steps of:

calculating an approximation line approximating said measurement line; and calculating the magnitude of adjustment of the optical adjustment condition in said optical system to be inspected, based on gradient of said approximation line of said measurement line.

33. An inspection method according to claim 29, wherein said method comprises the steps of:

specifying a peak point on said measurement line within the defocus range where curvature of said measurement line is maximized;

calculating an approximation line approximating said measurement line; and calculating an amount of asymmetric aberration of said optical system to be inspected, based on a distance between said approximation line and the peak point on said measurement line.

34. An inspection method according to claim 29, wherein said method comprises the steps of:

specifying a peak point on said measurement line within the defocus range where curvature of said measurement line is maximized; and calculating an amount of symmetric aberration of said optical system to be inspected, based on a defocus amount at the peak point on said measurement line.

35. An inspection method according to claim 28, wherein said method comprises the step of moving at least one of a light source for supplying the luminous flux to said optical system to be inspected, said optical system to be inspected, at least one of optical elements of said optical system to be inspected, and said detection surface along an optical axis of said optical system to be inspected, whereby defocusing the point of convergence of said converged luminous flux with respect to said detection surface from the best focus condition by the predetermined defocus amount.

36. An inspection method according to claim 28, wherein said method comprises the steps of:
   supplying a plurality of luminous fluxes having cross-sectional forms different from each other to said optical system to be inspected;
   calculating, for each of said plurality of luminous fluxes on said detection surface, a change in the position of the converged luminous flux on said detection surface; and
   specifying the aberration condition and optical adjustment condition of said optical system to be inspected, based on a difference in the change in the position of the converged luminous flux on said detection surface between the respective luminous fluxes.

37. An inspection apparatus for specifying at least one of an aberration condition and an optical adjustment condition of an optical system to be inspected, said inspection apparatus comprising:
   a detector for detecting, on a predetermined detection surface thereof, an image of a phase pattern formed through said optical system to be inspected;
   a defocus mechanism for defocusing the image to be formed on said detection surface of said detector, from a best focus condition of the image on said detection surface of said detector by a predetermined defocus amount; and
   an inspection unit for calculating a change in image asymmetry on said detection surface within a predetermined defocus range, based on information concerning respective asymmetry characteristics of a plurality of images detected by said detector under focus conditions different from each other, said plurality of images being formed on said detection surface of said detector through said optical system to be inspected.

38. An inspection apparatus according to claim 37, wherein said inspection unit includes a signal processor for detecting, for each of measurement points arranged in a predetermined measurement direction on said detection surface, a signal $\Sigma V$ which is an integrated signal of individual signals $V$ corresponding to a light intensity of the image of said phase pattern which are measured at respective measurement points arranged in a direction which is different from said measurement direction and a calculator for calculating, based on a relationship between said measurement direction and said integrated signal, asymmetry index $\beta$ of the image formed on said detection surface according to the following expression:

$$\beta = (1/n) \sum_{i=1}^{n} \{(V_{iL} - V_{iR})/(V_{max} - V_{min})\}$$

wherein:
   n: number of periodicity of said integrated signal with respect to said measurement direction;
   $V_{iL}$: first obtained minimum signal value with respect to said measurement direction, which is a minimum signal at i-th period of said integrated signal;
   $V_{iR}$: last obtained minimum signal value with respect to said measurement direction, which is a minimum signal at i-th period of said integrated signal;
   $V_{max}$: maximum value of said integrated signal, with respect to said measurement direction, in the whole measurement area; and
   $V_{min}$: minimum value of said integrated signal, with respect to the measurement direction, in the whole measurement area.

39. An inspection apparatus according to claim 37, wherein said inspection unit includes a calculation means for calculating, based on information concerning the respective asymmetry characteristics of the images on said detection surface under at least two kinds of focus conditions different from each other, a measurement line which indicates a relationship between the amount of defocus and the asymmetry index of the image corresponding thereto.

40. An inspection method according to claim 37, wherein said inspection unit includes a calculator performing the steps of:
   calculating, for each of a plurality of phase patterns having forms different from each other, a change in image asymmetry on said detection surface on the predetermined defocus range; and
   specifying the aberration condition and optical adjustment condition of said optical system to be inspected, based on a difference in change in image asymmetry on said detection surface between said phase patterns.

41. An inspection apparatus according to claim 37, wherein said defocus mechanism includes a control system for moving at least one of said phase pattern, said optical system to be inspected, at least one of optical elements of said optical system to be inspected, and said detector along an optical axis of said optical system to be inspected.

42. An inspection apparatus according to claim 37, further comprising a sensitivity control mechanism for controlling inspection sensitivity of said inspection apparatus.

43. A projection exposure apparatus comprising:
   an illumination optical system for illuminating a mask on which a predetermined pattern is formed with exposure light having a predetermined wavelength;
   a projection optical system for transferring an image of the pattern on said mask to a photosensitive substrate;
   an inspection apparatus for specifying at least one of an aberration condition of said projection optical system and respective optical adjustment conditions of said projection optical system and said illumination optical system, said inspection apparatus comprising:
      a detector for detecting, on a predetermined detection surface thereof, an image of a phase pattern formed through at least projection optical system,
      a defocus mechanism for defocusing the image to be formed on said detection surface of said detector, from a best focus condition of the image on said detection surface of said detector by a redetermined defocus amount; and
      an inspection unit for calculating a chance in image asymmetry on said detection surface within a predetermined defocus range, based on information concerning respective asymmetry characteristics of a plurality of images detected by said detector under focus conditions different from each other, said plurality of images being formed on said detection surface of said detector through at least said projection optical system,
   an aberration correction mechanism for correcting the aberration of said projection optical system, based on the aberration condition of said projection optical system detected by said inspection apparatus; and an optical adjustment mechanism for performing optical adjustments of said illumination optical system and said projection optical system, based on the respective optical adjustment conditions of said illumination optical system and said projection optical system specified by said inspection apparatus.

44. A projection exposure apparatus comprising:

an illumination optical system for illuminating a mask on which a predetermined pattern is formed with exposure light having a predetermined wavelength;

a projection optical system for transferring an image of the pattern on said mask to a photosensitive substrate;

an alignment apparatus for positioning said photosensitive substrate, said alignment apparatus comprising a mark illumination optical system for illuminating an alignment mark formed on said photosensitive substrate and a mark detection optical system for detecting light from said alignment mark;

an inspection apparatus for specifying at least one of an aberration condition of said mark detection optical system and respective optical adjustment conditions of said mark illumination optical system and mark detection optical system, said inspection apparatus comprising:

a detector for detecting, on a predetermined detection surface thereof, an image of a phase pattern formed through at least said mark detection optical system;

a defocus mechanism for defocusing the image to be formed on said detection surface of said detector, from a best focus condition of the image on said detection surface of said detector by a predetermined defocus amount; and an inspection unit for calculating a change in image asymmetry on said detection surface within a predetermined defocus range, based on information concerning respective asymmetry characteristics of a plurality of images detected by said detector under focus conditions different from each other, said plurality of images being formed on said detection surface of said detector through at least said mark detection optical system;

an aberration correction mechanism for correcting the aberration of said mark detection optical system, based on the aberration condition of said mark detection optical system detected by said inspection apparatus; and an optical adjustment mechanism for performing optical adjustments of said mark illumination optical system arid said mark detection optical system, based on the respective optical adjustment conditions of said mark illumination optical system and said mark detection optical system specified by said inspection apparatus.

45. An overlay accuracy measurement apparatus for measuring an overlay accuracy of a mark formed on a photosensitive substrate to be exposed with exposure light having a predetermined wavelength, said measurement apparatus comprising:

a mark illumination optical system for illuminating the mark on said substrate;

a mark detection optical system for detecting light from the mark on said substrate;

an inspection apparatus for specifying at least one of an aberration condition of said mark detection optical system and respective optical adjustment conditions of said mark illumination optical system and said mark detection optical system, said inspection apparatus comprising:

a detector for detecting, on a predetermined detection surface thereof, an image of a phase pattern formed through at least said mark detection optical system;

a defocus mechanism for defocusing the image to be formed on said detection surface of said detector, from a best focus condition of the image on said detection surface of said detector by a predetermined defocus amount; and an inspection unit for calculating a chance in image asymmetry on said detection surface within a predetermined defocus range, based on information concerning respective asymmetry characteristics of a plurality of images detected by said detector under focus conditions different from each other, said plurality of images being formed on said detection surface of said detector through at least said mark detection optical system;

an aberration correction mechanism for correcting the aberration of said mark detection optical system, based on the aberration condition of said mark detection optical system detected by said inspection apparatus; and an optical adjustment mechanism for performing optical adjustments of said mark illumination optical system and said mark detection optical system, based on the respective optical adjustment conditions of said mark illumination optical system and said mark detection optical system specified by said inspection apparatus.

46. A projection exposure apparatus comprising:

an illumination optical system for illuminating a mask on which a predetermined pattern is formed with exposure light having a predetermined wavelength;

a projection optical system provided between said mask and a photosensitive substrate, for transferring an image of the pattern on said mask onto said substrate; and an overlay accuracy measurement apparatus for measuring an overlay accuracy of a mark formed on said substrate to be exposed with exposure light having a predetermined wavelength, said measurement apparatus comprising:

a mark illumination optical system for illuminating the mark on said substrate;

a mark detection optical system for detecting light from the mark on said substrate;

an inspection apparatus for specifying at least one of an aberration condition of said mark detection optical system and respective optical adjustment conditions of said mark illumination optical system and said mark detection system, said inspection apparatus comprising:

a detector for detecting, on a predetermined detection surface thereof, an image of a phase pattern formed through at least said mark detection optical system;

a defocus mechanism for defocusing the image to be formed on said detection surface of said detector, from a best focus condition of the image on said detection surface of said detector by a predetermined defocus amount; and an inspection unit for calculating a change in image asymmetry on said detection surface within a predetermined defocus range, based on information concerning respective asymmetry characteristics of a plurality of images detected by said detector under focus conditions different from each other, said plurality of images being formed on said detection surface of said detector through at least said mark detection optical system;

an aberration correction mechanism for correcting the aberration of said mark detection optical system, based on the aberration condition of said mark detection optical system detected by said inspection apparatus; and an optical adjustment mechanism for performing optical adjustments of said mark illumination optical system and said mark detection optical system, based on the respective optical adjustment conditions of said mark illumination optical system and said mark detection optical system specified by said inspection apparatus.

47. An inspection method for specifying at least one of an aberration condition and an optical adjustment condition of an optical system to be inspected, said method comprising the steps of:

defocusing an image of a phase pattern on a predetermined surface, which is to be formed on a predetermined detection surface through said optical system to be inspected, from a best focus condition of the image on said detection surface by a predetermined defocus amount;

detecting the image formed on said detection surface under a predetermined focus condition; and calculating a change in image asymmetry on said detection surface within a predetermined defocus range, based on information concerning respective positions of a plurality of images detected on said detection surface under focus conditions different from each other, said plurality of images being formed on said detection surface through said optical system to be inspected.

48. An inspection method according to claim 47, wherein said method comprises the steps of:

detecting, for each of measurement points arranged in a predetermined measurement direction on said detection surface, a signal $\Sigma V$ which is an integrated signal of individual signals V corresponding to a light intensity of the image of said phase pattern which are measured at respective measurement points arranged in a direction which is different from said measurement direction; and calculating, based on a relationship between said measurement direction and said integrated signal, asymmetry index $\beta$ of the image formed on said detection surface according to the following expression:

$$\beta = (1/n) \sum_{i=1}^{n} \{(V_{iL} - V_{iR})/(V_{max} - V_{min})\}$$

wherein:

n: number of periodicity of said integrated signal with respect to said measurement direction;

$V_{iL}$: first obtained minimum signal value with respect to said measurement direction, which is a minimum signal at i-th period of said integrated signal;

$V_{iR}$: last obtained minimum signal value with respect to said measurement direction, which is a minimum signal at i-th period of said integrated signal;

$V_{max}$: maximum value of said integrated signal, with respect to said measurement direction, in the whole measurement area; and $V_{min}$: minimum value of said integrated signal, with respect to the measurement direction, in the whole measurement area.

49. An inspection method according to claim 47, wherein said inspection method comprises the steps of calculating a measurement line which indicates a relationship between the amount of defocus and the asymmetry index of the image corresponding thereto, based on information concerning the respective asymmetry characteristics of the images on said detection surface under at least three kinds of focus conditions different from each other.

50. An inspection method according to claim 49, wherein said method comprises the steps of:

specifying a peak point in a protruded portion of said measurement line within the defocus range; and calculating an amount of asymmetric aberration of said optical system to be inspected, based on gradient of a tangential line passing through the peak point on said measurement line.

51. An inspection method according to claim 49, wherein said method comprises the steps of:

specifying a peak point in a protruded portion of said measurement line within the defocus range; and calculating an amount of symmetric aberration of said optical system to be inspected, based on a difference between an asymmetry index at the peak point on said measurement line and an asymmetry index under the best focus condition.

52. An inspection method according to claim 49, wherein said method comprises the steps of:

calculating an amount of asymmetric aberration of said optical system to be inspected, based on gradient of said measurement line.

53. An inspection method according to claim 49, wherein said method comprises the steps of:

calculating an amount of symmetric aberration of said optical system to be inspected, based on an asymmetry index of said measurement line under the best focus condition.

54. An inspection method according to claim 49, wherein said method comprises the steps of:

specifying a peak point in a protruded portion of said measurement line within the defocus range; and calculating a magnitude of the optical adjustment condition of said optical system to be inspected, based on an angle of a tangential line passing through the peak point on said measurement line with respect to said measurement line.

55. An inspection method according to claim 47, wherein said method comprises the step of moving at least one of said phase pattern, said optical system to be inspected, at least one of optical elements of said optical system to be inspected, and said detection surface along an optical axis of said optical system to be inspected, whereby defocusing the image to be inspected on said detection surface from the best focus condition by the predetermined defocus amount.

56. An inspection method according to claim 47, wherein said method comprises the steps of:

calculating, for each of a plurality of phase patterns having forms different from each other, a change in image asymmetry on said detection surface on the predetermined defocus range; and specifying the aberration condition and optical adjustment condition of said optical system to be inspected, based on a difference in change in image asymmetry on said detection surface between said phase patterns.

* * * * *